(12) United States Patent
Yoshizumi et al.

(10) Patent No.: US 12,277,874 B2
(45) Date of Patent: Apr. 15, 2025

(54) DISPLAY DEVICE AND DRIVING SUPPORT SYSTEM

(71) Applicant: Semiconductor Energy Laboratory Co., Ltd., Atsugi (JP)

(72) Inventors: Kensuke Yoshizumi, Isehara (JP); Ryota Tajima, Isehara (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 18/502,413

(22) Filed: Nov. 6, 2023

(65) Prior Publication Data

US 2024/0185746 A1 Jun. 6, 2024

Related U.S. Application Data

(63) Continuation of application No. 17/517,938, filed on Nov. 3, 2021, now Pat. No. 11,837,112, which is a
(Continued)

(30) Foreign Application Priority Data

Aug. 7, 2014 (JP) ................................. 2014-161241

(51) Int. Cl.
*H04N 7/18* (2006.01)
*B60J 3/02* (2006.01)
(Continued)

(52) U.S. Cl.
CPC .......... *G09F 21/049* (2020.05); *B60J 3/0204* (2013.01); *B60R 11/0235* (2013.01);
(Continued)

(58) Field of Classification Search
CPC ............. B60R 11/0223; B60R 11/0235; B60R 11/0243; B60R 2011/0035;
(Continued)

(56) References Cited

U.S. PATENT DOCUMENTS

| 6,227,601 B1 | 5/2001 | LaFrance |
| 6,536,829 B2 | 3/2003 | Schlecht et al. |

(Continued)

FOREIGN PATENT DOCUMENTS

| EP | 2330479 A | 6/2011 |
| JP | 05-005526 | 1/1993 |

(Continued)

OTHER PUBLICATIONS

International Search Report (Application No. PCT/IB2015/055800) Dated Nov. 10, 2015.

(Continued)

*Primary Examiner* — Gregory A Blankenship
(74) *Attorney, Agent, or Firm* — Eric J. Robinson; Robinson Intellectual Property Law Office, P.C.

(57) ABSTRACT

A display device or a driving support system which enables a driver to obtain information easily is provided. A display device or a driving support system which is unlikely to impose a burden on a driver is provided. A display device or a driving support system which is suitable for space saving is provided. A display device or a driving support system which is capable of large-area display is provided. A display device or a driving support system which does not impair the aesthetic appearance of the car interior is provided. The display device includes a display panel which has flexibility and can be transformed between a first form and a second form, and a driving means having a function of reversibly changing the display panel between the first form and the second form. The first form is a form in which a display surface of the display panel is suspended, and the second form is a form in which the display panel is stored upward.

13 Claims, 28 Drawing Sheets

Related U.S. Application Data continuation of application No. 16/592,119, filed on Oct. 3, 2019, now Pat. No. 11,205,356, which is a continuation of application No. 15/500,437, filed as application No. PCT/IB2015/055800 on Jul. 31, 2015, now Pat. No. 10,434,847.

(51) Int. Cl.

| | | |
|---|---|---|
| *B60R 11/00* | (2006.01) | |
| *B60R 11/02* | (2006.01) | |
| *G09F 21/04* | (2006.01) | |
| *G09G 3/00* | (2006.01) | |
| *G09G 3/20* | (2006.01) | |
| *H10K 102/00* | (2023.01) | |

(52) U.S. Cl.
CPC .............. *G09G 3/001* (2013.01); *G09G 3/20* (2013.01); *H04N 7/183* (2013.01); *B60R 2011/0028* (2013.01); *B60R 2011/0035* (2013.01); *B60R 2011/0082* (2013.01); *B60Y 2400/92* (2013.01); *G09G 2354/00* (2013.01); *G09G 2380/02* (2013.01); *G09G 2380/10* (2013.01); *H10K 2102/311* (2023.02)

(58) Field of Classification Search
CPC .... B60R 2011/0085; B60R 2011/0028; B60Y 2400/92; B60J 3/0204; G09F 21/04; G09F 3/20; G09F 2380/10; H04N 7/183; H10K 2102/311; G09G 3/001
See application file for complete search history.

(56) References Cited

U.S. PATENT DOCUMENTS

| | | | |
|---|---|---|---|
| 6,991,283 B2 | 1/2006 | Akahane et al. | |
| 7,156,444 B1 | 1/2007 | Da Silva | |
| 7,598,927 B2 | 10/2009 | Yamazaki et al. | |
| 7,688,221 B2 | 3/2010 | Watanabe et al. | |
| 8,009,421 B2 | 8/2011 | Misawa | |
| 8,009,422 B2 | 8/2011 | Misawa | |
| 8,063,934 B2 | 11/2011 | Donato | |
| 8,367,440 B2 | 2/2013 | Takayama et al. | |
| 8,377,762 B2 | 2/2013 | Eguchi et al. | |
| 8,415,208 B2 | 4/2013 | Takayama et al. | |
| 8,456,382 B2 | 6/2013 | Yamazaki et al. | |
| 8,576,555 B2 | 11/2013 | Misawa | |
| 8,791,878 B2 | 7/2014 | Yamazaki et al. | |
| 8,936,952 B2 | 1/2015 | Chida | |
| 9,098,241 B1* | 8/2015 | Cho | B65H 75/28 |
| 9,202,987 B2 | 12/2015 | Takayama et al. | |
| 9,331,310 B2 | 5/2016 | Chida et al. | |
| 9,406,698 B2 | 8/2016 | Yamazaki et al. | |
| 9,431,618 B2 | 8/2016 | Kawata et al. | |
| 9,625,946 B2 | 4/2017 | Lee et al. | |
| 10,086,762 B2* | 10/2018 | Uhm | G08G 1/165 |
| 10,112,539 B2* | 10/2018 | Kameshima | H04N 23/63 |
| 10,434,847 B2* | 10/2019 | Yoshizumi | G09F 21/049 |
| 10,535,836 B2 | 1/2020 | Kim et al. | |
| 10,583,738 B2 | 3/2020 | Gassman et al. | |
| 10,616,488 B2 | 4/2020 | Li | |
| 10,723,267 B2 | 7/2020 | Kothari | |
| 10,875,468 B2 | 12/2020 | Saito et al. | |
| 10,946,798 B2* | 3/2021 | Fürsich | H04N 13/239 |
| 11,205,356 B2* | 12/2021 | Yoshizumi | G09F 21/049 |
| 11,224,136 B2* | 1/2022 | Song | B60K 35/22 |
| 11,837,112 B2* | 12/2023 | Yoshizumi | H04N 7/183 |
| 11,981,266 B2* | 5/2024 | Lathwesen | B60R 11/0235 |
| 2002/0196205 A1 | 12/2002 | Yamakado et al. | |
| 2004/0046899 A1 | 3/2004 | Bonnett | |
| 2004/0155489 A1 | 8/2004 | Kawasaki | |
| 2004/0189947 A1 | 9/2004 | Hattori et al. | |
| 2005/0040667 A1 | 2/2005 | Schneider et al. | |
| 2006/0050018 A1* | 3/2006 | Hutzel | B60R 1/12 345/60 |
| 2008/0049003 A1 | 2/2008 | Hasegawa | |
| 2008/0211652 A1 | 9/2008 | Cope et al. | |
| 2009/0067123 A1 | 3/2009 | Huitema et al. | |
| 2010/0033435 A1 | 2/2010 | Huitema | |
| 2011/0042996 A1 | 2/2011 | Demma | |
| 2011/0084898 A1 | 4/2011 | Ebbeling et al. | |
| 2012/0002357 A1 | 1/2012 | Auld et al. | |
| 2012/0050075 A1 | 3/2012 | Salmon | |
| 2012/0092497 A1 | 4/2012 | Hoetzer et al. | |
| 2012/0268665 A1 | 10/2012 | Yetukuri et al. | |
| 2016/0193924 A1 | 7/2016 | Kim et al. | |
| 2016/0216513 A1 | 7/2016 | Uchiyama et al. | |
| 2016/0321024 A1 | 11/2016 | Jin et al. | |
| 2017/0060183 A1 | 3/2017 | Zhang et al. | |
| 2017/0217290 A1 | 8/2017 | Yoshizumi et al. | |
| 2017/0349098 A1 | 12/2017 | Uhm | |
| 2019/0092170 A1 | 3/2019 | Gassman et al. | |
| 2019/0275955 A1 | 9/2019 | Haumayr et al. | |
| 2020/0070736 A1 | 3/2020 | Kim | |
| 2020/0331392 A1 | 10/2020 | Talavera | |
| 2021/0127512 A1 | 4/2021 | Lee et al. | |
| 2021/0323484 A1 | 10/2021 | Jeong et al. | |
| 2021/0345504 A1 | 11/2021 | Suga et al. | |
| 2022/0004002 A1 | 1/2022 | Takahashi et al. | |
| 2022/0075191 A1 | 3/2022 | Rittger et al. | |
| 2022/0144184 A1 | 5/2022 | Ouyang et al. | |
| 2022/0149081 A1 | 5/2022 | Li | |
| 2024/0109497 A1* | 4/2024 | Iso | B60R 7/04 |

FOREIGN PATENT DOCUMENTS

| | | |
|---|---|---|
| JP | 11-222052 A | 8/1999 |
| JP | 2002-328625 A | 11/2002 |
| JP | 2003-174153 A | 6/2003 |
| JP | 2003-280546 A | 10/2003 |
| JP | 2004-155316 A | 6/2004 |
| JP | 2005-057536 A | 3/2005 |
| JP | 2005-297762 A | 10/2005 |
| JP | 2005-298184 A | 10/2005 |
| JP | 2005-321702 A | 11/2005 |
| JP | 2005-349977 A | 12/2005 |
| JP | 2006-044596 A | 2/2006 |
| JP | 2006-308911 A | 11/2006 |
| JP | 2007-028445 A | 2/2007 |
| JP | 2008-015759 A | 1/2008 |
| JP | 2008-052040 A | 3/2008 |
| JP | 2008-157996 A | 7/2008 |
| JP | 2008-545156 | 12/2008 |
| JP | 2009-006893 A | 1/2009 |
| JP | 2010-215027 A | 9/2010 |
| JP | 2011-085934 A | 4/2011 |
| JP | 5506795 | 5/2014 |
| JP | 2014-198531 A | 10/2014 |
| WO | WO-2004/068212 | 8/2004 |
| WO | WO-2004/068433 | 8/2004 |
| WO | WO-2007/004131 | 1/2007 |
| WO | WO-2010/140458 | 12/2010 |

OTHER PUBLICATIONS

Written Opinion (Application No. PCT/IB2015/055800) Dated Nov. 10, 2015.

* cited by examiner

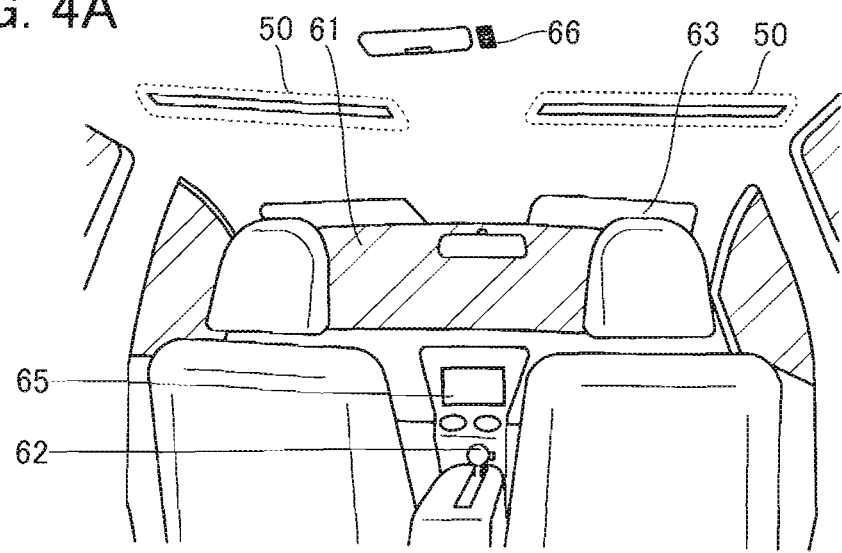
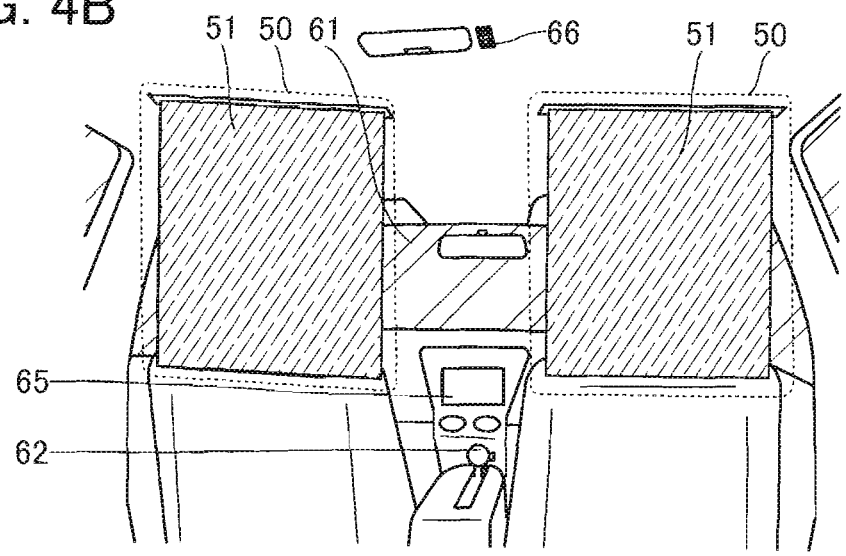
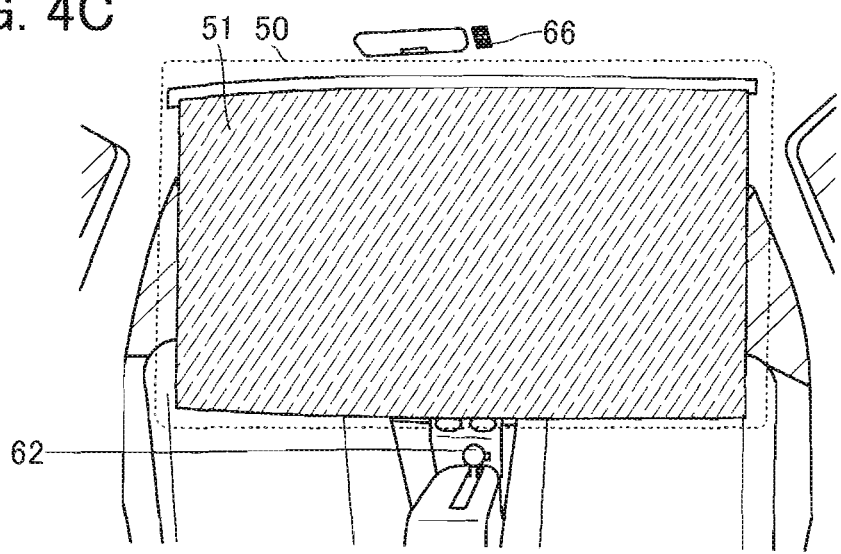

FIG. 5A1
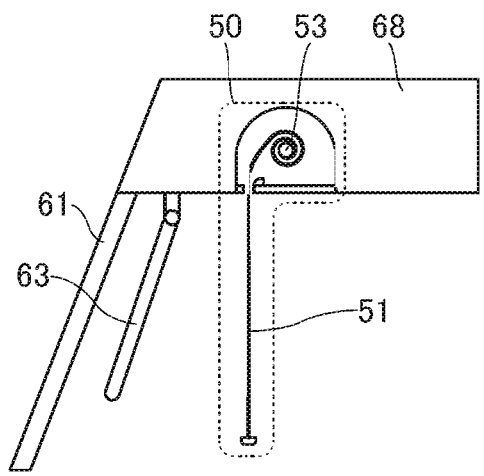
FIG. 5A2
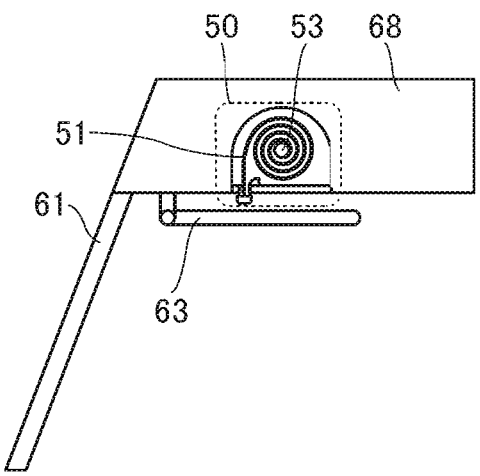
FIG. 5B1
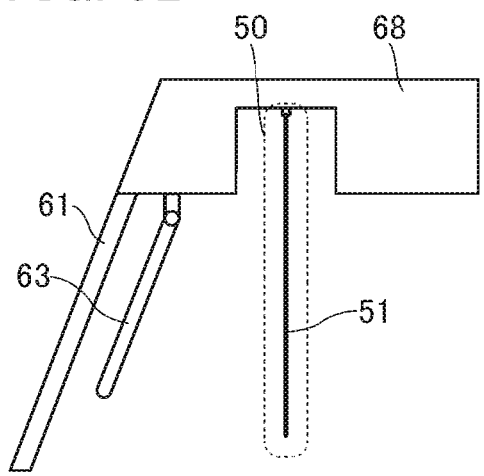
FIG. 5B2
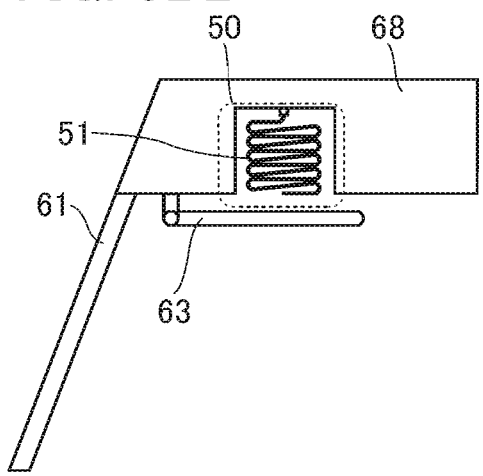
FIG. 5C
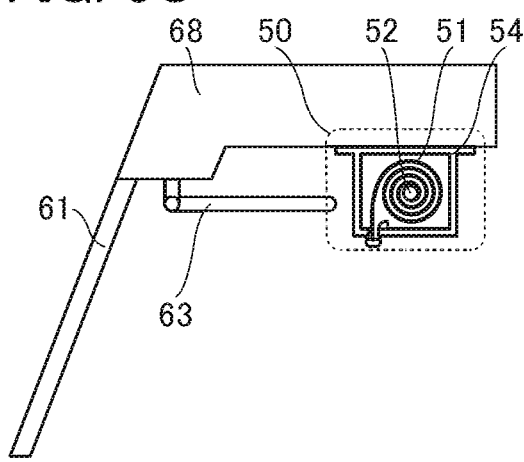
FIG. 5D
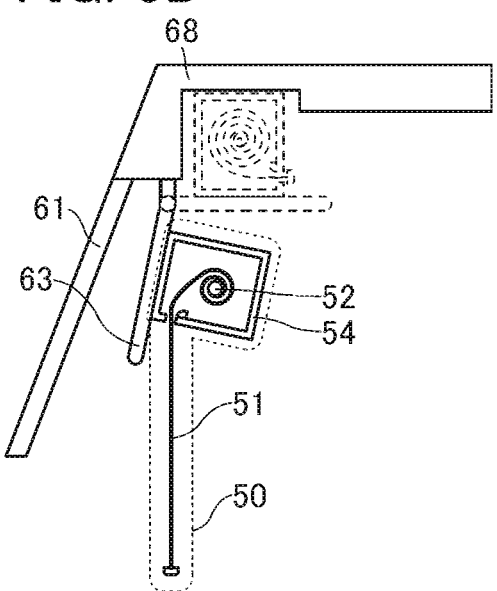

FIG. 8A
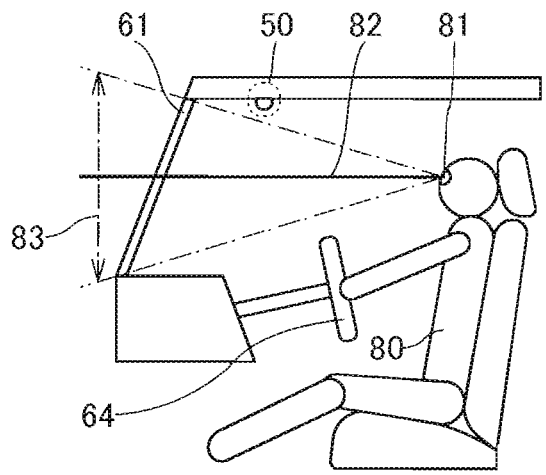
FIG. 8B1
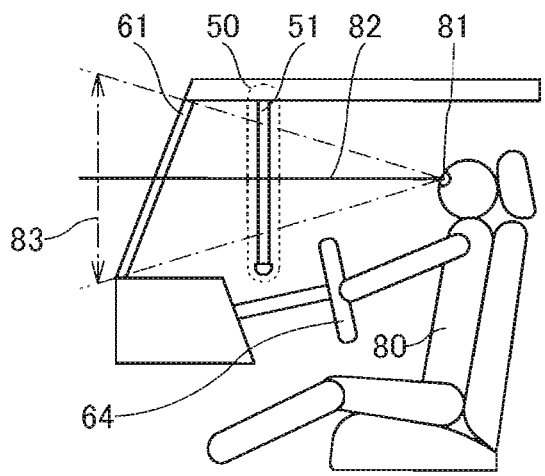
FIG. 8B2
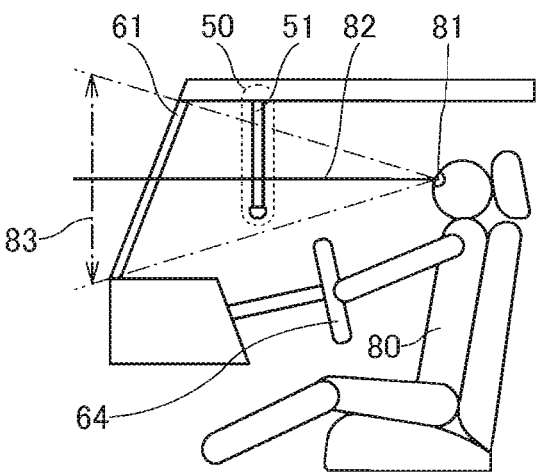
FIG. 8C
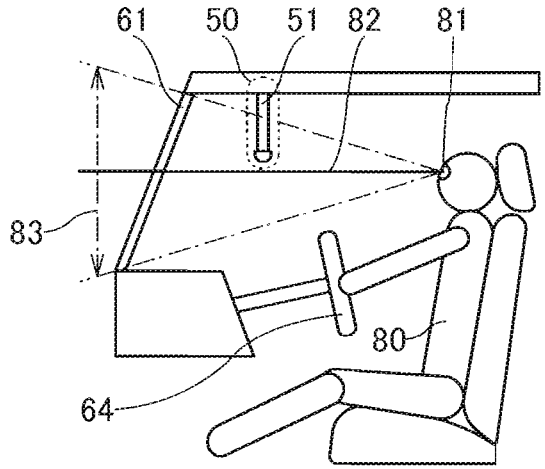

FIG. 10A
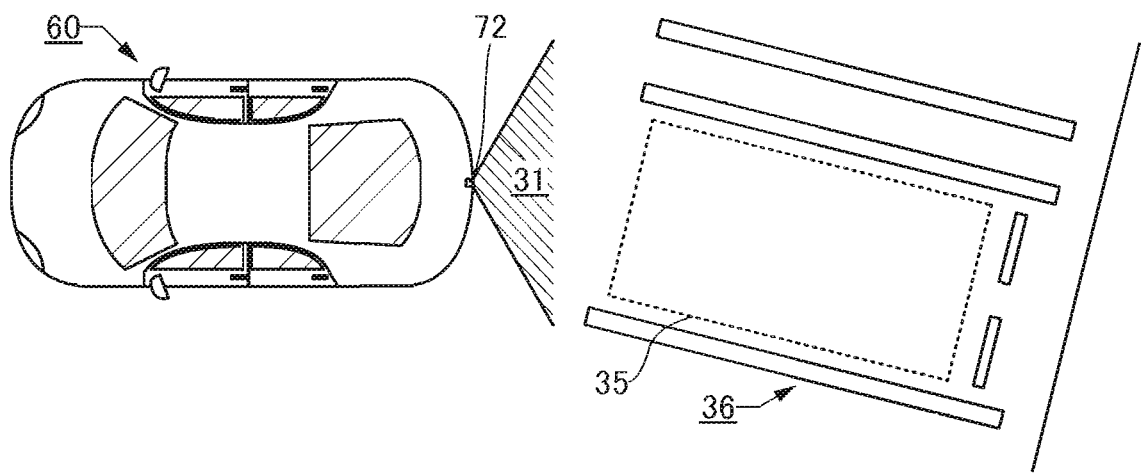
FIG. 10B1
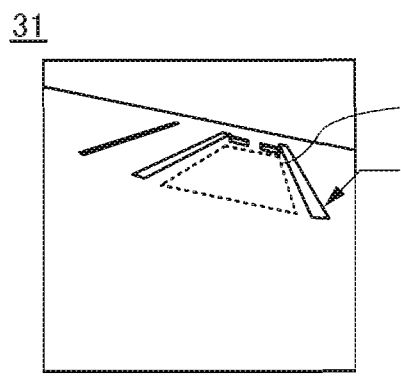
FIG. 10B2
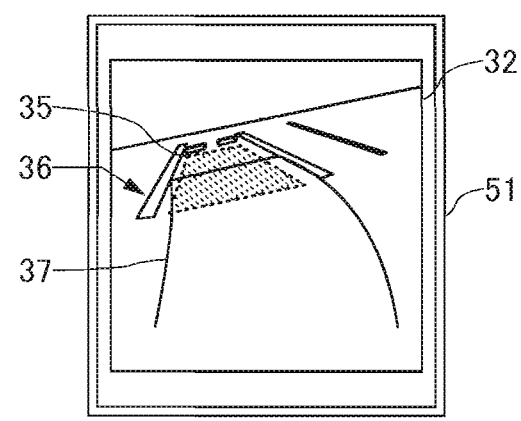

FIG. 11A
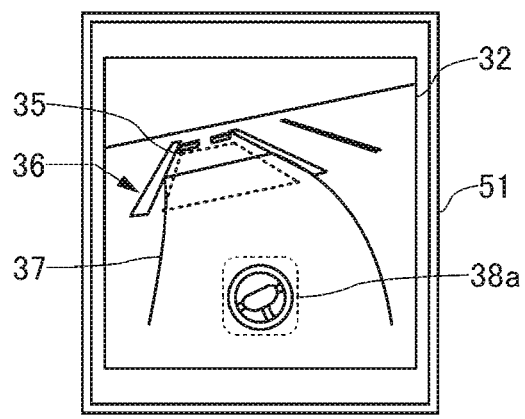
FIG. 11B1
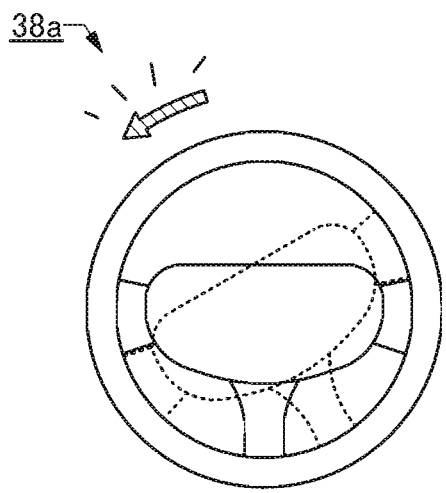
FIG. 11B2
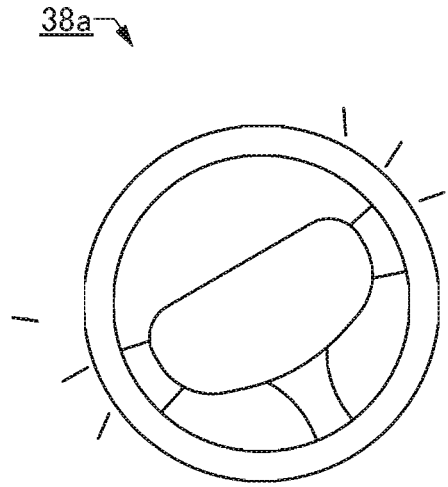

FIG. 12A
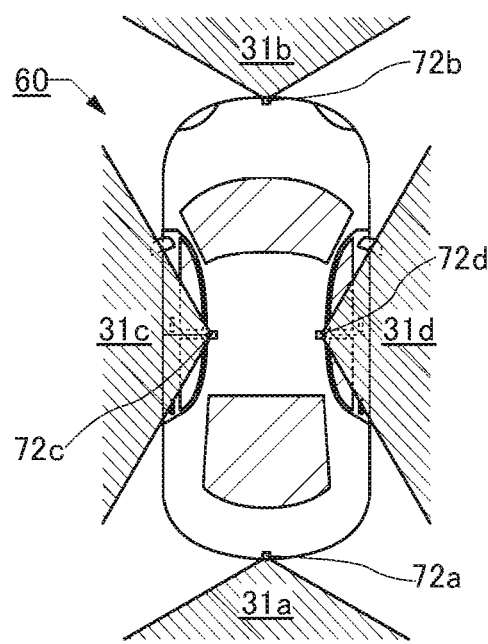
FIG. 12B1
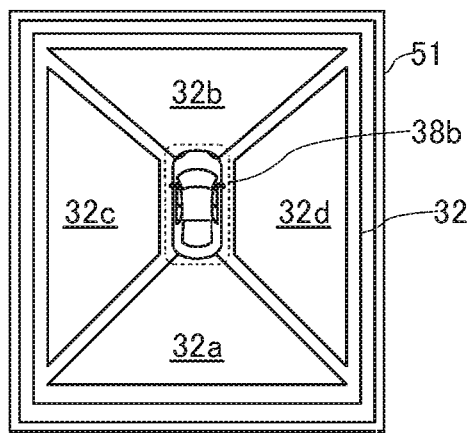
FIG. 12B2
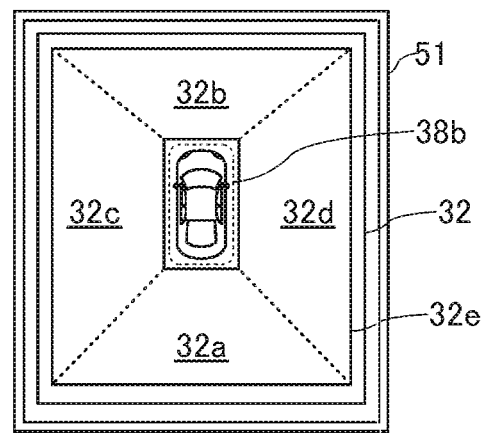

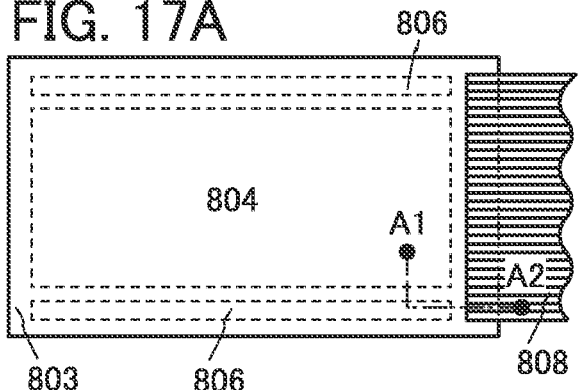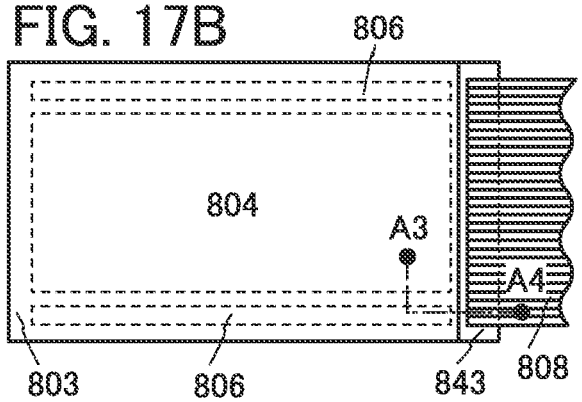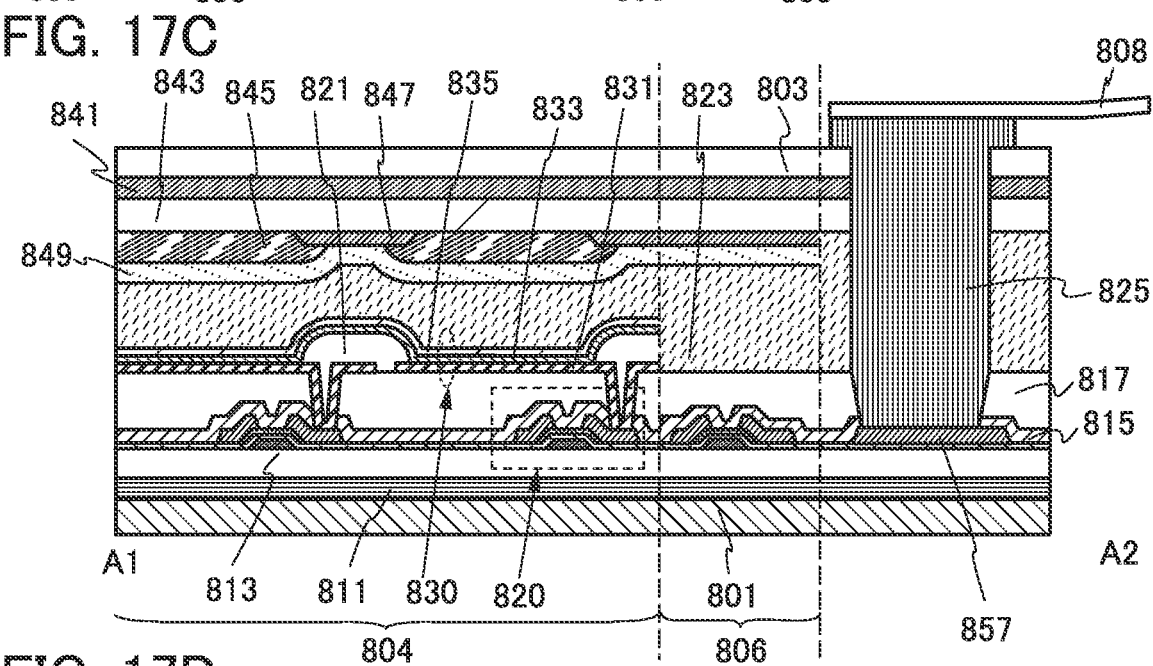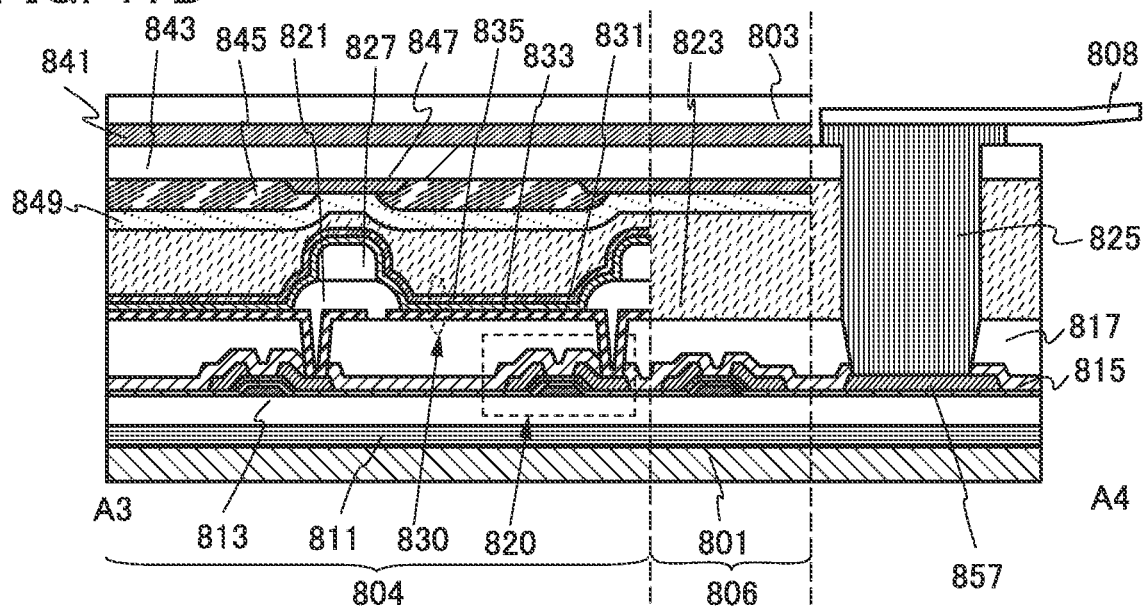

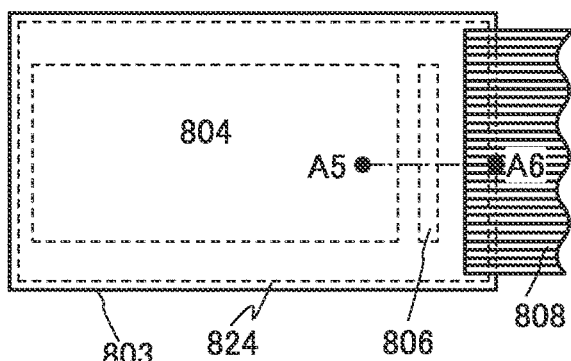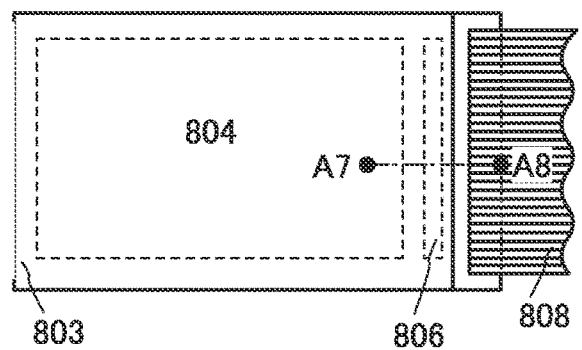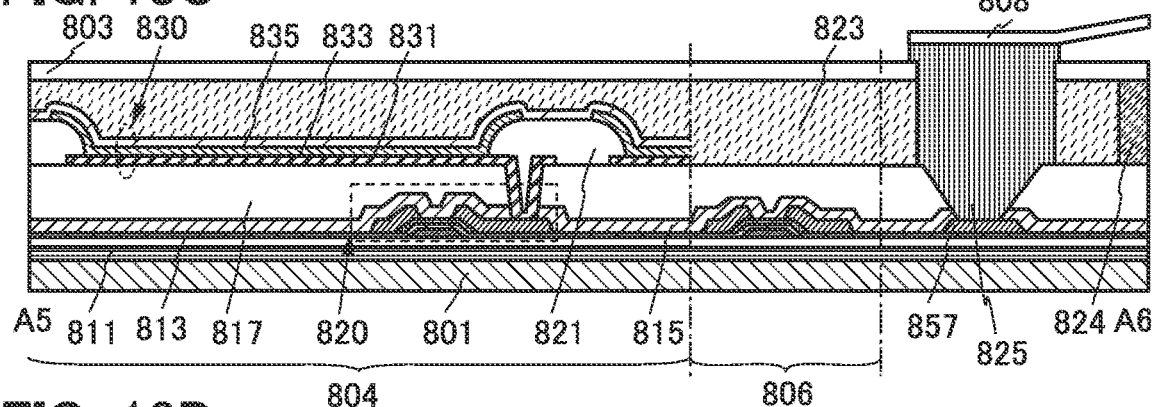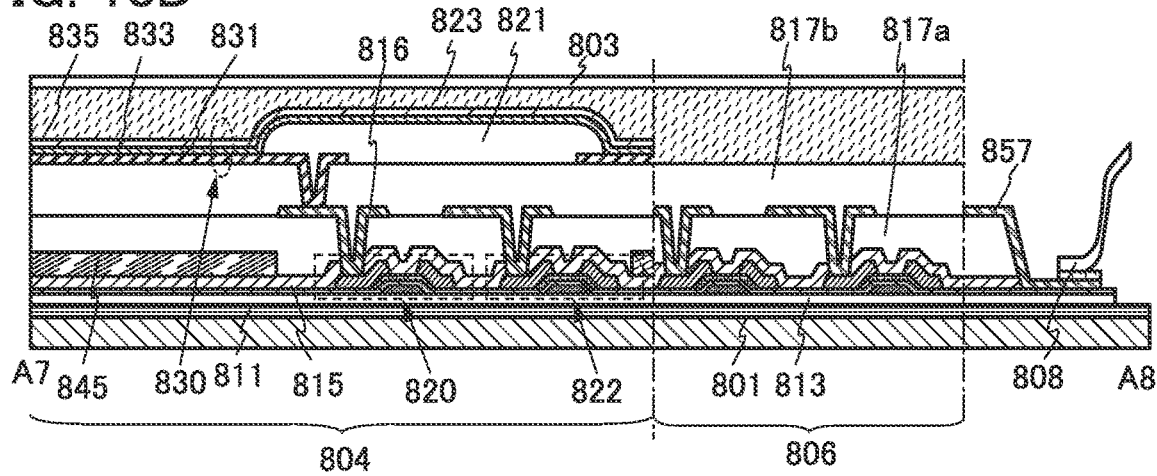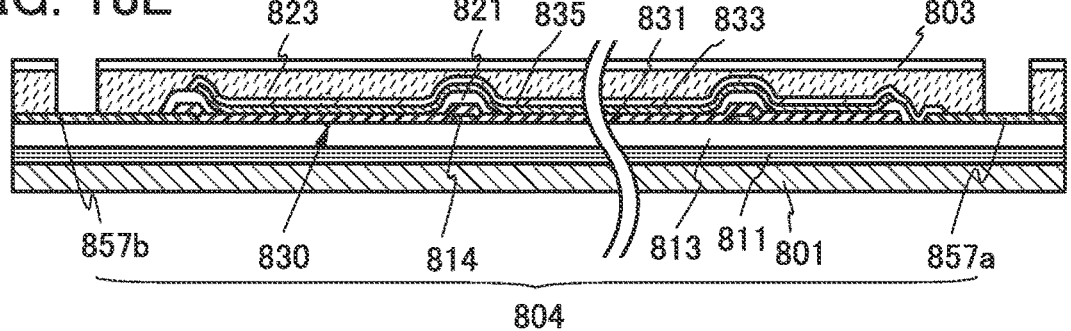

DISPLAY DEVICE AND DRIVING SUPPORT SYSTEM

TECHNICAL FIELD

One embodiment of the present invention relates to a display device, and particularly relates to a display device that can be installed in a vehicle. One embodiment of the present invention relates to a driving support system.

Note that one embodiment of the present invention is not limited to the above technical field. As the technical field of one embodiment of the present invention, a semiconductor device, a display device, a light-emitting device, a lighting device, a power storage device, a memory device, a method for driving them, or a method for manufacturing them can be given as one example.

BACKGROUND ART

Recently, large suburban commercial facilities have been expanded, and an increasing number of people buy commodities, food, and the like at those large commercial facilities, rather than at stores and the like within walking distance from residential areas. Many of such large commercial facilities are located in areas remote from residential areas and metropolitan areas and are provided with large parking spaces. Therefore, in many cases, it is convenient to use private cars as a means of transportation. This is a reason behind a recent upward trend in the number of private cars owned.

However, there is a problem such as an increase in the rate of occurrence of traffic accidents with an increase in the amount of traffic. A group of people who do not drive daily to commute to work, school, and the like but drive infrequently only on weekends and the like have a high probability of causing traffic accidents. Furthermore, how to reduce the rate of occurrence of traffic accidents is an issue to be addressed in anticipation of the coming super-aging society in the near future. Therefore, driving support systems for providing information about the surroundings to a driver or warning a driver by detecting danger, for example, are under development.

A navigation system is known as one type of driving support system. The navigation system is provided with a display device such as a liquid crystal display device and supports driver's driving by displaying a map, positional information, a route to the destination, traffic information, or the like in a display portion of the display device.

As typical display devices, a liquid crystal display device, a light-emitting device including a light-emitting element such as an organic EL (Electro Luminescence) element or a light-emitting diode (LED: Light Emitting Diode), an electronic paper performing display by an electrophoretic method or the like, and the like can be given.

For example, in a basic structure of an organic EL element, a layer containing a light-emitting organic compound is provided between a pair of electrodes. By applying voltage to this element, light emission from the light-emitting organic compound can be obtained. A display device including such an organic EL element needs no backlight which is necessary for liquid crystal display devices and the like; therefore, thin, lightweight, high contrast, and low power consumption display devices can be realized.

Patent Document 1 discloses a flexible active matrix light-emitting device in which a transistor serving as a switching element and an organic EL element are provided over a film substrate.

PRIOR ART DOCUMENT

Patent Document

[Patent Document 1] Japanese Published Patent Application No. 2003-174153

DISCLOSURE OF INVENTION

Problem to be Solved by Invention

An object of one embodiment of the present invention is to provide a display device or a driving support system which enables a driver to obtain information easily. Another object is to provide a display device or a driving support system which is unlikely to impose a burden on a driver. Another object is to provide a display device or a driving support system which is suitable for space saving. Another object is to provide a display device or a driving support system which is capable of large-area display. Another object is to provide a display device or a driving support system which does not impair the aesthetic appearance of the car interior. Another object is to provide a novel display device or driving support system.

Note that the description of these objects does not preclude the existence of other objects. One embodiment of the present invention does not necessarily achieve all the objects. Objects other than the above objects can be derived from the description of the specification and the like.

Means to Solve Problem

One embodiment of the present invention is a display device including a display panel and a driving means, which can be installed inside a moving object. The display panel has flexibility and can be transformed into a first form and a second form. The first form is a form in which the display panel is suspended. The second form is a form in which the display panel is stored upward. The driving means has a function of reversibly changing the display panel between the first form and the second form.

Another embodiment of the present invention is a display device including a display panel and a driving means, which can be installed in an upper portion of a car body in front of a driver's seat. The display panel has flexibility and can be transformed into a first form and a second form. The first form is a form in which the display panel is suspended and a display surface thereof is located in the visible range of a driver. The second form is a form in which the display panel is stored upward. The driving means has a function of reversibly transforming the display panel between the first form and the second form.

Another embodiment of the present invention is a driving support system including a control portion, a detection means, a first imaging means, and a display device, which can be incorporated into a car body. The detection means has a function of detecting the condition of a transmission in the car body and has a function of outputting detection information to the control portion. The first imaging means has a function of taking a picture of an area behind the car body. The display device includes a display panel and a driving means and can be installed in an upper portion of the car body in front of a driver's seat. The display panel has flexibility and can be transformed into a first form and a second form. The first form is a form in which the display panel is suspended and a display surface thereof is located in the visible range of a driver. The second form is a form in which the display panel is stored upward. The driving means has a function of reversibly transforming the display panel between the first form and the second form. The control portion has a function of switching to a first state or a second state in accordance with the detection information. The first state is a state in which the display panel is in the first form and a first picture taken by the first imaging means is displayed on the display surface of the display panel. In the second state, the display on the display surface of the display panel is stopped and the display panel is in the second form.

In the above, the display panel is preferably stored so as to be folded in the second form. Alternatively, the display panel is preferably stored so as to be wound in the second form.

The above-described control portion preferably has a function of switching to the first state when the detection information is reverse. At this time, the first form is preferably a form in which the lower edge of the display panel is located at a level equal to or lower than the level of the eye point of a driver.

The above-described control portion preferably has a function of detecting positional information about an object from the first picture, a function of determining a direction in which the car body should be moved from the positional information, and a function of displaying an image indicating a direction in which a steering wheel should be operated together with the first picture on the display surface in the first state.

The above-described control portion preferably has a function of switching to a third state when the detection information is forward. At this time, the third state is a state in which the display panel is in a third form and the first picture is displayed on the display surface. Here, the third form is preferably a form in which the lower edge of the display panel is located at a level higher than the level of the eye point of a driver.

In the above, a second imaging means having a function of taking a picture of an area in front of or at the side of the car body is preferably included. At this time, the control portion preferably has a function of displaying a second picture taken by the second imaging means on the display surface of the display panel in the first state. Alternatively, it preferably has a function of displaying the second picture taken by the second imaging means on the display surface of the display panel in the first state and the third state.

The above-described control portion preferably has a function of displaying a horizontally flipped picture of the first picture on the display surface of the display panel in the first state or in the first state and the third state.

One embodiment of the present invention is a vehicle which includes the above-described display device or driving support system and in which the display device is attached to an upper portion of the car body interior.

In the above, it is preferable that a sun visor attached to the ceiling of the car body be included and the display device be attached to a position to be covered when the sun visor is flipped up and when the display panel is in the second form. Alternatively, the display device is preferably attached to the sun visor.

Effect of Invention

According to one embodiment of the present invention, a display device or a driving support system which enables a driver to obtain information easily can be provided. Alternatively, a display device or a driving support system which is unlikely to impose a burden on a driver can be provided. Alternatively, a display device or a driving support system which is suitable for space saving can be provided. Alternatively, a display device or a driving support system which does not ruin the scenery of the car interior. Alternatively, a novel display device or driving support system can be provided.

Note that the description of these effects does not preclude the existence of other effects. Note that one embodiment of the present invention does not necessarily have all the effects. Note that other effects can be derived from the description of the specification, the drawings, the claims, and the like.

BRIEF DESCRIPTION OF DRAWINGS

FIGS. 4A-C Structure and application examples of a display device according to an embodiment.

FIGS. 5A1-D Structure and application examples of a display device according to an embodiment.

FIGS. 8A-C Diagrams illustrating forms of a display device according to an embodiment.

FIGS. 10A-B2 Diagrams illustrating display on a display panel according to an embodiment.

FIGS. 11A-B2 Diagrams illustrating display on a display panel according to an embodiment.

FIGS. 12A-B2 Diagrams illustrating display on a display panel according to an embodiment.

FIGS. 17A-D Diagrams illustrating examples of light-emitting panels according to an embodiment.

FIGS. 18A-E Diagrams illustrating examples of light-emitting panels according to an embodiment.

MODE FOR CARRYING OUT THE INVENTION

Figure 1A:
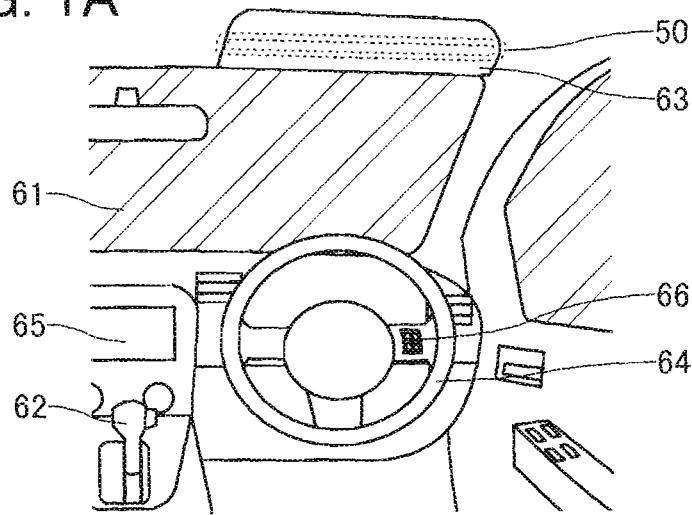
FIGS. 1A-C A structure and application example of a display device according to an embodiment.

Embodiments will be described in detail with reference to the drawings. Note that the present invention is not limited to the following description, and it will be easily understood by those skilled in the art that modes and details thereof can be variously changed without departing from the spirit and scope of the present invention. Therefore, the present invention should not be construed as being limited to the description in the following embodiments.

Note that in the structures of the invention described below; the same portions or portions having similar functions are denoted by the same reference numerals in different drawings, and repetitive description thereof is omitted. Furthermore, the same hatch pattern is applied to similar functions, and these are not especially denoted by reference numerals in some cases.

Note that in each drawing described in this specification, the size, the layer thickness, or the region of each component is exaggerated for clarity in some cases. Therefore, such a scale is not necessarily limiting.

Note that ordinal numbers such as "first" and "second" in this specification and the like are used in order to avoid confusion among components, and do not limit the components numerically.

Note that the word "film" and the word "layer" can be interchanged with each other in some cases. For example, the term "conductive layer" can be changed into the term "conductive film" in some cases. Alternatively, the term "insulating film" can be changed into the term "insulating layer" in some cases.

Embodiment 1

In this embodiment, structure examples of a display device in one embodiment of the present invention will be described with reference to drawings.

The display device in one embodiment of the present invention is a display device which can be favorably attached to the interior of a car. In particular, it can be attached to an upper portion of the interior such as the ceiling of the car or can be incorporated into the interior. The display device includes a display panel having flexibility and a driving means for changing the form of the display panel. By the driving means, the display panel can be reversibly transformed between a form in which a display surface of the display panel is suspended from an upper portion of the car and a form in which the display panel is stored in the upper portion. For example, the display panel can be stored in a wound form or a folded form.

Such a display device can be placed not only in front of a driver's seat but also in front of a front passenger's seat and a rear seat. This enables a passenger other than a driver to view an image, a moving image, or the like. Since the display panel of the display device can be stored, a display panel whose display region has a large area compared with a conventional stationary display device can be used. Therefore, more information can be provided, and space saving can also be achieved. In addition, the degree of freedom in installation location is high, and attachment to car bodies of a variety of sizes is possible. Furthermore, since the display panel has flexibility, a passenger has a low risk of getting injured even if hitting the display panel in an accident or the like, and therefore it can be said that safety is very high as compared with a conventional display device.

More specifically, the following structures can be employed, for example.

[Installation Examples of Display Device]

Figure 1B:
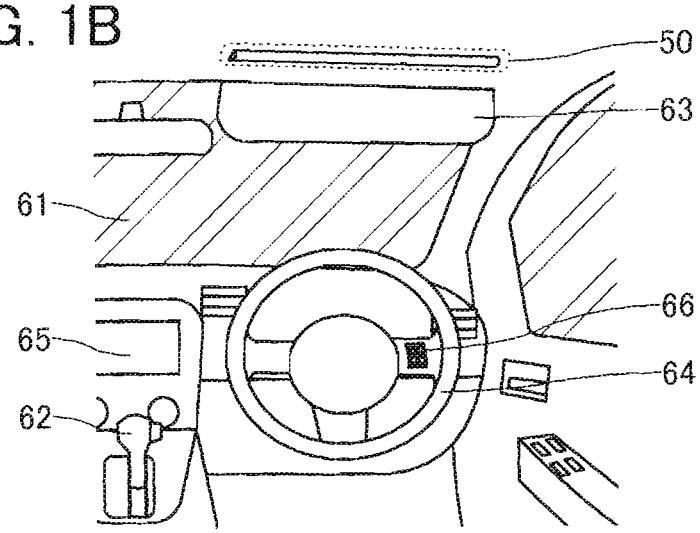
Figure 1C:
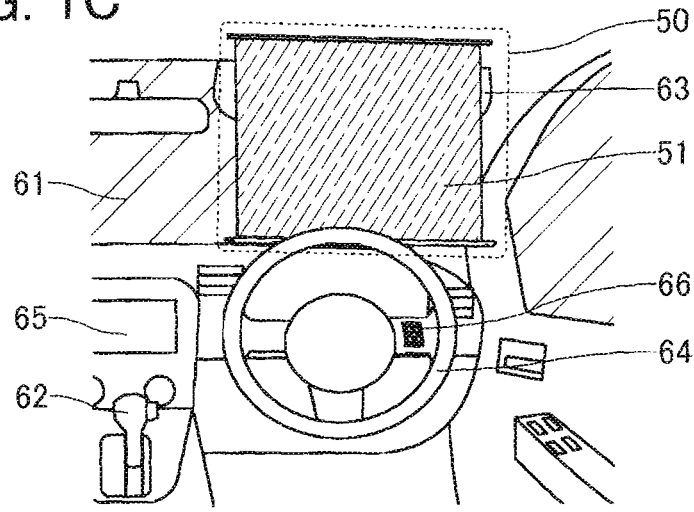

FIGS. 1(A) to (C) illustrate an example in which the display device in one embodiment of the present invention is attached to the interior of a car. Here, an example in which a display device 50 is attached to an upper portion in front of (or obliquely upward and in front of) a driver's seat is illustrated.

The car includes a windshield 61, a shift lever 62, a sun visor 63, a steering wheel 64, and the like. Here, the case where a navigation system 65 is incorporated in the car is illustrated.

FIG. 1(A) illustrates a state in which the sun visor 63 is flipped up (stored), and FIG. 1(B) illustrates a state in which the sun visor 63 is flipped down. The display device 50 can be favorably provided in a position to be covered when the sun visor 63 is flipped up. Therefore, the display device 50 can be attached to a car body without impairing the aesthetic appearance of the car interior.

FIGS. 1(A) and (B) are a state in which a display panel 51 of the display device 50 is stored. Here, a state in which the display panel 51 is stored inside the ceiling (inward from the ceiling surface) is illustrated. This state can be transformed into a form in which the display panel 51 is suspended as illustrated in FIG. 1(C). At this time, a display surface of the display panel 51 has a flat shape or a curved shape, and the display surface is located in the visible range of a driver.

Each diagram of FIG. 1 illustrates the case where an operation portion 66 for operating the shape of the display panel 51 of the display device 50 is incorporated in the steering wheel 64 included in the car body. As the operation portion 66, for example, a switch, a touch panel, or the like can be used. Through operation with the operation portion 66, the display panel 51 can be transformed by a driving means 52 of the display device 50 which is described later.

Figure 2:
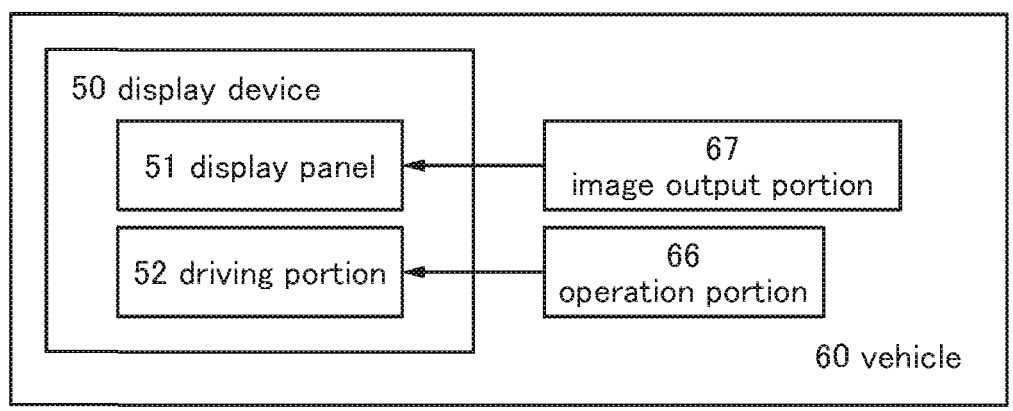
FIG. 2 A structure example of a display device and a vehicle according to an embodiment.

FIG. 2 illustrates a block diagram of a vehicle 60 in which the display device 50 is incorporated. The vehicle 60 includes, for example, the display device 50, an image output means 67, the operation portion 66, and the like.

The display device 50 includes the display panel 51 and the driving means 52. The display panel 51 has flexibility, and can be transformed into a state in which the display surface is spread (unfolded) and is flat or curved and a form in which the display panel 51 is wound and stored or a form in which it is folded and stored. The driving means 52 included in the display device 50 can reversibly transform the display panel 51 between a form in which at least a portion of the display surface of the display panel 51 is suspended and a form in which the display panel 51 is stored upward. The driving means 52 can be operated by, for example, the operation portion 66.

The image output means 67 can be connected to the display panel 51. A picture or an image which is output from the image output means 67 can be displayed on the display surface of the display panel 51. The display panel 51 can display a picture from a camera (an imaging means), which is provided outside the car body and described later, with the image output means 67, and can additionally display map information, traffic information, vehicle's positional information, information such as a route and a distance to the destination, a moving direction, and an estimated arrival time, and various kinds of information such as time, speed, orientation, temperature, humidity, atmospheric pressure, tilt angle, and altitude. As examples of the image output means 67, a television broadcast receiver (tuner), a media reproduction device which reproduces picture information recorded in a memory device such as a CD, a DVD, and a memory card, and the like can be given. When the image output means 67 as described above is connected to the display device 50, the display panel 51 can display a television broadcast, a variety of pictures, and the like. An information terminal such as a notebook PC, a tablet terminal, a cellular phone, or a smartphone, a portable game machine, or the like and the image output means 67 can be connected to each other wirelessly or by a wire. Accordingly, pictures and the like which are transmitted from these information terminals and the game machine can also be displayed by the display panel 51 through the image output means 67.

The display panel 51 of the display device 50 may have a function of a touch panel. At this time, the display panel 51 preferably displays an application itself or an image such as an icon associated with its operation. This can facilitate intuitive operation. In addition, for example, moving, enlarging, or reducing a map or the like may be performed by touch operation.

Figure 3A:
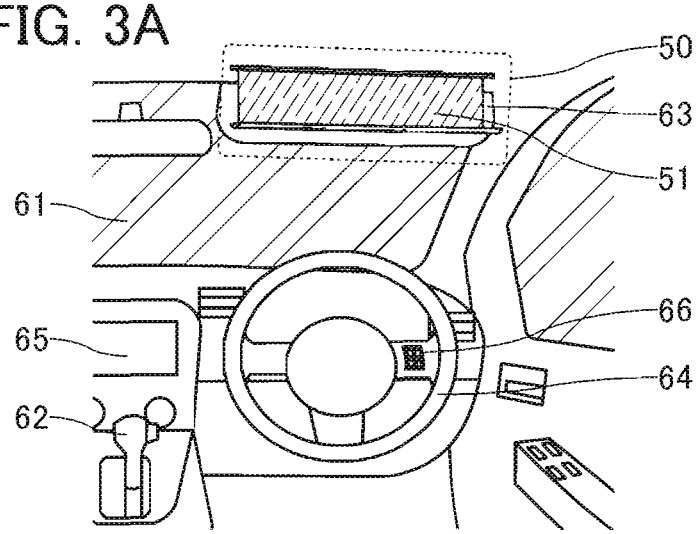
FIGS. 3A-C Structure and application examples of a display device according to an embodiment.

Note that FIG. 1(C) illustrates the case where the display panel 51 is located so as to overlap with the windshield 61 from its upper edge to the lower edge when seen from the driver's seat, but a form in which it is located so as to overlap with a portion of the windshield 61 may be employed. For example, as illustrated in FIG. 3(A), the display panel 51 may be transformed such that the lower edge of the display panel 51 is located so as to overlap with the windshield 61 when seen from the driver's seat. Since the display panel 51 in such a form does not obstruct a driver's front vision, the driver can drive in this state. For example, the display panel 51 is preferably kept in such a form that the lower edge of the display panel 51 is located in a range of 50% or less, a range of 30% or less, or a range of 20% or less from the upper edge of the windshield 61 when seen from the driver so that the driver's vision can be secured.

Figure 3B:
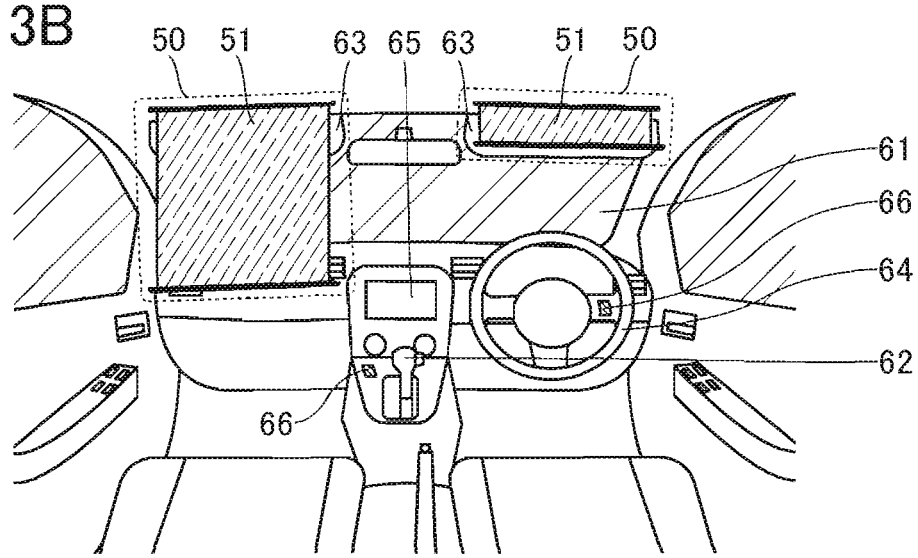

Although FIG. 1 illustrates the case where the display device 50 is incorporated in the upper portion in front of the driver's seat, the display device 50 may be incorporated in a position visible from another seat. FIG. 3(B) illustrates an example of a structure in which the display device 50 is provided in an upper portion in front of the front passenger's seat. A passenger in the front passenger's seat is free to operate the form of the display panel 51 of the display device 50 with the operation portion 66 provided at the side of the seat.

Figure 3C:
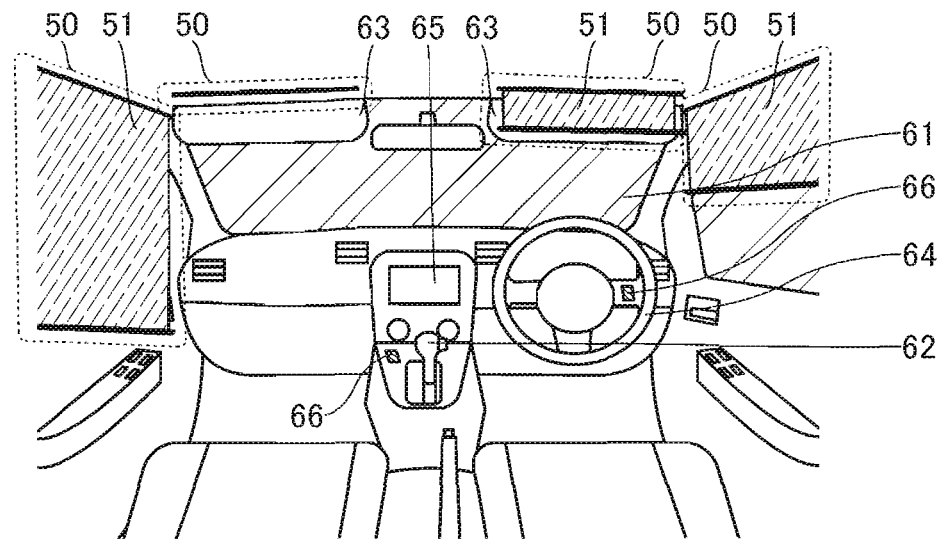

As illustrated in FIG. 3(C), the display device 50 may be provided in a position covering a window portion provided at the side of the car body. The display device 50 placed at the side of the seat in this manner can block ultraviolet rays transmitted through the window. At this time, for example, when the display panel 51 displays a picture of an area at the side of the vehicle, the blind spots of the driver can be reduced.

FIGS. 4(A) and (B) illustrate the case where two display devices 50 are incorporated in portions of the car body ceiling behind the front seats. They also illustrate the case where the operation portion 66 is included on the car body ceiling. In a form in which the display panel 51 of each of the display devices 50 is suspended, a form in which a portion of the display panel 51 overlaps with a portion of the front seat can be employed. With such a structure, passengers sitting in the left and right rear seats can enjoy pictures individually. As illustrated in FIG. 4(C), the display device 50 including one large display panel 51 may be incorporated in the car body ceiling. At this time, a form in which the display panel 51 is suspended so as to overlap with both a portion of the front passenger's seat and a portion of the driver's seat can be employed. With such a structure, a passenger in the rear seat can enjoy a picture on a larger screen.

Note that the display device 50 illustrated in FIG. 4(C) may be placed, for example, instead of the two display devices 50 illustrated in FIG. 3(B). That is, the display device 50 may be provided so that one large display panel 51 is placed in front of the driver's seat and the front passenger's seat.

Even when the display device 50 is provided between the rear seat and the front seat, since the display panel 51 has flexibility, a passenger in the rear seat has a low risk of getting seriously injured even if hitting the display panel 51 in an accident or the like, and safety is high. For example, it can be said that it is highly advantageous in terms of safety in addition to the effect of allowing a picture to be enjoyed over a larger area, as compared with the case where a conventional display device such as a liquid crystal display device is incorporated in a headrest of the driver's seat or the front passenger's seat.

Note that the position in which the display device 50 is incorporated is not limited thereto and can be a variety of positions such as the ceiling and doors inside the car. For example, the display device 50 can be installed such that the display panel 51 is in a position along a window portion other than the windshield 61 (e.g., glass provided at the back or side).

Although the form in which the display device 50 is placed in an upper portion of the car body and the display panel 51 is suspended is illustrated here, there is no limitation thereto. For example, a structure in which the display panel 51 is pulled out in a horizontal direction may be employed, or a structure in which the display panel 51 is pulled out upward from a lower portion may be employed.

Note that the position of the operation portion 66 described above is not limited thereto and can be a position in which at least the driver or a passenger can operate. For example, it can be placed in a variety of portions such as an armrest, the ceiling, the dashboard, and a door inside the car.

The navigation system 65 and the display device 50 are preferably linked. A structure in which the navigation system 65 has a function of the image output means 67 described above and a picture or an image output by the navigation system 65 is displayed by the display panel 51 may be employed. A function of the operation portion 66 may be added to the navigation system 65. This eliminates the need to incorporate the operation portion 66 in the car interior, and the display device 50 can therefore be employed without further impairing the aesthetic appearance of the car interior.

The above is the description of the installation examples of the display device.

[Structure Examples of Display Device]

Next, examples of structures of the display device 50 and examples of methods for installation in an upper portion in front of a driver's seat are described with reference to FIG. 5.

FIGS. 5(A1) and (A2) illustrate cross-sectional schematic views inside the car body of the vehicle 60.

A recessed portion is provided on a ceiling 68 of the car body, and the display device 50 is installed inside the recessed portion. The display device 50 illustrated in FIGS. 5(A1) and (A2) includes a winding mechanism 53 and the display panel 51. The winding mechanism 53 corresponds to the above-described driving means 52.

FIG. 5(A1) illustrates an example of a form in which the display panel 51 is suspended. From this state, the display panel 51 can be transformed into a form in which the display panel 51 is wound as illustrated in FIG. 5(A2) when the winding mechanism 53 winds the display panel 51.

It can also be said that the display device 50 is provided inside the ceiling 68 in FIGS. 5(A1) and (A2). Furthermore, it is preferable that the display device 50 be installed in a position where an exposed portion of the display device 50 can be covered with the sun visor 63 when the display panel 51 is wound as illustrated in FIG. 5(A2) because the aesthetic appearance of the car interior is not impaired.

FIGS. 5(B1) and (B2) illustrate a structure example of the display device 50 in which the display panel 51 can be folded and stored. The display device 50 can transform the display panel 51 from a form in which the display panel 51 is suspended as illustrated in FIG. 5(B1) into a form in which the display panel 51 is folded into a bellow shape by a pulling mechanism not illustrated and is stored in the recessed portion on the ceiling 68 as illustrated in FIG. 5(B2). As illustrated in FIG. 5(B2), the display device 50 is preferably installed in a position to be covered with the sun visor 63 when the display panel 51 is stored.

Note that the display device 50 can be optionally attached by a user to a car body not having a structure such as the recessed portion on the ceiling 68 for installing the display device 50 in advance. For example, when a structure in which the display device 50 is provided with a housing 54 attachable to the car body as illustrated in FIG. 5(C) is employed, the housing 54 can be installed in a given position of the car body. Such a form in which the display panel 51 and the like are incorporated in the housing 54 and can be attached to a given position by a user can also be referred to as a display unit.

FIG. 5(D) illustrates an example in which the housing 54 is attached to the sun visor 63. At this time, the thickness of the housing 54 is preferably small so that the housing 54 is not in contact with the ceiling 68 when the sun visor 63 is flipped up. In FIG. 5(D), an example in the case where the sun visor 63 is flipped up with the display panel 51 in a wound state is indicated by broken lines.

Note that FIGS. 5(C) and (D) illustrate a structure in which the winding mechanism 53 and the display panel 51 are provided inside the housing 54, but a structure in which the display panel 51 can be folded and stored as illustrated in FIGS. 5(B1) and (B2) may be employed.

Note that a more specific structure example of the display device 50 will be described in an embodiment below.

The above is the description of the structure examples of the display device.

Other Application Examples

The display device in one embodiment of the present invention can be favorably used not only in a general passenger car but also in a special-purpose vehicle intended for special uses.

Figure 6A:
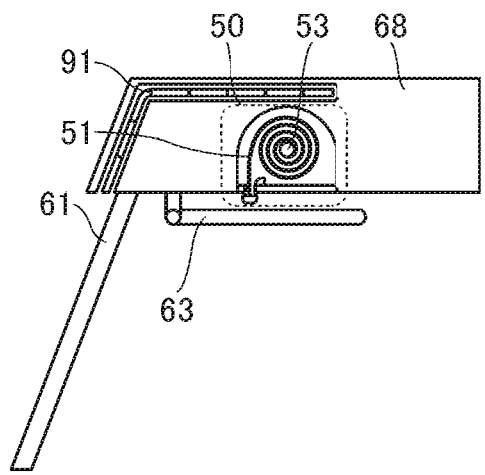
FIGS. 6A-B A structure and application example of a display device according to an embodiment.
Figure 6B:
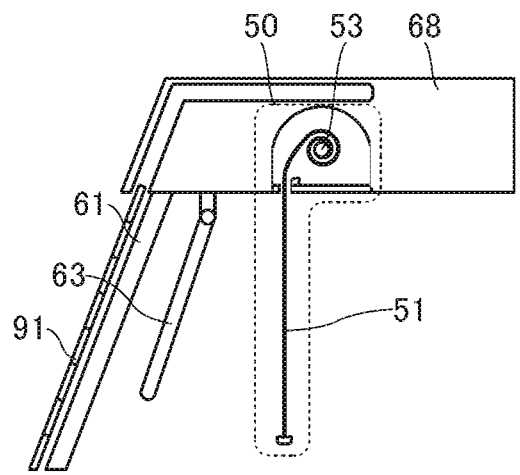

For example, FIGS. 6(A) and (B) illustrate an example of a special-purpose vehicle including a shutter 91 capable of covering the front surface of the windshield 61. The shutter 91 can reversibly change its form into a form of being stored inside the ceiling 68 of the car body as illustrated in FIG. 6(A) and a form of covering the front surface of the windshield 61 as illustrated in FIG. 6(B). The shutter is in a stored state as illustrated in FIG. 6(A) in ordinary driving, and the shutter 91 can be brought down as illustrated in FIG. 6(B) in special circumstances. When the display panel 51 located in the visible range of a driver displays a picture of the surroundings of the vehicle, the driver's vision can be secured for safe driving.

Note that only the shutter 91 for covering the windshield 61 is clearly indicated here, but it is preferable to provide the shutter 91 capable of covering another window portion (e.g., glass provided at the back or side).

In the case of a vehicle or the like for running in areas with high radiation doses, for example, a material which does not transmit radiation can be used for the shutter 91. In the case of a vehicle such as an escort car, a prisoner transport car, or an armored car, a material with high physical strength such as a metal or an alloy having a thickness of 5 mm or more can be used for the shutter 91. In many cases, such materials do not transmit visible light.

In a special-purpose vehicle employing the shutter 91 as described above, a small window portion for viewing the circumstances around the car body, for example, can be provided in the shutter 91, in which case the surrounding circumstances might not be known in detail because of narrow vision. In contrast, by employing the display device 50 in one embodiment of the present invention, a picture of the surroundings taken by an imaging means which is described later can be displayed by the display panel 51 even in a state where the shutter 91 covers the entire window portion such as the windshield 61 as illustrated in FIG. 6(B). There is no need to provide a window portion in the shutter 91, and therefore, a special-purpose vehicle with less risk of danger can be obtained.

The display device in one embodiment of the present invention can also be used for all moving objects besides cars. For example, it can be used for a variety of moving objects, e.g., buses, railroad vehicles such as an electric railcar and a locomotive, earthmoving vehicles or construction vehicles such as a crane truck and a bulldozer, piloted robots, aircraft such as an airplane and a helicopter, ships, submarines, and spacecraft.

In spacecraft, the size and number of window portions are particularly limited in many cases because of the influence of cosmic rays, weight issues, and the like. In the case where the radiation intensity of cosmic rays is high under the influence of solar flares or the like, it can be anticipated that a window portion is covered with a shutter which blocks cosmic rays to secure safety. Thus, the display device in one embodiment of the present invention, which can easily achieve both enlargement of a display region and space saving, can be favorably used. Since the display device in one embodiment of the present invention is very lightweight and compact, transportation cost (cost necessary for launch) can be significantly reduced compared with a conventional display device.

The above is the description of other application examples.

The display device in one embodiment of the present invention can be transformed into a form in which the display panel having flexibility is located in user's vision and a form in which it is stored. Therefore, in the case where the display panel is in use, the large display region can provide much information to a user, and in the case where the display panel is not in use, the display panel is stored, so that space saving can be achieved and the display device can be employed without impairing the aesthetic appearance of the interior of the car body.

At least part of this embodiment can be implemented in combination with another embodiment described in this specification as appropriate.

Embodiment 2

An example of a driving support system using the display device in one embodiment of the present invention will be described below with reference to drawings.

A driving support system in one embodiment of the present invention operates to link the condition of a transmission of a vehicle and the form of a display panel of a display device, for example. Accordingly, depending on the driving conditions, the display panel can be transformed into a shape suitable for the conditions without any special operation by a driver. Furthermore, the display panel can display information or a picture suitable for the conditions. Therefore, the driver can concentrate on driving without feeling any burden.

Depending on the condition of the transmission of the vehicle, the display panel can be transformed into a state in which the display panel is not located inside the visible range of the driver and a state in which the display panel is located in most of the visible range of the driver. Therefore, the driver can obtain information displayed by the display panel without changing the sight line. Furthermore, since the display panel occupies a large proportion of a driver's vision, the amount of information that the driver can obtain can be increased, or a large image that the driver can capture intuitively can be displayed.

Even in the case of driving the vehicle forward, in a form where the display panel is located in a position higher than the level of the eye point of the driver, the vision necessary for the driver to drive is not blocked, and at the same time, information displayed by the display panel can be obtained.

More specifically, the following structure can be employed, for example.

[Structure Example of System]

Figure 7:
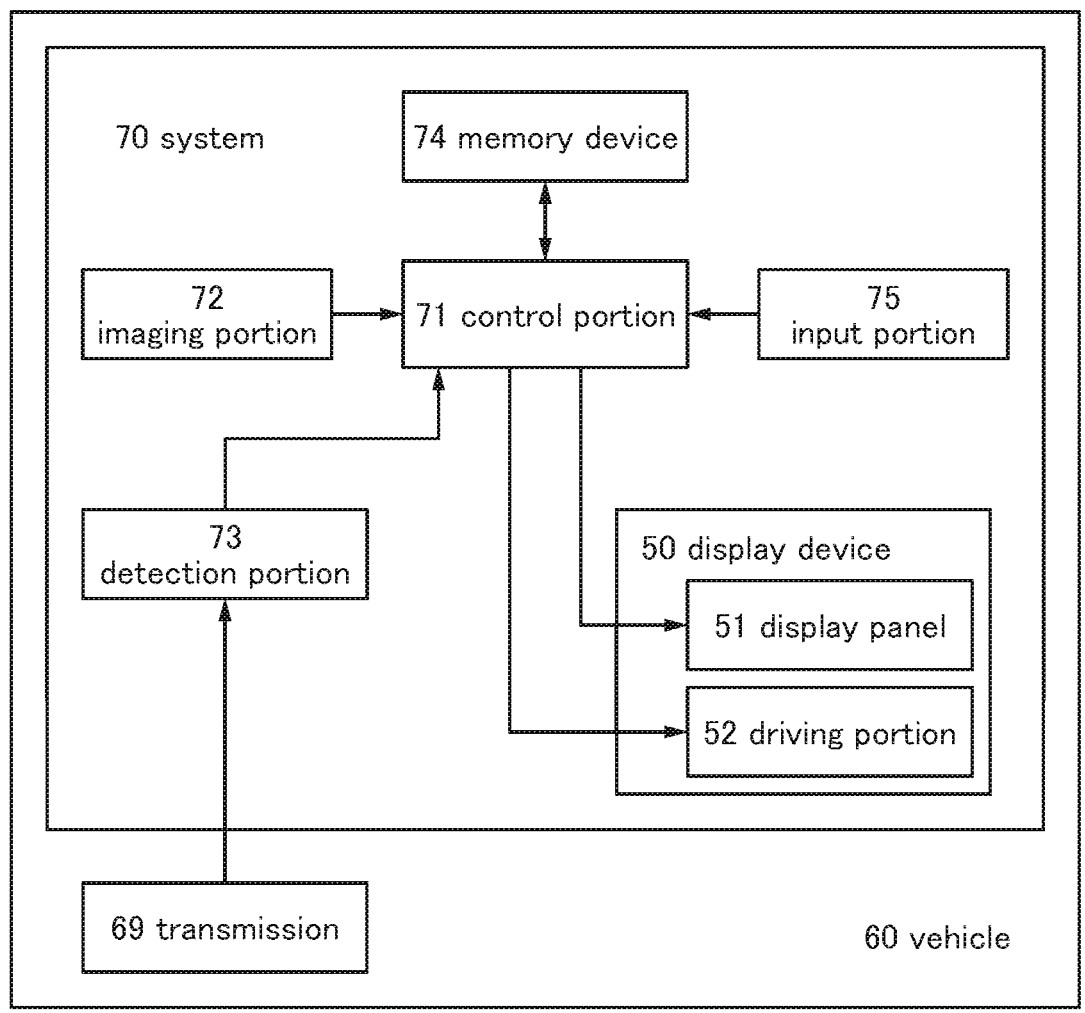
FIG. 7 A structure example of a system and a vehicle according to an embodiment.

FIG. 7 illustrates a block diagram illustrating an example of a structure of a system 70 which will be described below.

The system 70 includes the display device 50, a control portion 71, an imaging means 72, and a detection means 73. As illustrated in FIG. 7, it may also include a memory device 74, an input means 75, and the like.

The structure in Embodiment 1 can be referred to for the display device 50. That is, the display device 50 includes the display panel 51 having flexibility, which can be reversibly transformed by the driving means 52 into a form in which the display panel 51 is suspended and a form in which it is stored.

The imaging means 72 can take a picture of the surroundings of a car body. The imaging means 72 also has a function of outputting information about a picture taken to the control portion 71. The imaging means 72 can take a picture of an area behind the car body, an area in front of the car body, an area at the side of the car body, or the like, for example. The imaging means 72 is attached to at least one of the front, back, and side surfaces of the car body. It is preferable that it be attached to the back surface of the car body, and it is further preferable that one or more imaging means 72 be attached to each of the front, back, and both side surfaces of the car body. As the imaging means 72, a camera is used, for example.

The imaging means 72 preferably has a function of taking a wide-area picture. For example, the imaging range of one imaging means 72 is preferably more than or equal to 80 degrees and less than or equal to 180 degrees, preferably more than or equal to 90 degrees and less than or equal to 180 degrees, further preferably more than or equal to 120 degrees and less than or equal to 180 degrees. At this time, the imaging means 72 may be configured to have one lens with high viewing angle or may be configured to have two or more lenses.

The detection means 73 has a function of detecting the condition of a transmission 69 included in the vehicle 60. The detection means 73 also has a function of outputting detection information to the control portion 71. More specifically, the detection means 73 can detect which of the following conditions the transmission 69 is in: a forward condition (a condition in which a gear for moving forward is connected), a reverse condition (a condition in which a gear for moving backward is connected), a neutral condition (a condition in which no gear is connected), a stop condition (a condition in which no gear is connected and wheels are locked), and the like.

The memory device 74 can store a program specifying the operation of the control portion 71 and information such as setup information. Here, setup information is, for example, information about the operation of the control portion 71 which is preset by a user with the input means 75 or the like. Information can be written to and read from the memory device 74 by the control portion 71.

As the memory device 74, for example, a recording media drive such as a hard disc drive (HDD) or a solid state drive (SSD): a memory device including a nonvolatile memory element, such as a flash memory, an MRAM (Magnetoresistive Random Access Memory), a PRAM (Phase change RAM), an ReRAM (Resistance RAM), or an FeRAM (Ferroelectric RAM); a memory device including a volatile memory element, such as a DRAM (dinamic Ram) or an SRAM (Static RAM); or the like may be used.

The input means 75 is an interface through which setup information specifying the operation of the control portion 71 can be input in advance by a user. As the input means 75, a direct input means such as a switch, a touch panel, a touch pad, a mouse, a keyboard, a joystick, a trackball, or a dataglove can be used, for example. When an indirect (contactless) input means such as an eye-point input means, an audio input means, or a gesture input means is used as the input means 75, a driver can perform input without danger even while driving. In the case where the display panel 51 has a function of, for example, a touch panel, the display panel 51 can be used as the input means 75.

The control portion 71 has a function of outputting a picture to the display panel 51 of the display device 50. The control portion 71 also has a function of outputting a signal for controlling the driving of the driving means 52 of the display device 50. The control portion 71 may also have a function of, for example, analyzing, converting, and correcting picture information which is input from the imaging means 72. It may also have a function of generating a new picture based on the picture information which is input from the imaging means 72.

The control portion 71 can be configured to include, for example, a processor such as a CPU (Central Processing Unit), an input interface and an output interface connected to components such as the memory device 74 included in the system 70, and the like. The processor and the interfaces are electrically connected by a system bus. The processor processes signals input from the components which are connected through the system bus and generates signals to be output to the components, so that the components connected to the system bus can be controlled comprehensively.

A microprocessor such as a DSP (Digital Signal Processor) or a GPU (Graphics Processing Unit) can be used in addition to the CPU as the processor. The control portion 71 interprets and executes instructions from various programs with the processor to process various kinds of data and to control programs. The programs executed by the processor may be stored in a memory region of the processor or may be stored in the memory device 74.

A structure in which the control portion 71 and the memory device 74 are incorporated in the inside of, for example, a dashboard of the car body is preferable because the aesthetic appearance of the car interior is not impaired. A navigation system mounted on the car body may have functions of the control portion 71 and the memory device 74. That is, the navigation system may have some functions of the system 70. At this time, an input means (such as a switch or a touch panel) of the navigation system may be used as the input means 75 of the system 70. As the detection means 73, the one included in the vehicle 60 itself may be used.

The above is the description of the structure example of the system.

[Regarding Forms of Display Device]

Next, forms of the display device in the driving support system in one embodiment of the present invention will be described with reference to FIG. 8. Each diagram of FIG. 8 is a schematic view illustrating the relationship between the shape of the display panel 51 of the display device 50 and the vision of a driver. Here, FIG. 8(A) corresponds to the case where the display panel 51 is in a second form: FIG. 8(B1) and FIG. 8(B2) correspond to the case where the display panel 51 is in a first form: and FIG. 8(C) corresponds to the case where the display panel 51 is in a third form.

[Second Form]

FIG. 8(A) illustrates a form (the second form) in which the display panel 51 of the display device 50 is stored. FIG. 8(A) also illustrates a plane 82 passing through an eye point 81 of a driver 80 and a range in front of the car body (a front vision 83) in which the driver 80 can view through the windshield 61.

Here, in some cases, the eye point 81 of the driver 80 may change depending on the body size or seating position of the driver 80 or the like. For example, as the eye point 81, the reference eye point specified in "Japanese Industrial Standards JIS D 0021 Eye range of drivers for automobiles" can be used.

The plane 82 can be a horizontal plane passing through the eye point 81. Alternatively, the plane 82 can be a plane which passes through the eye point 81 and is parallel to a plane passing through ground points of three tires. Here, the case of being at a level higher than the level of the eye point 81 means being located above the plane 82. The case of being at a level equal to or lower than the level of the eye point 81 means being identical with the plane 82 or being located below the plane 82.

In this specification and the like, the front vision 83 can be a range on a plane which is parallel to a car body center plane (a plane which passes through the left-and-right center line of the car body and is perpendicular to the plane 82) and passes through the eye point 81 and between a line connecting the eye point 81 and the upper edge of the windshield 61 and a line connecting the eye point 81 and the lower edge of the windshield.

FIG. 8(A) is a state in which the display panel 51 is not located in the front vision 83 because the display panel 51 of the display device 50 is stored. Therefore, the driver 80 can drive normally as in the case where the display device 50 is not provided.

[First Form]

FIG. 8(B1) illustrates the case where the display panel 51 of the display device 50 intersects the plane 82. That is, the lower edge of the display panel 51 is located at a level equal to or lower than the level of the eye point 81 of the driver 80. Here, the lower edge of the display panel 51 is located below the front vision 83. When the display panel 51 is in such a form, the driver 80 can look at information such as a picture displayed by the display panel 51 without changing the sight line from the state in FIG. 8(A).

The state illustrated in FIG. 8(B1) can be favorably used when the vehicle is moved backward, for example. At this time, the display panel 51 preferably displays a picture of an area behind the car body. The driver 80 can drive while looking at the picture of the area behind the car body which is displayed by the display panel 51. Since the display panel 51 is located so as to overlap with most of the front vision 83, the picture of the area behind the car body can be displayed in most of the vision of the driver 80. Therefore, a sense of immersion or a sense of reality for the driver 80 is enhanced as compared with the case of employing a display device having a small display (e.g., 10 inches or less diagonally) which is incorporated in a dashboard or the like, for example. Furthermore, when a reverse picture of the picture of the area behind the car body is displayed by the display panel 51, the driver 80 can drive the vehicle backward while feeling as if moving forward.

As illustrated in FIG. 8(B2), the lower edge of the display panel 51 may be located below the plane 82 and inside the front vision 83.

[Third Form]

FIG. 8(C) illustrates the case where the lower edge of the display panel 51 of the display device 50 is located above the plane 82 and within the front vision 83. That is, the lower edge of the display panel 51 is located at a level higher than the level of the eye point 81 of the driver 80. When the display panel 51 is in such a form, the driver 80 can view an area in front of the vehicle and can therefore drive in this state. Since the display panel 51 is located in an upper portion of the vision, the driver 80 can look at a picture or information displayed by the display panel 51 without shifting the sight line significantly. At this time, in addition to the picture of the surroundings of the car body which is taken by the imaging means 72, the display panel 51 preferably displays map information, traffic information, information indicating a moving direction, vehicle's positional information, information such as a route and a distance to the destination or an estimated arrival time, or information such as time, speed, or orientation.

The above is the description of the forms of the display device.

Operation Example

Figure 9:
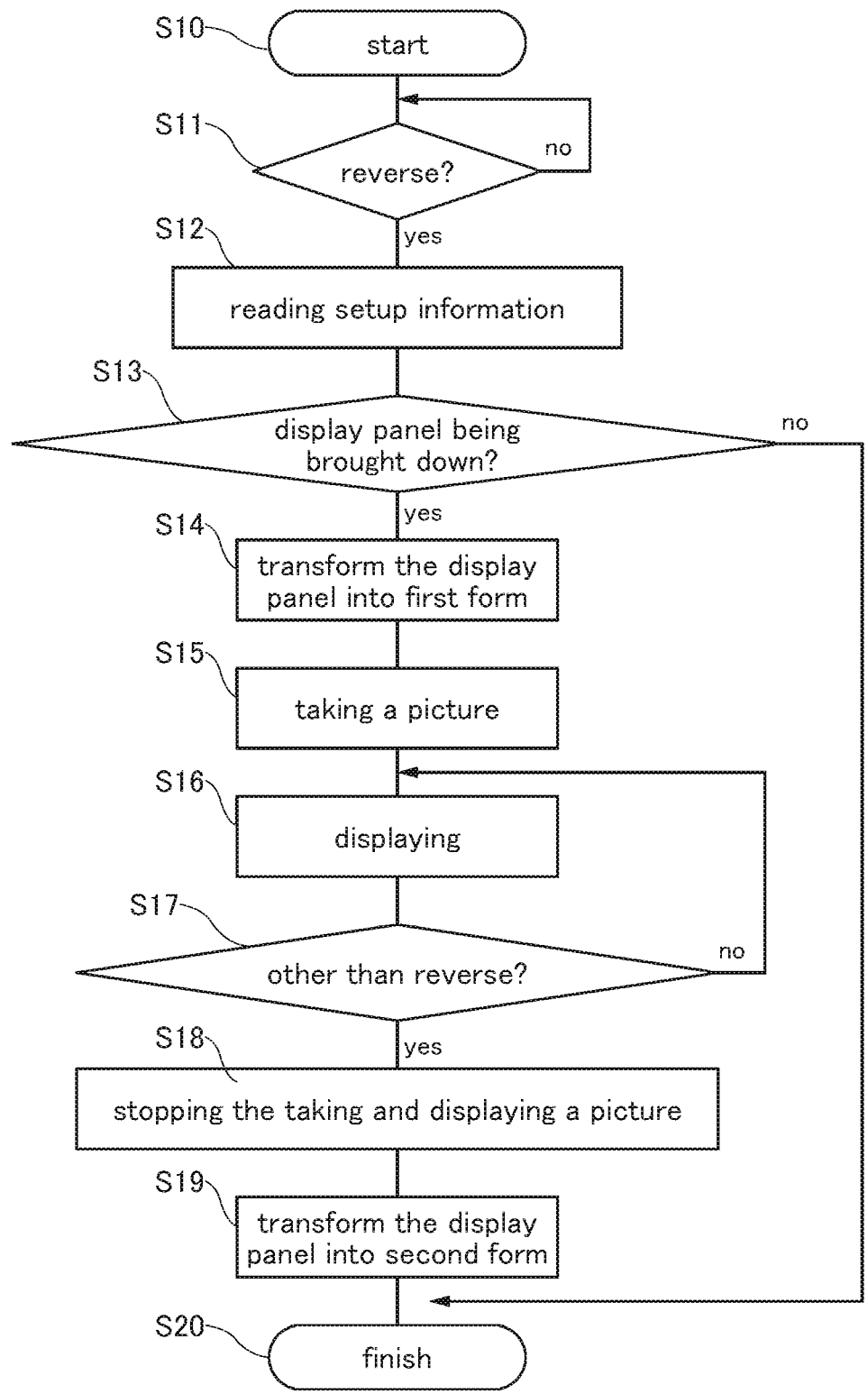
FIG. 9 A flow chart according to an embodiment.

Next, an example of an operation which can be applied to the driving support system in one embodiment of the present invention will be described with reference to FIG. 9. FIG. 9 illustrates a flow chart of an operation of the driving support system.

The operation starts in S10. At this time, the form of the display panel 51 is the second form or the third form. When the display panel 51 is in the third form, the display panel 51 may display a picture or the like. In S10, setup information specifying the operation of the control portion 71 may be input in advance by a user with the input means 75.

In S11, the control portion 71 obtains detection information from the detection means 73. In the case where the detection information is reverse, the operation proceeds to S12. In the case where the detection information is other than reverse, S11 is repeated.

In S12, the control portion 71 reads setup information stored in the memory device 74. The setup information includes information as to whether or not to bring the display panel 51 down in the case where the detection information is reverse.

In S13, the control portion 71 makes a determination based on the setup information. Specifically, in the case where the setup information includes information that the display panel 51 is to be brought down, the operation proceeds to S14. In contrast, in the case of including information that the display panel 51 is not to be brought down, the operation proceeds to S20 and ends.

In S14, the control portion 71 transmits a signal for operation to transform the display panel 51 into the first form to the driving means 52. In accordance with the signal, the driving means 52 transforms the form of the display panel 51 to the first form from the second form or the third form.

Next, in S15, the control portion 71 transmits a signal for starting to take a picture to the imaging means 72. The imaging means 72 starts to take a picture and outputs information about the picture taken to the control portion 71.

In S16, the control portion 71 generates a picture to be displayed by the display panel 51 in accordance with the picture information obtained, and transmits it to the display panel 51. The display panel 51 displays the picture generated by the control portion 71.

Here, the driver 80 can drive the vehicle backward while looking at the picture displayed by the display panel 51.

Next, in S17, the control portion 71 obtains detection information again from the detection means 73. In the case where the detection information is other than reverse, the operation proceeds to S18. In the case where the detection information remains reverse, the operation returns to S16 and the display is maintained.

In S18, the control portion 71 stops display by the display panel 51. Specifically, it stops display including at least the picture taken by the imaging means 72 among pictures displayed by the display panel 51. In S18, the control portion 71 transmits a signal for stopping taking a picture to the imaging means 72. The imaging means 72 stops taking a picture and outputting a picture signal. Stopping taking a picture and stopping display may be performed at the same time, or either one may be performed before the other.

Next, in S19, the control portion 71 transmits a signal for operation to transform the display panel 51 into the second form to the driving means 52. In accordance with the signal, the driving means 52 transforms the form of the display panel 51 to the second form from the first form.

Note that in S19, the display panel 51 may be transformed into the form at the time of S10. For example, in the case where the display panel 51 is in the third form at the stage of S10, the form of the display panel 51 may be transformed to the third form in S19. The form of the display panel 51 to be transformed in S19 may be determined in accordance with the setup information read in S12. For example, in the case where a change to the third form is specified by the setup information, the display panel 51 may be transformed into the third form in S19. The operation ends in S20. In the case where the display panel 51 is in the second form in S20, display of a picture or the like by the display panel 51 is stopped. In contrast, in the case where the display panel 51 is in the third form, a picture or an image may be displayed in a region of the display panel 51 which is visible to the driver.

Note that the example in which the display panel 51 is in the first form in the case where the vehicle is moved backward is described here, but other various operations can be performed.

For example, the control portion 71 may transmit a signal for operation to change the display panel 51 into the third form to the driving means 52 when detection information is forward. At this time, the control portion 71 may start the imaging means 72 to take a picture and may make the display panel 51 display a picture generated in accordance with information about at least one of pictures of areas behind, in front of, and at the sides of the vehicle which are taken by the imaging means 72.

The above is the description of the example of operation of the driving support system.

[Regarding Display by Display Panel]

Pictures or images which can be displayed by the display panel 51 will be described below.

FIG. 10(A) illustrates a state in which the vehicle 60 is moved backward to be parked in a parking space 35. The imaging means 72 for taking a picture of an area behind the vehicle 60 is attached to the rear of the vehicle 60. FIG. 10(A) illustrates the range of a picture 31 taken by the imaging means 72. The parking space 35 is located inside objects 36 such as white lines and wheel stoppers which define the parking space 35. Note that the parking space 35 is indicated by broken lines because it is actually not indicated clearly.

FIG. 10(B1) illustrates an example of the picture 31 taken by the imaging means 72. The picture 31 is a picture of an area behind the vehicle 60, and the objects 36 are shown in the picture 31.

FIG. 10(B2) illustrates an example of a picture 32 displayed by the display panel 51. The picture 32 is a horizontally flipped picture of the picture 31 taken by the imaging means 72. When such a horizontally flipped picture is displayed by the display panel 51, the driver 80 can perform an intuitive driving operation. That is, the horizontal direction of the picture 32 and the direction of steering wheel operation can be identical with each other. In particular, in the case where the display panel 51 is in the first form and located in most of the vision of the driver 80, a sense of immersion or a sense of reality that the driver feels is enhanced, and therefore, the driver can operate the vehicle 60 to move backward as if moving forward.

FIG. 10(B2) illustrates an example in which a guide 37 indicating a moving direction of the vehicle 60 is displayed. At this time, for example, the control portion 71 enables the display panel 51 to display information about the moving direction of the vehicle 60 which is determined in accordance with the current angle of rotation of the steering wheel 64, as picture information such as the guide 37.

By analyzing the picture 31 output from the imaging means 72, the control portion 71 preferably visualize the parking space 35 or information about a direction in which the vehicle 60 should move as an image to be superimposed and displayed over the picture 32. FIG. 10(B2) illustrates an example in which the area of the parking space 35 is visualized (hatched in the diagram) and displayed.

FIG. 11(A) illustrates an example in which a direction in which the vehicle 60 should move is expressed and displayed as an image 38a resembling a steering wheel. The driver 80 can move the vehicle 60 toward the parking space 35 without fail by operating the steering wheel 64 to the same angle as the steering wheel shown in the image 38*a*.

FIGS. 11(B1) and (B2) illustrate another example of the image 38*a*. FIG. 11(B1) illustrates an example in which the current state of the steering wheel 64 is displayed in solid lines and the angle of the steering wheel 64 for directing the vehicle 60 to the direction in which it should move is displayed in dotted lines. At this time, when an arrow or the like indicating the direction of operating (turning) the steering wheel 64 is displayed as illustrated in FIG. 11(B1), a more intuitive operation is possible. In the case where the driver 80 operates (turns) the steering wheel 64 to an appropriate angle, it is preferably indicated clearly to the driver 80 that the steering wheel 64 is set to the appropriate angle with a change in the method of expression such as blinking or color changes of the image 38*a*, for example, as illustrated in FIG. 11(B2). A function of notifying the driver 80 vocally may be included.

In the case where a direction in which the vehicle 60 should move is displayed by the display panel 51 in this manner, for example, the control portion 71 is configured to have a function of analyzing the picture 31 output from the imaging means 72, generating the image 38*a*, and outputting the image 38*a* superimposed over the picture 32 to the display panel 51. More specifically, the control portion 71 is configured to be capable of recognizing the object 36 displayed in the picture 31, analyzing a relative positional relationship between the object 36 and the vehicle 60 from the position of the object 36, and calculating the direction in which the vehicle 60 should move from information such as a distance obtained by the analysis. As examples of the object 36 that can be recognized by the control portion 71, fixed objects, e.g., a white line, a wheel stopper, a wall, a bump, a rut, a curb, a building, a traffic sign, and a road marking and moving objects, e.g., creatures such as a human and an animal and vehicles such as a car and a bicycle can be given. For example, a structure in which the steering wheel is turned or brakes work automatically when the vehicle 60 and the object 36 come close to each other within a predetermined distance may be employed.

The imaging means 72 may be provided at not only the back but also the front, side, or the like of the vehicle 60, and pictures therefrom can be displayed by the display panel 51.

FIG. 12(A) illustrates an example in which the vehicle 60 is provided with four imaging means. In the vehicle 60, an imaging means 72*a* is fixed to the rear of the vehicle, an imaging means 72*b* to the front of the vehicle, an imaging means 72*c* to the left side of the vehicle, and an imaging means 72*d* to the right side of the vehicle. The imaging means 72*a* can take a picture of an area behind the vehicle, the imaging means 72*b* an area in front of the vehicle, the imaging means 72*c* an area at the left side of the vehicle, and the imaging means 72*d* an area at the right side of the vehicle. Here, pictures taken by the imaging means 72*a* to 72*d* are referred to as pictures 31*a* to 31*d*.

FIG. 12(B1) illustrates an example of a picture displayed by the display panel 51. In the range of the picture 32, a picture 32*b* is displayed in an upper portion, a picture 32*a* in a lower portion, a picture 32*c* in a left portion, and a picture 32*d* in a right portion. Here, it is preferable that the picture 32*b* be a picture in the same direction as the picture 31*b*, the picture 32*a* be a horizontally flipped picture of the picture 31*a*, the picture 32*c* be a 90 degree counterclockwise rotated picture of the picture 31*c*, and the picture 32*d* be a 90 degree clockwise rotated picture of the picture 31*d*. When the picture 32 described above is displayed by the display panel 51, the driver 80 can intuitively know the circumstances around the vehicle 60. It is also preferable that an image 38*b* resembling the vehicle 60 be displayed in or around the center among the four pictures as illustrated in FIG. 12(B1) because the picture can be easy to capture more intuitively.

As illustrated in FIG. 12(B2), two adjacent pictures of the pictures 32*a* to 32*d* may be connected and displayed as one picture 32*e* by the display panel 51. At this time, the control portion 71 preferably performs image processing for correcting misalignment or distortion generated at the boundary between the two pictures.

The pictures illustrated in FIGS. 12(B1) and (B2) can be displayed by the display panel 51 not only when the vehicle 60 is moved backward but also in the case where the vehicle 60 is moved forward or in the case where the vehicle 60 is stopped. In particular, when pictures of the picture 32*c* of the left side and the picture 32*d* of the right side of the vehicle 60 are displayed by the display panel 51 in the case where vehicle 60 is moved forward, the driver 80 can know the circumstances in the blind spots of the driver 80, and therefore, safety can be promoted.

Note that FIGS. 12(B1) and (B2) illustrate the case where the display panel 51 displays all pictures of areas at four sides of the vehicle, but one or more pictures from the imaging means may be displayed. An imaging means for taking a picture of an area at the front left or right or an area at the back left or right of the vehicle may also be provided. The picture from the imaging means and a navigation-purpose picture such as map information may be displayed at the same time by the display panel 51.

The above is the description of display by the display panel.

At least part of this embodiment can be implemented in combination with another embodiment described in this specification as appropriate.

Embodiment 3

In this embodiment, examples of a display device in one embodiment of the present invention will be described with reference to drawings.

Structure Example 1

Figure 13A:
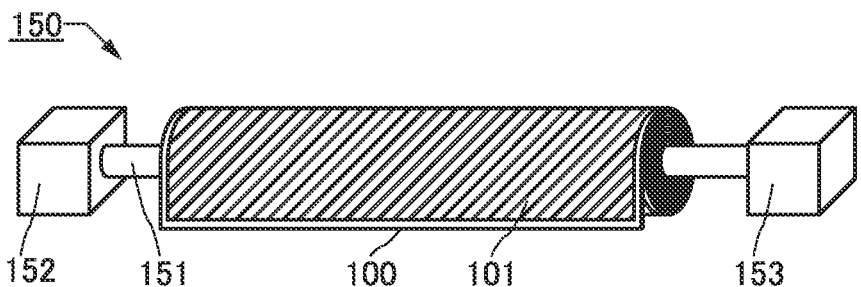
FIGS. 13A-C Structure examples of a display device according to an embodiment.

FIGS. 13(A) and (B) illustrate an example of a structure of a display device 150 in one embodiment of the present invention.

The display device 150 includes a display panel 100, a shaft portion 151, a rotation mechanism 152, and a bearing portion 153.

Figure 13B:
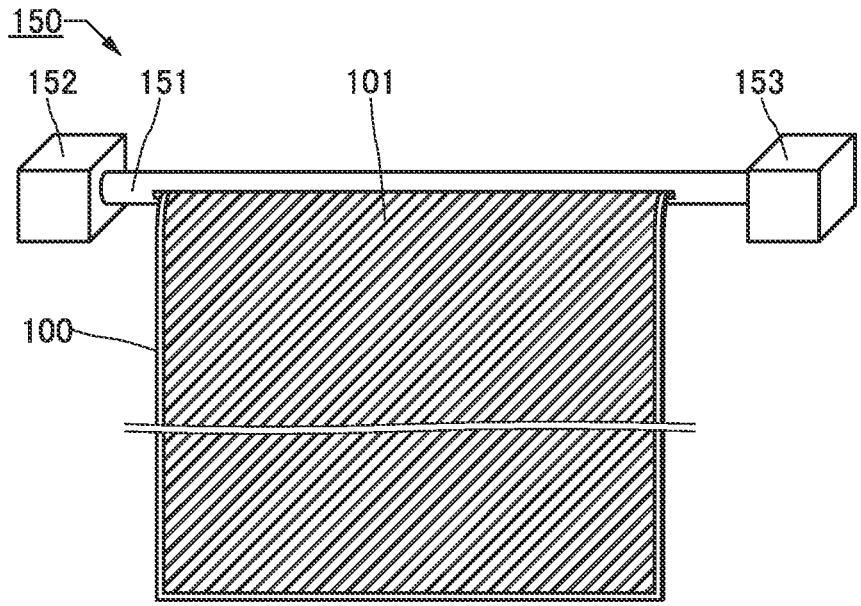

The display panel 100 has flexibility and can be transformed into a form in which the display panel 100 is wound around the shaft portion 151 as illustrated in FIG. 13(A) and a state in which the display panel 100 is suspended as illustrated in FIG. 13(B).

The thickness of the display panel 100 can be, for example, more than or equal to 10 μm and less than or equal to 5 mm, preferably more than or equal to 20 μm and less than or equal to 4 mm, further preferably more than or equal to 50 μm and less than or equal to 3 mm, typically more than or equal to 100 μm and less than or equal to 2 mm. As the thickness of the display panel 100 is decreased, the display device 150 at the time when the display panel 100 is wound can be more compact in size. If the thickness is too small, it is easily influenced by the wind and the like and the mechanical strength of the display panel 100 might be lowered. With a moderate thickness of approximately more than or equal to 0.5 mm and less than or equal to 5 mm, defective waving of the display surface or the like can be reduced even in the state where the display panel 100 is suspended. Note that a member which serves as a weight as illustrated in FIG. 1 or the like may be attached to a lower edge portion of the display panel 100 to suppress curl in the state where the display panel 100 is suspended.

The shaft portion 151 has a function of fixing one end of the display panel 100. In the shaft portion 151, an FPC (Flexible Printed Circuit) or the like electrically connected to the display panel 100 is placed. Here, a connector or a wiring which is electrically connected to the FPC is preferably provided in the shaft portion 151. Furthermore, the shaft portion 151 is preferably provided with a circuit for supplying a signal or a voltage to the display panel 100. Besides, the shaft portion 151 may be configured to include one or more of an antenna, a wireless receiver, a wireless transmitter, a power supply line, a battery, a printed board mounted with an IC such as an arithmetic device or a memory device, an external connection port, and the like.

Here, as the diameter of the shaft portion 151 becomes smaller, the size at the time when the display panel 100 is wound can be smaller. The diameter of the shaft portion 151 can be determined depending on the curvature allowable when the display panel 100 is bent. The diameter of the shaft portion 151 can be, for example, more than or equal to 0.1 mm and less than or equal to 50 mm, preferably more than or equal to 0.5 mm and less than or equal to 30 mm, further preferably more than or equal to 1 mm and less than or equal to 20 mm, still further preferably more than or equal to 2 mm and less than or equal to 10 mm. A bend of the shaft portion 151 under the weight of the display panel 100 can be suppressed as long as the diameter of the shaft portion 151 is more than or equal to 0.1 mm. When the diameter of the shaft portion 151 is less than or equal to 50 mm, the display device 150 can be sufficiently compact in size.

The rotation mechanism 152 has a function of rotating the shaft portion 151. The bearing portion 153 has a function of supporting the shaft portion 151. The rotation mechanism 152 can be configured to rotate the shaft portion 151 with a combination of a gear and power such as a motor, for example.

The rotation mechanism 152 corresponds to, for example, the driving means 52 given as an example in Embodiment 1 and Embodiment 2.

A wiring for supplying electric power and signals to the FPC and the like inside the shaft portion 151 is preferably provided between the rotation mechanism 152 and the shaft portion 151. At this time, to prevent the wiring from being disconnected by a twist given when the shaft portion 151 is rotated, a sufficiently long wiring or a wiring in which a countermeasure against a twist is taken, such as a wiring to which a twist is added in advance in the direction opposite to the rotation direction, is preferably used.

Alternatively, wireless transmission of signals and power may be performed between the rotation mechanism 152 and the shaft portion 151, and a structure in which a wiring is not provided or the number of wirings is reduced may be employed. For example, a structure in which wireless transmission of signals is performed may be employed by providing the rotation mechanism 152 with a wireless transmitter and providing a wireless receiver inside the shaft portion 151. A mechanism for transmitting power by using contactless power feeding may be provided between the rotation mechanism 152 and the shaft portion 151. This can eliminate the risk of occurrence of defective wiring disconnection or the like, and can improve the reliability. Alternatively, signals and power may be supplied to the shaft portion 151 not from the rotation mechanism 152 but from another device directly.

The display device 150 can adjust the length of a suspended region of the display panel 100, i.e., a region contributing to display, by adjusting the amount of rotation of the shaft portion 151 with the rotation mechanism 152.

Figure 13C:
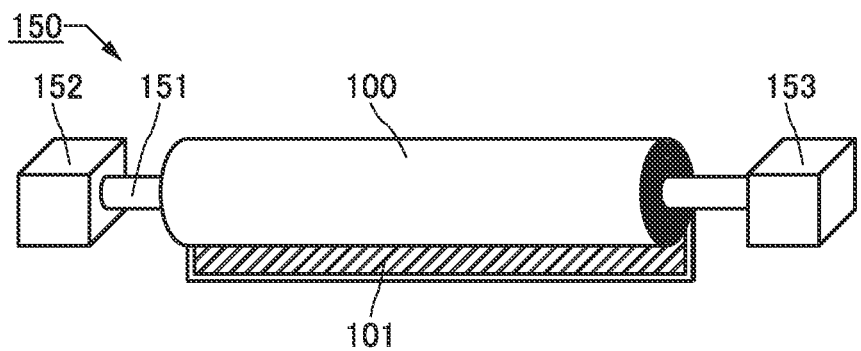

Note that FIGS. 13(A) and (B) illustrate a structure in which the display panel 100 is wound around the shaft portion 151 such that the display portion 101 faces outward, but a structure in which it is wound around the shaft portion 151 such that the display portion 101 faces inward as illustrated in FIG. 13(C) may be employed. Such a structure can suppress physical contact of the surface of the display portion 101 of the display panel 100 with another member.

The above is the description of the structure example 1.

Structure Example 2

A structure example of a display device with a structure different from the above-described structure example 1 will be described below.

Figure 14A:
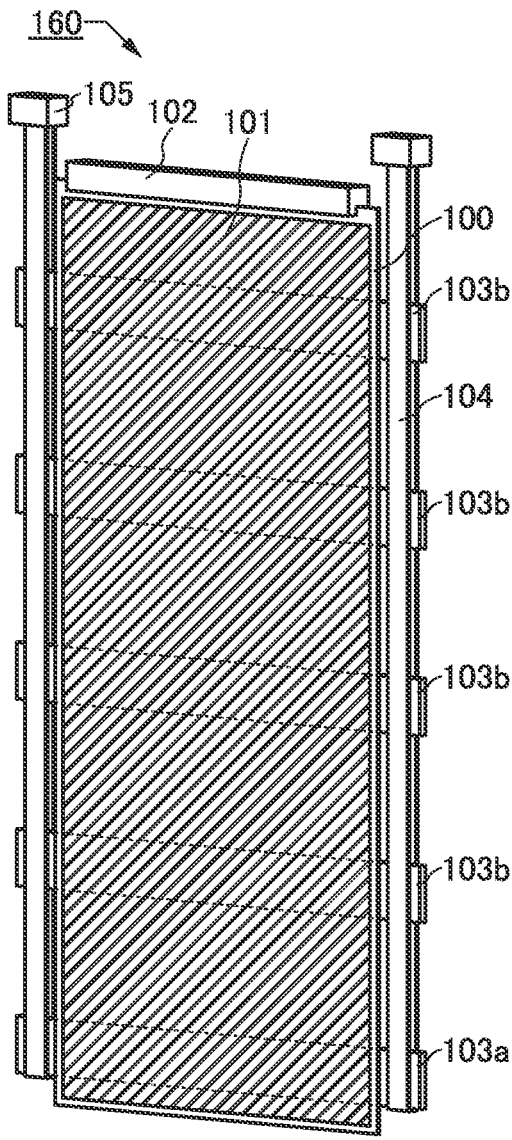
FIGS. 14A-C A structure example of a display device according to an embodiment.
Figure 14B:
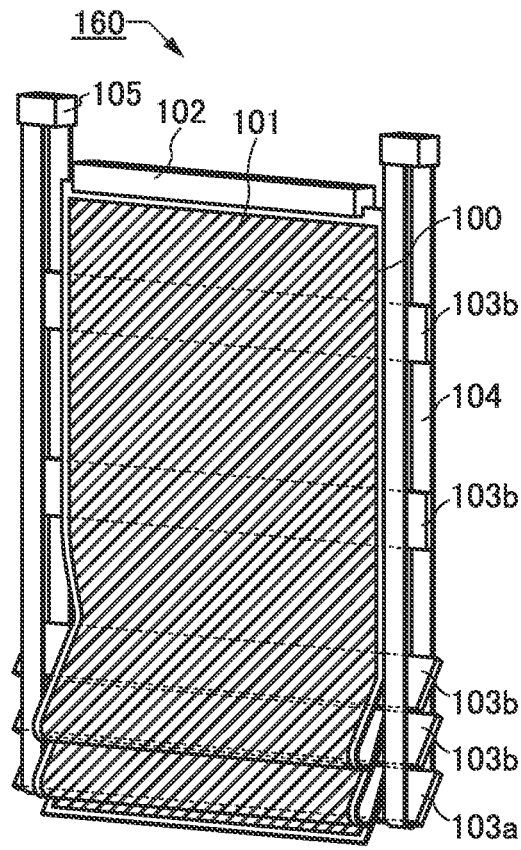
Figure 14C:
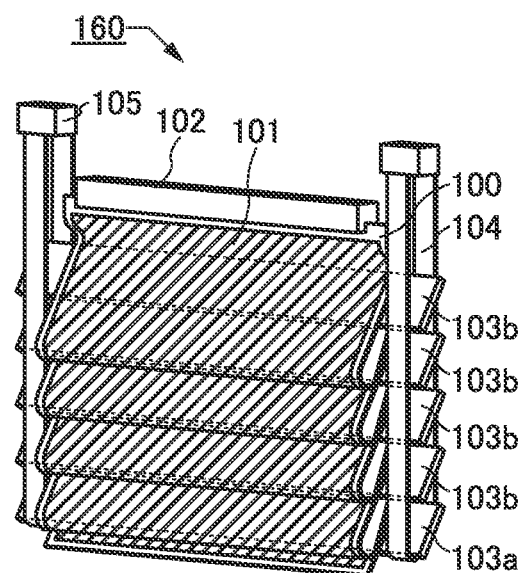

FIGS. 14(A) to (C) illustrate schematic perspective views of a display device 160 in one embodiment of the present invention. FIG. 14(A) illustrates a state where a display surface is in a flat state, FIG. 14(C) illustrates a state where the display surface is in a folded state, and FIG. 14(B) illustrates a state that is intermediate between FIG. 14(A) and FIG. 14(C).

The display device 160 includes a display panel 100, a fixing portion 102, supporting members 103*a* and 103*b*, a cord 104, a winding mechanism 105, and the like. The display panel 100 includes a display portion 101.

Note that an example of the display device 160 which is used in the state where the display panel 100 is suspended is described here, but this vertical positional relationship is not limiting, and it can also be used while being placed horizontally. Here, it is illustrated that the vertical direction of the display portion 101 of the display panel 100 (a direction perpendicular to the long side of the fixing portion 102) is a long-side direction: however, this is not limiting. For example, the display portion 101 may be in a form in which the horizontal direction of the display portion 101 (a direction parallel to the long side of the fixing portion 102) is the long-side direction or may be square.

The display panel 100 has flexibility. Accordingly, the display panel 100 can be reversibly transformed from a state where the display surface is flat into a state where it has a curved surface. For example, the display panel 100 can be bent so that the display surface is placed inward (inwardly bent) and so that the display surface is placed outward (outwardly bent). Accordingly, the display panel 100 can be folded. Portions of the display panel 100 which are supported by the supporting members 103*a* and 103*b* do not need to have flexibility.

It is preferable that the fixing portion 102 and the display panel 100 be fixed so that the relative position is not changed. For example, the fixing portion 102 and the display panel 100 may be fixed with a screw; a rivet, or the like, or may be bonded to each other with an adhesive or the like. A structure in which the fixing portion 102 grips the display panel 100 may be employed.

In the fixing portion 102, an FPC or the like electrically connected to the display panel 100 is placed. Here, a connector or a wiring which is electrically connected to the FPC is preferably provided in the fixing portion 102. Furthermore, the fixing portion 102 is preferably provided with a circuit for supplying a signal or a voltage to the display panel 100. Besides, the fixing portion 102 may be configured to include one or more of an antenna, a wireless receiver, a wireless transmitter, a power supply line, a battery; a printed board mounted with an IC such as an arithmetic device or a memory device, an external connection port, and the like.

The supporting members 103a and 103b are provided on a side opposite to a surface on the display portion 101 side of the display panel 100 and have a function of supporting the display panel 100. The supporting members 103a and 103b have a belt-like shape. The supporting members 103a and 103b are each placed in a short-side direction at intervals. In the description here, the supporting member which is located farthest from the fixing portion 102 when the display surface is in a flat state is referred to as the supporting member 103a, and the other supporting members are referred to as the supporting members 103b. A longer side of a surface of each of the supporting member 103a and the supporting members 103b which overlaps with the display panel 100 is referred to as a long side, and a shorter side thereof is referred to as a short side. The direction perpendicular to the surface of each of the supporting member 103a and the supporting members 103b which overlaps with the display panel 100 is referred to as a thickness direction.

The supporting members 103a and 103b are preferably bonded to the display panel 100 with an adhesive or the like, for example. Alternatively, they may be fixed with an adhesive member. It is preferable that the area where the supporting members 103a and 103b are fixed to the display panel 100 be large because defective peeling of them or the like can be suppressed.

For the supporting members 103a and 103b, a material having lower flexibility or higher rigidity than at least the display panel 100 can be used. When a material whose weight density is lower than the weight density of the display panel 100 is used for the supporting members 103a and 103b, defective breakage of the display panel 100 due to the weight of the supporting members 103a and 103b can be suppressed. There is no particular limitation on the material used for the supporting members 103a and 103b, and a variety of materials such as a metal, an alloy, wood, paper, a synthetic resin, glass, rubber, and ceramic, for example, can be used. It is particularly preferable that a plastic, an alloy containing titanium, or the like be used because of its lightness. The supporting members 103a and 103b may be reduced in weight, for example, by having a structure with an opening partly formed therein or having a structure with a cavity inside. At least portions of the supporting members 103a and 103b which support the display panel 100 have a flat surface, and the other portions may have unevenness.

The cord 104 is connected to at least the supporting member 103a. With a structure in which the display device 160 includes two or more cords 104 connected to both end portions of the supporting member 103a, the supporting member 103a can be supported so that the long-side direction of the supporting member 103a is not inclined and is a direction substantially perpendicular to the vertical direction.

The supporting member 103a and the cord 104 may be fixed with, for example, an adhesive or the like, or may be fixed by, for example, tying the supporting member 103a with the cord 104. The cord 104 may be prevented from falling out by, for example, providing a through hole in the supporting member 103a, passing the cord 104 through the through hole, and then connecting a member larger than the diameter of the through hole to the cord 104.

An upper portion of the cord 104 is provided with the winding mechanism 105. When the cord 104 is wound by the winding mechanism 105, the supporting member 103a can be moved upward (to the fixing portion 102 side). When the cord 104 is pulled out by the winding mechanism 105, the supporting member 103a can be moved downward (to a side opposite to the fixing portion 102) with gravity.

The winding mechanism 105 may have a variety of structures as long as it has a function of winding the cord 104. For example, the winding mechanism 105 may include at least a rotation axis fixed to the cord 104. The winding mechanism 105 may be configured to wind the cord 104 by manual pulling of a winding cord or the like or may include a motor or the like and be configured to wind the cord 104 electrically. At this time, a structure in which a wireless receiver or the like is provided and operation can be performed with a remote controller may be employed.

The winding mechanism 105 corresponds to, for example, the driving means 52 given as an example in Embodiment 1 and Embodiment 2.

Although the winding mechanism 105 and the fixing portion 102 are separately illustrated here, a structure in which they are included in one housing may be employed.

When the cord 104 is wound by the winding mechanism 105, the display device 160 can be transformed from the state illustrated in FIG. 14(A) into the state illustrated in FIG. 14(C) through the state illustrated in FIG. 14(B). On the contrary, when the cord 104 is pulled out by the winding mechanism 105, the display device 160 can be transformed from the state illustrated in FIG. 14(C) into the state illustrated in FIG. 14(A) through the state illustrated in FIG. 14(B). That is, the state of the display panel 100 can be changed between the state illustrated in FIG. 14(A) and the state illustrated in FIG. 14(C) by the winding mechanism 105.

When the cord 104 is wound by the winding mechanism 105, the supporting member 103a is moved upward. At this time, as the distance between the supporting member 103a and the supporting member 103b adjacent to the supporting member 103a becomes smaller, the display panel 100 becomes more curved. At this time, external force applied to the display panel 100 is mainly force due to approach of the supporting member 103a and the supporting member 103b, gravity, or the like, and no other external force is applied, so that the display panel 100 is curved to have a natural shape in accordance with the relative positions of the two supporting members. Accordingly, breakage of the display panel 100 due to curvature (or bend) beyond the allowable curvature radius of the display panel 100 which is caused by too much external force applied to the display panel 100 can be suppressed.

As illustrated in FIG. 14(B), in accordance with movement of the supporting member 103a, the other supporting members 103b overlap with the supporting member 103a naturally. At this time, the distance between the supporting members is kept constant by force with which the display panel 100 returns to its original shape (also referred to as restoring force) when curved. Accordingly, excessive approach of the supporting members to each other can be suppressed, leading to prevention of breakage of the display panel 100. Note that in the case where the restoring force of the display panel 100 is small with respect to the weight of the supporting member 103b, a mechanism which keeps a certain distance between the supporting members 103b or between the supporting member 103a and the supporting member 103b is preferably provided between the cord 104 and the supporting member 103b.

For example, when the supporting member 103a is pulled up from the state in FIG. 14(A), part of the display panel 100 between the supporting member 103a and the supporting member 103b in the lowest position is curved. Furthermore, as the distance to which the supporting member 103a is pulled up becomes larger, the curvature of the display panel 100 becomes larger, and accordingly the restoring force of the display panel 100 increases. Here, the supporting members 103b are not fixed to the cord 104 and can be moved vertically, so that the supporting member 103b in the lowest position is lifted by the restoring force of the display panel 100. After that, in a similar manner, part of the display panel 100 between the supporting member 103b in the lowest position and the supporting member 103b in the next position is curved. Thus, the supporting member 103a is pulled up by the cord 104, whereby the display panel 100 can be transformed from the state in FIG. 14(A) into the state in FIG. 14(C) through the state in FIG. 14(B). Here, in the state where the display panel 100 is suspended, a curved portion of the display panel 100 which is closer to a lower side has a smaller curvature radius under the influence of gravity in some cases.

As illustrated in each diagram of FIG. 14, it is preferable to employ a form in which the cord 104 is folded back at the supporting member 103a and a structure in which each of the supporting members 103b is sandwiched between two portions of the cord 104. Thus, the cord 104 can serve as a guide for making the supporting members 103 move only vertically.

Furthermore, when the cord 104 has a belt-like shape as illustrated in each diagram of FIG. 14, the supporting member 103a and the supporting members 103b can be held more stably. The width of the cord 104 can be, for example, more than or equal to 2 mm and less than or equal to 100 mm, preferably more than or equal to 5 mm and less than or equal to 50 mm, further preferably more than or equal to 10 mm and less than or equal to 50 mm. Alternatively, the width of the cord 104 is preferably larger than the thickness of the supporting member 103a or the supporting members 103b. Specifically, when the width of the cord 104 is more than or equal to 5 mm, defective rotation of the supporting member 103a or the supporting members 103b or the like can be suppressed.

Note that the form of the cord 104 is not limited thereto. For example, a form in which a string-like material is used for the cord 104 and passed through a through hole provided in the supporting member 103b may be employed. Also in this case, the cord 104 can serve as a guide for the supporting members 103b. At this time, a structure in which one of end portions of the string-like cord 104 is connected to the supporting member 103a and the other of the end portions is connected to the winding mechanism 105 may be employed, so that the cord 104 is not necessarily folded back.

The winding mechanism 105 can adjust the angle of the supporting member 103a by winding one of two end portions of the folded back cord 104 before the other. For example, the adjustment can be performed such that the short-side direction of the supporting member 103a is the vertical direction when the display surface of the display panel 100 is in a flat state as illustrated in FIG. 14(A), and such that the angle formed by the short-side direction of the supporting member 103a and the vertical direction is greater than 0 degrees and less than or equal to 90 degrees when the display surface of the display panel 100 is folded as illustrated in FIGS. 14(B) and (C). When the angle of the supporting member 103a is set to an angle close to 90 degrees, the display panel 100 can be more compact when folded.

For the cord 104, a material having higher flexibility (or higher softness) than the display panel 100 can be used, for example. It is preferable that a fibrous material or the like be used for the cord 104 because winding becomes easier. There is no particular limitation on a material which can be used for the cord 104, and a variety of materials such as a natural fiber, a synthetic fiber, paper, a synthetic resin, rubber, a fibrous metal, and a fibrous alloy can be used, for example. The cord 104 has a belt-like shape in FIG. 14 and the like, but is not limited to the band-like shape and can be in a variety of forms such as a string-like form, a thread-like form, and a chain-like form as long as the cord 104 can be wound by the winding mechanism 105.

Modification Example

Figure 15A:
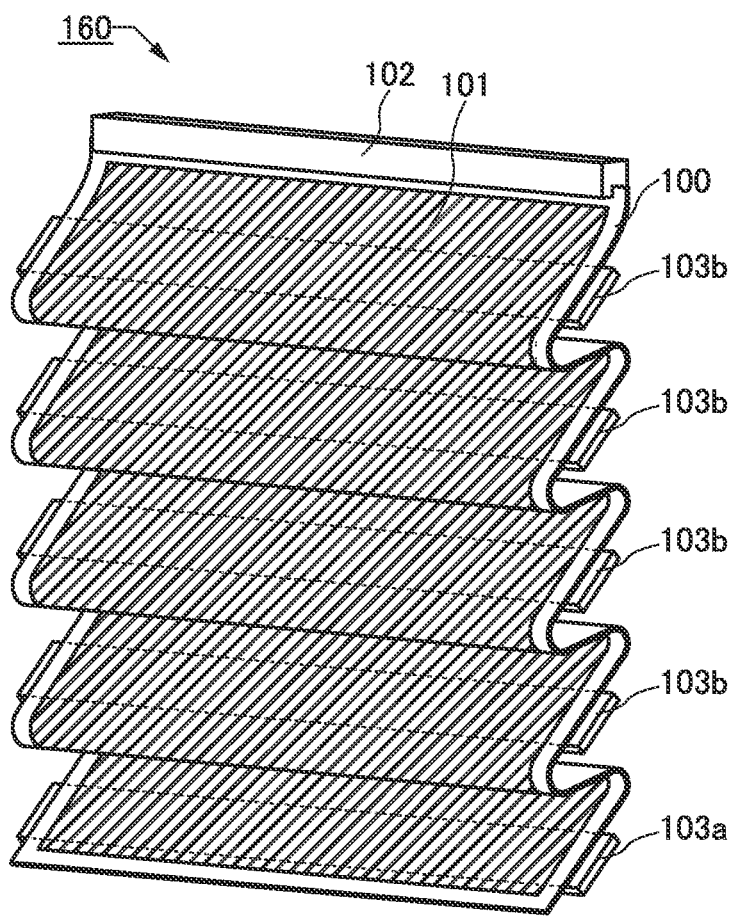
FIGS. 15A-B A structure example of a display device according to an embodiment.
Figure 15B:
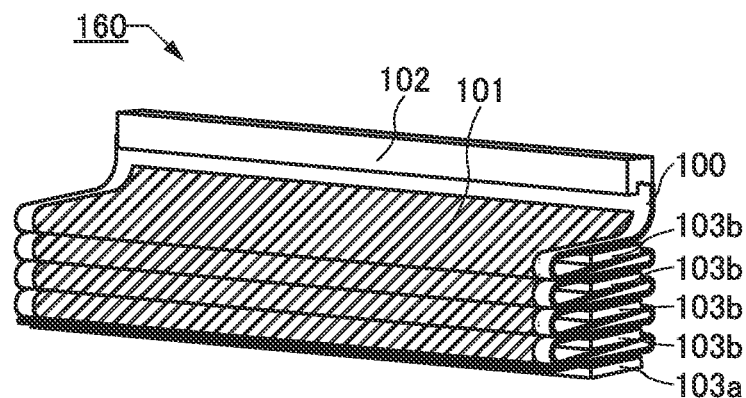

Although the structure in which the display panel 100 is folded by pulling up the supporting member 103a which is the farthest from the fixing portion 102 with use of the cord 104 is employed in the above-described structure example 2, a structure in which the supporting members 103b in addition to the supporting member 103a are pulled up at the same time may be employed. An example in such a case is illustrated in FIGS. 15(A) and (B). FIG. 15(A) is a schematic perspective view in which the display panel 100 is in the process of being folded, and FIG. 15(B) is a schematic perspective view in which the display panel 100 is in a folded state.

Note that although the cord 104 and the like are not clearly illustrated in FIGS. 15(A) and (B) for clarification, the connection relationship between the cord 104 and the supporting member 103a in the structure example 1 can be referred to for those between the cords 104 and the supporting member 103a and the supporting members 103b. That is, a structure in which a plurality of cords to which the supporting member 103a and each of the plurality of supporting members 103b are connected may be employed.

Figure 16A:
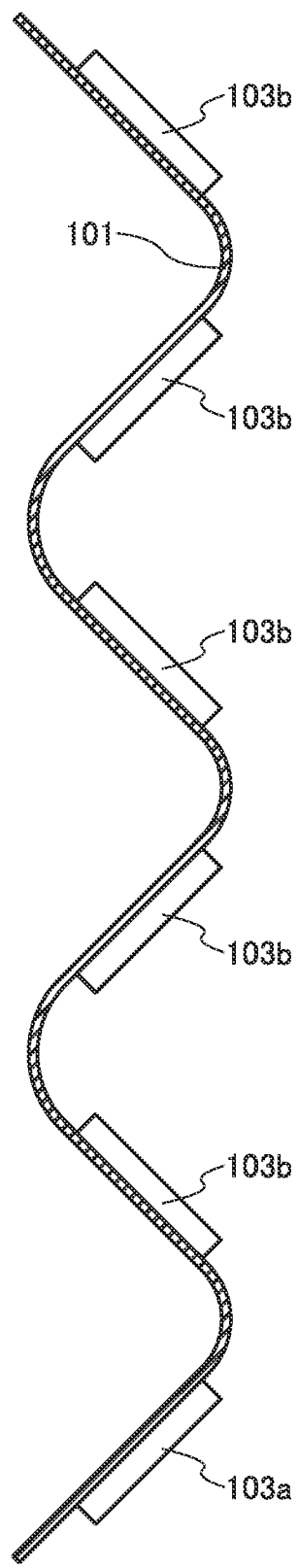
FIGS. 16A-B A structure example of a display device according to an embodiment.
Figure 16B:
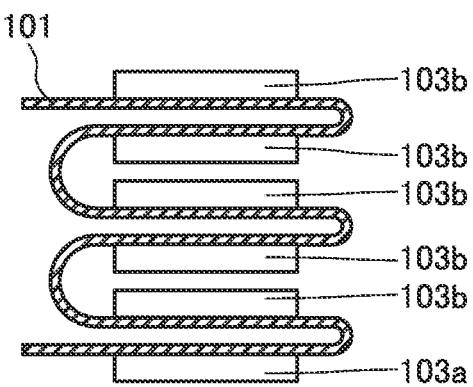

As illustrated in FIGS. 16(A) and (B), a structure in which the display panel 100 is folded with the angles of the two adjacent supporting members adjusted such that they are inclined to sides opposite to each other may be employed.

The above is the description of the structure example 2.

At least part of this embodiment can be implemented in combination with another embodiment described in this specification as appropriate.

Embodiment 4

In this embodiment, structure examples and a manufacturing method example of a light-emitting panel that is applicable to a display panel included in the display device in one embodiment of the present invention will be described.

Specific Example 1

FIG. 17(A) illustrates a plan view of a light-emitting panel, and FIG. 17(C) illustrates an example of a cross-sectional view along dashed-dotted line A1-A2 in FIG. 17(A). The light-emitting panel described in the specific example 1 is a top-emission light-emitting panel using a color filter method. In this embodiment, the light-emitting panel can employ, for example, a structure in which sub-pixels of three colors of R (red), G (green), and B (blue) express one color, a structure in which sub-pixels of four colors of R (red), G (green), B (blue), and W (white) or R (red), G (green), B (blue), and Y (yellow) express one color, or the like. There is no particular limitation on color elements, and colors other than RGBW may be used. For example, yellow; cyan, magenta, or the like may be included.

The light-emitting panel illustrated in FIG. 17(A) includes a light-emitting portion 804, driver circuit portions 806, and an FPC (Flexible Printed Circuit) 808. Light-emitting elements and transistors included in the light-emitting portion 804 and the driver circuit portions 806 are sealed with a substrate 801, a substrate 803, and a sealing layer 823.

The light-emitting panel illustrated in FIG. 17(C) includes the substrate 801, an adhesive layer 811, an insulating layer 813, a plurality of transistors, a conductive layer 857, an insulating layer 815, an insulating layer 817, a plurality of light-emitting elements, an insulating layer 821, the sealing layer 823, an overcoat 849, a coloring layer 845, a light-blocking layer 847, an insulating layer 843, an adhesive layer 841, and the substrate 803. The sealing layer 823, the overcoat 849, the insulating layer 843, the adhesive layer 841, and the substrate 803 transmit visible light.

The light-emitting portion 804 includes a transistor 820 and a light-emitting element 830 over the substrate 801 with the adhesive layer 811 and the insulating layer 813 provided therebetween. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. The lower electrode 831 preferably reflects visible light. The upper electrode 835 transmits visible light.

The light-emitting portion 804 also includes the coloring layer 845 overlapping with the light-emitting element 830 and the light-blocking layer 847 overlapping with the insulating layer 821. The coloring layer 845 and the light-blocking layer 847 are covered with the overcoat 849. A space between the light-emitting element 830 and the overcoat 849 is filled with the sealing layer 823.

The insulating layer 815 has an effect of suppressing the diffusion of impurities into a semiconductor included in the transistor. As the insulating layer 817, an insulating layer having a planarization function is preferably selected in order to reduce surface unevenness due to the transistor.

The driver circuit portions 806 include a plurality of transistors over the substrate 801 with the adhesive layer 811 and the insulating layer 813 therebetween. FIG. 17(C) illustrates one of the transistors included in the driver circuit portions 806.

The insulating layer 813 and the substrate 801 are bonded to each other with the adhesive layer 811. In addition, the insulating layer 843 and the substrate 803 are bonded to each other with the adhesive layer 841. It is preferable to use films with low water permeability for the insulating layer 813 and the insulating layer 843, in which case the entry of an impurity such as water into the light-emitting element 830 or the transistor 820 can be suppressed, leading to high reliability of the light-emitting panel.

The conductive layer 857 is electrically connected to an external input terminal through which a signal (e.g., a video signal, a clock signal, a start signal, or a reset signal) or a potential from the outside is transmitted to the driver circuit portion 806. Here, an example in which the FPC 808 is provided as the external input terminal is described. To prevent an increase in the number of steps, the conductive layer 857 is preferably formed using the same material and the same step as the electrode or the wiring in the light-emitting portion or the driver circuit portion. Here, an example in which the conductive layer 857 is formed using the same material and the same step as the electrodes included in the transistor 820 is described.

In the light-emitting panel illustrated in FIG. 17(C), a connector 825 is located over the substrate 803. The connector 825 is connected to the conductive layer 857 through an opening provided in the substrate 803, the adhesive layer 841, the insulating layer 843, the sealing layer 823, the insulating layer 817, and the insulating layer 815. The connector 825 is also connected to the FPC 808. The FPC 808 and the conductive layer 857 are electrically connected to each other via the connector 825. In the case where the conductive layer 857 and the substrate 803 overlap with each other, the conductive layer 857, the connector 825, and the FPC 808 can be electrically connected to one another by forming an opening in the substrate 803 (or using a substrate having an opening).

The specific example 1 describes the light-emitting panel which can be manufactured by forming the insulating layer 813, the transistor 820, and the light-emitting element 830 over a formation substrate with high heat resistance, separating the formation substrate, and transferring the insulating layer 813, the transistor 820), and the light-emitting element 830 to the substrate 801 with the adhesive layer 811. The specific example 1 also describes the light-emitting panel which can be manufactured by forming the insulating layer 843, the coloring layer 845, and the light-blocking layer 847 over a formation substrate with high heat resistance, separating the formation substrate, and transferring the insulating layer 843, the coloring layer 845, and the light-blocking layer 847 to the substrate 803 with the adhesive layer 841.

In the case where a material with low heat resistance (e.g., a resin) is used for a substrate, it is difficult to expose the substrate to high temperatures in the manufacturing process. Thus, there is a limitation on conditions for forming a transistor and an insulating layer over the substrate. In addition, in the case where a material with high water permeability (e.g., a resin) is used for a substrate, it is preferable to form a film at high temperatures to have low water permeability. In the manufacturing method of this embodiment, a transistor and the like can be formed over a formation substrate with high heat resistance: thus, a highly reliable transistor and a film with sufficiently low water permeability can be formed at high temperatures. Then, these are transferred to the substrate 801 and the substrate 803, whereby a highly reliable light-emitting panel can be manufactured. Thus, according to one embodiment of the present invention, a lightweight or thin and highly reliable light-emitting panel can be realized. Details of the manufacturing method will be described later.

Specific Example 2

FIG. 17(B) illustrates a plan view of a light-emitting panel, and FIG. 17(D) illustrates an example of a cross-sectional view along dashed-dotted line A3-A4 in FIG. 17(B). The light-emitting panel described in the specific example 2 is a top-emission light-emitting panel using a color filter method, which is different from that in the specific example 1. Portions different from those in the specific example 1 will be described in detail here and the descriptions of portions common to the specific example 1 will be omitted.

The light-emitting panel illustrated in FIG. 17(D) is different from the light-emitting panel illustrated in FIG. 17(C) in the aspects below.

The light-emitting panel illustrated in FIG. 17(D) includes a spacer 827 over the insulating layer 821. By providing the spacer 827, the distance between the substrate 801 and the substrate 803 can be adjusted.

In addition, in the light-emitting panel illustrated in FIG. 17(D), the substrate 801 and the substrate 803 have different sizes. The connector 825 is located over the insulating layer 843 and thus does not overlap with the substrate 803. The connector 825 is connected to the conductive layer 857 through an opening provided in the insulating layer 843, the sealing layer 823, the insulating layer 817, and the insulating layer 815. Since no opening needs to be provided in the substrate 803, there is no limitation on the material of the substrate 803.

Specific Example 3

FIG. 18(A) illustrates a plan view of a light-emitting panel, and FIG. 18(C) illustrates an example of a cross-sectional view along dashed-dotted line A5-A6 in FIG. 18(A). The light-emitting panel described in the specific example 3 is a top-emission light-emitting panel using a separate coloring method. Portions different from those in the above-described specific examples will be described in detail here and the descriptions of portions common to the above-described specific examples will be omitted.

The light-emitting panel illustrated in FIGS. 18(A) and (C) includes a frame-like sealing layer 824. It also includes the substrate 803 in contact with the sealing layer 823 and the frame-like sealing layer 824.

The light-emitting panel illustrated in FIG. 18(C) includes the substrate 801, the adhesive layer 811, the insulating layer 813, a plurality of transistors, the conductive layer 857, the insulating layer 815, the insulating layer 817, a plurality of light-emitting elements, the insulating layer 821, the sealing layer 823, the frame-like sealing layer 824, and the substrate 803. The sealing layer 823 and the substrate 803 transmit visible light.

The frame-like sealing layer 824 is preferably a layer having a higher gas barrier property than the sealing layer 823. Accordingly, the entry of external moisture or oxygen into the light-emitting panel can be suppressed. Thus, a light-emitting panel with high reliability can be realized.

In the specific example 3, light emitted from the light-emitting element 830 is extracted from the light-emitting panel through the sealing layer 823. Therefore, the sealing layer 823 preferably has a higher light-transmitting property than the frame-like sealing layer 824. In addition, the sealing layer 823 preferably has a higher refractive index than the frame-like sealing layer 824. In addition, it is preferable that a reduction in the volume of the sealing layer 823 by curing be smaller than that of the frame-like sealing layer 824.

The connector 825 is connected to the conductive layer 857 through an opening provided in the substrate 803, the sealing layer 823, the insulating layer 817, and the insulating layer 815.

The specific example 3 describes the light-emitting panel which can be manufactured by forming the insulating layer 813, the transistor 820, and the light-emitting element 830 over a formation substrate with high heat resistance, separating the formation substrate, and transferring the insulating layer 813, the transistor 820, and the light-emitting element 830 to the substrate 801 with the adhesive layer 811. A transistor and the like can be formed over a formation substrate with high heat resistance: thus, a highly reliable transistor and a film with sufficiently low water permeability can be formed at high temperatures. Then, these are transferred to the substrate 801, whereby a highly reliable light-emitting panel can be manufactured. Thus, according to one embodiment of the present invention, a lightweight or thin and highly reliable light-emitting panel can be realized.

Specific Example 4

FIG. 18(B) illustrates a plan view of a light-emitting panel, and FIG. 18(D) illustrates an example of a cross-sectional view along dashed-dotted line A7-A8 in FIG. 18(B). The light-emitting panel described in the specific example 4 is a bottom-emission light-emitting panel using a color filter method. Portions different from those in the above-described specific examples will be described in detail here and the descriptions of portions common to the above-described specific examples will be omitted.

The light-emitting panel illustrated in FIG. 18(D) includes the substrate 801, the adhesive layer 811, the insulating layer 813, a plurality of transistors, the conductive layer 857, the insulating layer 815, the coloring layer 845, an insulating layer 817a, an insulating layer 817b, a conductive layer 816, a plurality of light-emitting elements, the insulating layer 821, the sealing layer 823, and the substrate 803. The substrate 801, the adhesive layer 811, the insulating layer 813, the insulating layer 815, the insulating layer 817a, and the insulating layer 817b transmit visible light.

FIG. 18(D) illustrates the case where the light-emitting portion 804 includes the transistor 820 and a transistor 822. The upper electrode 835 preferably reflects visible light. The lower electrode 831 transmits visible light. The position where the coloring layer 845 that overlaps with the light-emitting element 830 is provided is not particularly limited; for example, it may be provided between the insulating layer 817a and the insulating layer 817b or between the insulating layer 815 and the insulating layer 817a.

FIG. 18(D) illustrates two of the transistors included in the driver circuit portion 806.

In addition, here, an example in which the conductive layer 857 is formed using the same material and the same step as the conductive layer 816 is described.

The specific example 4 describes the light-emitting panel which can be manufactured by forming the insulating layer 813, the transistor 820, the light-emitting element 830, and the like over a formation substrate with high heat resistance, separating the formation substrate, and transferring the insulating layer 813, the transistor 820, the light-emitting element 830, and the like to the substrate 801 with the adhesive layer 811. A transistor and the like can be formed over a formation substrate with high heat resistance: thus, a highly reliable transistor and a film with sufficiently low water permeability can be formed at high temperatures. Then, these are transferred to the substrate 801, whereby a highly reliable light-emitting panel can be manufactured. Thus, according to one embodiment of the present invention, a lightweight or thin and highly reliable light-emitting panel can be realized.

Specific Example 5

FIG. 18(E) illustrates an example of a light-emitting panel that is different from those in the specific examples 1 to 4.

Portions different from those in the above-described specific examples will be described in detail here and the descriptions of portions common to the above-described specific examples will be omitted.

The light-emitting panel illustrated in FIG. 18(E) includes the substrate 801, the adhesive layer 811, the insulating layer 813, a conductive layer 814, a conductive layer 857a, a conductive layer 857b, the light-emitting element 830, the insulating layer 821, the sealing layer 823, and the substrate 803.

The conductive layer 857a and the conductive layer 857b, which have a function of external connection electrodes of the light-emitting panel, can each be electrically connected to an FPC or the like.

The light-emitting element 830 includes the lower electrode 831, the EL layer 833, and the upper electrode 835. The end portion of the lower electrode 831 is covered with the insulating layer 821. The light-emitting element 830 is bottom-emission, top-emission, or dual-emission. An electrode, a substrate, an insulating layer, and the like on the light extraction side each transmit visible light. The conductive layer 814 is electrically connected to the lower electrode 831.

The substrate on the light extraction side may have, as a light extraction structure, a hemispherical lens, a micro lens array, a film provided with an uneven surface structure, a light diffusing film, or the like. For example, a light extraction structure can be formed by bonding the above lens or film to a resin substrate with an adhesive or the like having substantially the same refractive index as the substrate, or the lens or film.

The conductive layer 814 is preferably, though not necessarily, provided because voltage drop due to the resistance of the lower electrode 831 can be suppressed. In addition, for a similar purpose, a conductive layer electrically connected to the upper electrode 835 may be provided over the insulating layer 821, over the EL layer 833, over the upper electrode 835, or the like.

The conductive layer 814 can be a single layer or a stacked layer formed using a material selected from copper, titanium, tantalum, tungsten, molybdenum, chromium, neodymium, scandium, nickel, and aluminum; an alloy material containing any of these as its main component; or the like. The thickness of the conductive layer 814 can be, for example, more than or equal to 0.1 µm and less than or equal to 3 µm, preferably more than or equal to 0.1 µm and less than or equal to 0.5 µm.

When a paste (e.g., silver paste) is used as a material for the conductive layer electrically connected to the upper electrode 835, metal particles forming the conductive layer aggregate. Therefore, the surface of the conductive layer is rough and has many gaps in a structure. Thus, it is difficult for the EL layer 833 to completely cover the conductive layer: accordingly, the upper electrode and the conductive layer are electrically connected to each other easily, which is preferable.

The specific example 5 describes the light-emitting panel which can be manufactured by forming the insulating layer 813, the light-emitting element 830, and the like over a formation substrate with high heat resistance, separating the formation substrate, and transferring the insulating layer 813, the light-emitting element 830, and the like to the substrate 801 with the adhesive layer 811. Films with sufficiently low water permeability (e.g., the insulating layer 813 and the like) are formed over the formation substrate with high heat resistance at high temperatures and then are transferred to the substrate 801, whereby a highly reliable light-emitting panel can be manufactured. Thus, according to one embodiment of the present invention, a lightweight or thin and highly reliable light-emitting panel can be realized.

Note that although the example in the case where the light-emitting element is used as a display element is described here, one embodiment of the present invention is not limited thereto.

For example, a display device using a display element such as a MEMS (Micro Electro Mechanical System) element or an electron-emissive element can be used. As display elements using MEMS, a MEMS shutter display element, an optical interference type MEMS display element, and the like can be given. A carbon nanotube may be used for the electron-emissive element. Alternatively, electronic paper may be used. As the electronic paper, an element using a microcapsule method, an electrophoretic method, an electrowetting method, an Electronic Liquid Powder (registered trademark) method, or the like can be used.

[Examples of Materials]

Next, materials and the like that can be used for the light-emitting panel will be described. Note that description on the structures already described in this specification may be omitted in some cases.

For the substrates, a material such as glass, quartz, an organic resin, a metal, or an alloy can be used. For the substrate on the side from which light from the light-emitting element is extracted, a material which has a light-transmitting property with respect to that light is used.

It is particularly preferable to use a flexible substrate. For example, an organic resin or glass, a metal, or an alloy that is thin enough to have flexibility can be used.

An organic resin, which has a specific gravity smaller than that of glass, is preferably used for the flexible substrate, in which case the light-emitting panel can be more lightweight than in the case where glass is used.

For the substrates, a material with high toughness is preferably used. Accordingly, a light-emitting panel with high impact resistance that is robust can be realized. For example, when an organic resin substrate, a thin metal substrate, or a thin alloy substrate is used, the light-emitting panel which is lighter and more robust than in the case where a glass substrate is used can be realized.

A metal material and an alloy material, which have high thermal conductivity, are preferred because they can easily conduct heat to the whole substrate and accordingly can suppress a local temperature rise in the light-emitting panel. The thickness of a substrate using a metal material or an alloy material is preferably more than or equal to 10 µm and less than or equal to 200 µm, further preferably more than or equal to 20 µm and less than or equal to 50 µm.

There is no particular limitation on a material of the metal substrate or the alloy substrate, and it is possible to use, for example, a metal such as aluminum, copper, iron, titanium, or nickel or an alloy containing one or more metals selected from these metals. As the alloy, for example, an aluminum alloy, stainless steel, or the like can be favorably used.

Furthermore, when a material with high thermal emissivity is used for the substrate, a surface temperature rise of the light-emitting panel can be suppressed, leading to suppression of breakage or a decrease in reliability of the light-emitting panel. For example, the substrate may have a stacked-layer structure of a metal substrate and a layer with high thermal emissivity (e.g., a metal oxide or a ceramic material can be used).

As materials having flexibility and a light-transmitting property, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, polytetrafluoroethylene (PTFE), and the like can be given. In particular, a material whose coefficient of thermal expansion is low is preferably used, and for example, a polyamide imide resin, a polyimide resin, PET, or the like can be favorably used. A substrate in which a fibrous body is impregnated with a resin (also referred to as prepreg) or a substrate whose coefficient of thermal expansion is reduced by mixing an organic resin with an inorganic filler can also be used.

The flexible substrate may have a stacked-layer structure in which a hard coat layer (such as a silicon nitride layer) by which a device surface is protected from damage or the like, a layer (such as an aramid resin layer) that can disperse pressure, or the like is stacked over a layer of the above-mentioned material.

For the flexible substrate, a plurality of layers may be stacked and used. With a structure including a glass layer, a barrier property against water and oxygen can be improved and thus a highly reliable light-emitting panel can be provided.

For example, a flexible substrate in which a glass layer, an adhesive layer, and an organic resin layer are stacked from the side closer to a light-emitting element can be used. The thickness of the glass layer is more than or equal to 20 μm and less than or equal to 200 μm, preferably more than or equal to 25 μm and less than or equal to 100 μm. With such a thickness, the glass layer can realize both an excellent barrier property against water and oxygen and a high flexibility. The thickness of the organic resin layer is more than or equal to 10 μm and less than or equal to 200 μm, preferably more than or equal to 20 μm and less than or equal to 50 μm. By providing such an organic resin layer outside the glass layer, a crack or a break in the glass layer can be suppressed and mechanical strength can be improved. With the substrate that includes such a composite material of a glass material and an organic resin, a highly reliable and flexible light-emitting panel can be provided.

As the adhesive layer or the sealing layer, a variety of curable adhesives such as a reactive curable adhesive, a thermosetting adhesive, an anaerobic adhesive, and a photocurable adhesive such as an ultraviolet curable adhesive can be used. As these adhesives, an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, and the like can be given. A material with low moisture permeability, such as an epoxy resin, is particularly preferable. Alternatively, a two-component-mixture-type resin may be used. Alternatively, an adhesive sheet or the like may be used.

In addition, the resin may include a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can suppress the entry of an impurity such as moisture into a functional element, thereby improving the reliability of the light-emitting panel.

In addition, by mixing a filler with a high refractive index or a light-scattering member into the resin, the efficiency of light extraction from the light-emitting element can be improved. For example, titanium oxide, barium oxide, zeolite, zirconium, or the like can be used.

There is no particular limitation on the structure of the transistors of the light-emitting panel. For example, a staggered transistor or an inverted staggered transistor may be used. Furthermore, the structure of the transistor may be either top-gate or bottom-gate. There is no particular limitation on a semiconductor material used for the transistors; for example, silicon, germanium, and the like can be given. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

Here, an oxide semiconductor is preferably used for semiconductor devices such as transistors used for pixels, driver circuits, touch sensors described later, or the like. It is particularly preferable to use an oxide semiconductor having a wider band gap than silicon. A semiconductor material having a wider band gap and a lower carrier density than silicon is preferably used because off-state current of the transistor can be reduced.

For example, the oxide semiconductor preferably contains at least at least indium (In) or zinc (Zn). Further preferably, it contains an oxide represented by an In-M-Zn-based oxide (M is a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which no grain boundary is observed between the adjacent crystal parts.

There is no grain boundary in such an oxide semiconductor: therefore, generation of a crack in an oxide semiconductor film which is caused by stress when a display panel is curved is suppressed. Therefore, such an oxide semiconductor can be favorably used for a display panel which has flexibility and is used in a curved state, or the like.

The use of such materials for the semiconductor layer makes it possible to realize a highly reliable transistor in which a change in the electrical characteristics is suppressed.

In addition, a transistor with an oxide semiconductor whose band gap is wider than that of silicon enables electric charge stored in a capacitor that is series-connected to the transistor to be held for a long time, owing to a low off-state current of the transistor. When such a transistor is used for a pixel, a driver circuit can be stopped while a gray scale of an image displayed in each display region is maintained. As a result, an electronic device with an extremely low power consumption can be realized.

For stable characteristics of the transistor or the like, a base film is preferably provided. The base film can be formed with an inorganic insulating film such as a silicon oxide film, a silicon nitride film, a silicon oxynitride film, or a silicon nitride oxide film to have a single-layer structure or a stacked-layer structure. The base film can be formed using a sputtering method, a CVD (Chemical Vapor Deposition) method (e.g., a plasma CVD method, a thermal CVD method, or an MOCVD (Metal Organic CVD) method), an ALD (Atomic Layer Deposition) method, a coating method, a printing method, or the like. Note that the base film is not necessarily provided when not needed. In each of the above structure examples, the insulating layer 813 can serve also as a base film of the transistor.

As the light-emitting element, an element capable of self-emission can be used, and an element whose luminance is controlled by current or voltage is included in its category. For example, a light-emitting diode (LED), an organic EL element, an inorganic EL element, or the like can be used.

The light-emitting element may be top-emission, bottom-emission, or dual-emission. A conductive film that transmits visible light is used as the electrode on the side from which light is extracted. In addition, a conductive film that reflects visible light is preferably used as the electrode on the side from which light is not extracted.

The conductive film that transmits visible light can be formed using, for example, indium oxide, indium tin oxide (ITO: Indium Tin Oxide), indium zinc oxide, zinc oxide, zinc oxide to which gallium is added, or the like. Alternatively, a metal material such as gold, silver, platinum, magnesium, nickel, tungsten, chromium, molybdenum, iron, cobalt, copper, palladium, or titanium: an alloy containing any of these metal materials: a nitride of any of these metal materials (e.g., titanium nitride); or the like can be used when formed thin so as to have a light-transmitting property. Alternatively, a stacked film of any of the above materials can be used as the conductive layer. For example, a stacked film of ITO and an alloy of silver and magnesium or the like is preferably used, in which case conductivity can be increased. Alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. In addition, lanthanum, neodymium, germanium, or the like may be added to the above-described metal material or alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, palladium, and copper, or an alloy of silver and magnesium can be used for formation. An alloy containing silver and copper is preferable because of its high heat resistance. Moreover, when a metal film or a metal oxide film is stacked on an aluminum alloy film, oxidation of the aluminum alloy film can be suppressed. As materials for the metal film or the metal oxide film, titanium, titanium oxide, and the like can be given. Alternatively, the conductive film that transmits visible light and a film containing any of the above metal materials may be stacked. For example, a stacked film of silver and ITO, a stacked film of an alloy of silver and magnesium and ITO, or the like can be used.

The electrodes may each be formed using an evaporation method or a sputtering method. Alternatively, they can be formed using a discharging method such as an ink-jet method, a printing method such as a screen printing method, or a plating method.

When a voltage higher than the threshold voltage of the light-emitting element is applied between the lower electrode 831 and the upper electrode 835, holes are injected to the EL layer 833 from the anode side and electrons are injected from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include a layer containing a substance with a high hole-injection property, a substance with a high hole-transport property, a hole-blocking material, a substance with a high electron-transport property, a substance with a high electron-injection property, a substance with a bipolar property (a substance with a high electron-transport property and hole-transport property), or the like.

For the EL layer 833, either a low molecular compound or a high molecular compound can be used, and an inorganic compound may be contained. Each of the layers included in the EL layer 833 can be formed by a method such as an evaporation method (including a vacuum evaporation method), a transfer method, a printing method, an ink-jet method, a coating method, or the like.

In the case where a light-emitting element emitting white light is used as the light-emitting element 830, the EL layer 833 is preferably configured to contain two or more kinds of light-emitting substances. For example, light-emitting substances are selected so that light emitted from two or more light-emitting substances has the relationship of complementary colors to obtain white light emission. For example, it is preferable to contain two or more light-emitting substances emitting light of R (red), G (green), B (blue), Y (yellow), O (orange), and the like and light-emitting substances emitting light containing spectral components of two or more colors of R, G, and B. It is also preferable to employ the light-emitting element 830 emitting light with a spectrum having two or more peaks in the wavelength range of a visible light region (e.g., 350 nm to 750 nm). A material having a peak in the wavelength range of yellow with an emission spectrum including spectral components also in the wavelength ranges of green and red is preferable.

Further preferably, the EL layer 833 preferably has a structure in which a light-emitting layer containing a light-emitting material emitting light of one color and a light-emitting layer containing a light-emitting material emitting light of another color are stacked. For example, the plurality of light-emitting layers in the EL layer 833 may be stacked in contact with each other or may be stacked with a separation layer therebetween. For example, a structure in which the separation layer is provided between a fluorescent layer and a phosphorescent layer may be employed.

The separation layer can be provided, for example, to prevent energy transfer by the Dexter mechanism (particularly triplet energy transfer) from a phosphorescent material or the like in an excited state which is generated in the phosphorescent layer to a fluorescent material or the like in the fluorescent layer. The thickness of the separation layer may be approximately several nanometers. Specifically, it is more than or equal to 0.1 nm and less than or equal to 20 nm, more than or equal to 1 nm and less than or equal to 10 nm, or more than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in a light-emitting layer in contact with the separation layer. This facilitates the manufacture of the light-emitting element and reduces the drive voltage. For example, in the case where the phosphorescent layer contains a host material, an assist material, and the phosphorescent material (a guest material), the separation layer may be formed with the host material and the assist material. In other words, in the above-described structure, the separation layer includes a region not containing the phosphorescent material and the phosphorescent layer includes a region containing the phosphorescent material. Accordingly, the separation layer and the phosphorescent layer can be evaporated separately depending on whether the phosphorescent material is present or not. With such a structure, the separation layer and the phosphorescent layer can be formed in the same chamber. Thus, the manufacturing cost can be reduced.

The light-emitting element 830 may be a single element including one EL layer or a tandem element in which a plurality of EL layers are stacked with a charge generation layer therebetween.

The light-emitting element is preferably provided between a pair of insulating films with low water permeability. Thus, the entry of an impurity such as water into the light-emitting element can be suppressed, leading to suppression of a decrease in the reliability of the light-emitting device.

As insulating films with low water permeability, a film containing nitrogen and silicon such as a silicon nitride film or a silicon nitride oxide film, a film containing nitrogen and aluminum such as an aluminum nitride film, and the like can be given. Alternatively, a silicon oxide film, a silicon oxynitride film, an aluminum oxide film, or the like can be used.

For example, the water vapor permeation amount of the insulating film with low water permeability is less than or equal to $1\times10^{-5}$ [g/(m$^2$·day)], preferably less than or equal to $1\times10^{-6}$ [g/(m$^2$·day)], further preferably less than or equal to $1\times10^{-7}$ [g/(m$^2$·day)], still further preferably less than or equal to $1\times10^{-8}$ [g/(m$^2$·day)].

An insulating film with low water permeability is preferably used for the insulating layer 813 and the insulating layer 843.

As the insulating layer 815, for example, an inorganic insulating film such as a silicon oxide film, a silicon oxynitride film, or an aluminum oxide film can be used. For example, as each of the insulating layer 817, the insulating layer 817a, and the insulating layer 817b, an organic material such as polyimide, acrylic, polyamide, polyimide amide, or a benzocyclobutene-based resin can be used. Alternatively, a low-dielectric constant material (a low-k material) or the like can be used. Furthermore, each of the insulating layers may be formed by stacking a plurality of insulating films.

The insulating layer 821 is formed using an organic insulating material or an inorganic insulating material. As the resin, for example, a polyimide resin, a polyamide resin, an acrylic resin, a siloxane resin, an epoxy resin, a phenol resin, or the like can be used. It is particularly preferable that the insulating layer 821 be formed using a photosensitive resin material so that a sidewall thereof has an inclined surface with curvature.

There is no particular limitation on the method for forming the insulating layer 821: a photolithography method, a sputtering method, an evaporation method, a droplet discharging method (e.g., an ink-jet method), a printing method (e.g., screen printing or off-set printing), or the like may be used.

The spacer 827 can be formed using an inorganic insulating material, an organic insulating material, a metal material, or the like. As the inorganic insulating material and the organic insulating material, for example, a variety of materials that can be used for the insulating layer can be used. As the metal material, titanium, aluminum, or the like can be used. With a structure in which the spacer 827 containing a conductive material and the upper electrode 835 are electrically connected to each other, a potential drop due to the resistance of the upper electrode 835 can be suppressed. The spacer 827 may also have either a tapered shape or an inverse tapered shape.

A conductive layer used in the light-emitting panel, which functions as an electrode or a wiring of the transistor, an auxiliary electrode of the light-emitting element, or the like, can be formed to have a single-layer structure or a stacked-layer structure using a metal material such as molybdenum, titanium, chromium, tantalum, tungsten, aluminum, copper, neodymium, or scandium, or an alloy material containing these elements, for example. Alternatively, the conductive layer may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an ink-jet method, an etching method using a photolithography method, or the like.

The light-blocking layer is provided between the adjacent coloring layers. The light-blocking layer blocks light from an adjacent light-emitting element to suppress color mixture between adjacent light-emitting elements. Here, the coloring layer is provided such that its end portion overlaps with the light-blocking layer, whereby light leakage can be suppressed. As the light-blocking layer, a material that blocks light from the light-emitting element can be used; for example, a black matrix may be formed using a metal material or a resin material containing a pigment or a dye. Note that it is preferable to provide the light-blocking layer in a region other than the light-emitting portion, such as a driver circuit portion, in which case undesired leakage of guided light or the like can be suppressed.

Furthermore, an overcoat covering the coloring layer and the light-blocking layer may be provided. By providing the overcoat, impurities and the like contained in the coloring layer can be prevented from being diffused into the light-emitting element. The overcoat is formed with a material that transmits light emitted from the light-emitting element: for example, an inorganic insulating film such as a silicon nitride film or a silicon oxide film, an organic insulating film such as an acrylic film or a polyimide film can be used, and a stacked-layer structure of an organic insulating film and an inorganic insulating film may be used.

In addition, in the case where a material of the sealing layer is applied onto the coloring layer and the light-blocking layer, a material that has high wettability with respect to the material of the sealing layer is preferably used as the material of the overcoat. For example, an oxide conductive film such as an ITO film or a metal film such as an Ag film that is thin enough to have a light-transmitting property is preferably used as the overcoat.

For the connector, it is possible to use a paste-like or sheet-like material which is obtained by mixing metal particles into a thermosetting resin and for which anisotropic electric conductivity is provided by thermocompression bonding. As the metal particles, particles in which two or more kinds of metals are layered, for example, nickel particles coated with gold are preferably used. Alternatively, a particulate resin whose surface is coated with a metal is preferably used.

Manufacturing Method Example

Figure 19A:
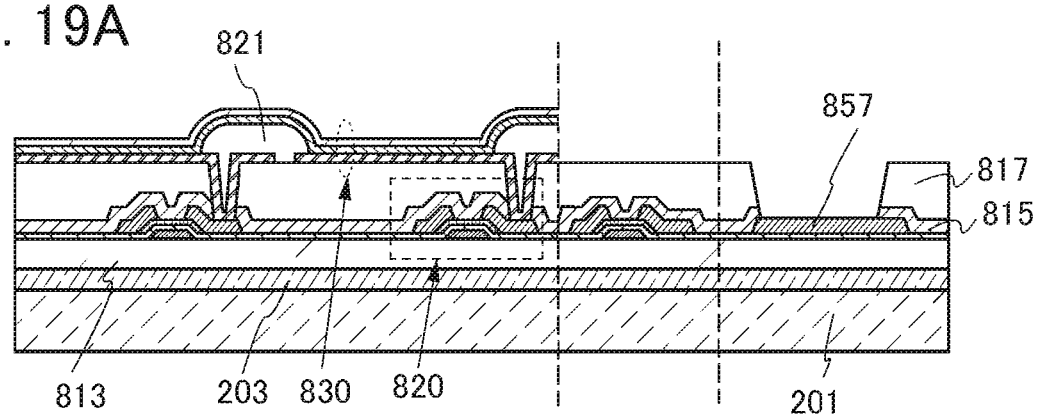
FIGS. 19A-C Diagrams illustrating an example of a method for manufacturing a light-emitting panel according to an embodiment.
Figure 19B:
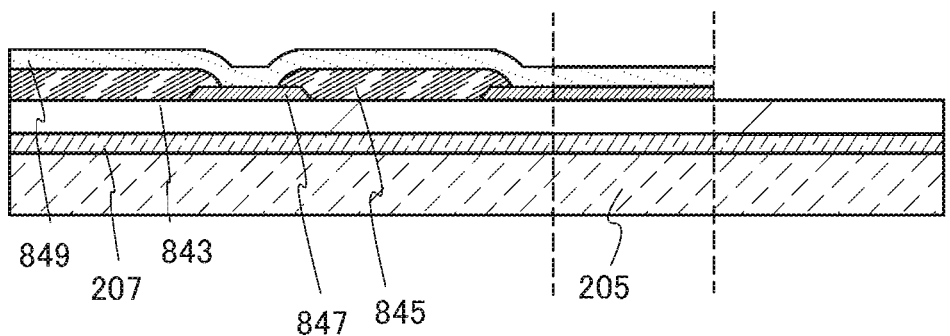

Next, a method for manufacturing a light-emitting panel is exemplified with reference to FIG. 19 and FIG. 20. Here, description is made using the light-emitting panel having the structure in the specific example 1 (FIG. 18(C)) as an example.

First, a separation layer 203 is formed over a formation substrate 201, and the insulating layer 813 is formed over the separation layer 203. Next, the plurality of transistors, the conductive layer 857, the insulating layer 815, the insulating layer 817, the plurality of light-emitting elements, and the insulating layer 821 are formed over the insulating layer 813. Note that an opening is formed in the insulating layer 821, the insulating layer 817, and the insulating layer 815 to expose the conductive layer 857 (FIG. 19(A)).

In addition, a separation layer 207 is formed over a formation substrate 205, and the insulating layer 843 is formed over the separation layer 207. Next, the light-blocking layer 847, the coloring layer 845, and the overcoat 849 are formed over the insulating layer 843 (FIG. 19(B)).

As each of the formation substrate 201 and the formation substrate 205, a glass substrate, a quartz substrate, a sapphire substrate, a ceramic substrate, a metal substrate, or the like can be used.

In addition, for the glass substrate, for example, a glass material such as aluminosilicate glass, aluminoborosilicate glass, or barium borosilicate glass can be used. In the case where the temperature of the later heat treatment is high, the one having a strain point of 730° C. or higher is preferably used. Note that by containing a large amount of barium oxide (BaO), glass which is heat-resistant and more practical can be obtained. Alternatively, crystallized glass or the like may be used.

In the case where a glass substrate is used as the formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

Each of the separation layer 203 and the separation layer 207 is a single layer or a stacked layer containing an element selected from tungsten, molybdenum, titanium, tantalum, niobium, nickel, cobalt, zirconium, zinc, ruthenium, rhodium, palladium, osmium, iridium, and silicon: an alloy material containing the element; or a compound material containing the element. A crystal structure of a layer containing silicon may be amorphous, microcrystal, or polycrystal.

The separation layer can be formed by a sputtering method, a plasma CVD method, a coating method, a printing method, or the like. Note that a coating method includes a spin coating method, a droplet discharging method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds to an alloy of tungsten and molybdenum, for example.

In the case where the separation layer is formed to have a stacked-layer structure including a layer containing tungsten and a layer containing an oxide of tungsten, the layer containing an oxide of tungsten may be utilized which is formed at the interface between a tungsten layer and an insulating film by forming the layer containing tungsten first and forming an insulating film formed of an oxide thereover. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. In addition, plasma treatment or heat treatment may be performed in an atmosphere of oxygen, nitrogen, or nitrous oxide alone, or a mixed gas of the gas and another gas. Surface condition of the separation layer is changed by the plasma treatment or heat treatment, whereby adhesion between the separation layer and the insulating film formed later can be controlled.

Each of the insulating layers can be formed using a sputtering method, a plasma CVD method, a coating method, a printing method, or the like, and can be a dense film with very low water permeability when formed at a deposition temperature higher than or equal to 250° C. and lower than or equal to 400° C. by a plasma CVD method, for example.

Figure 19C:
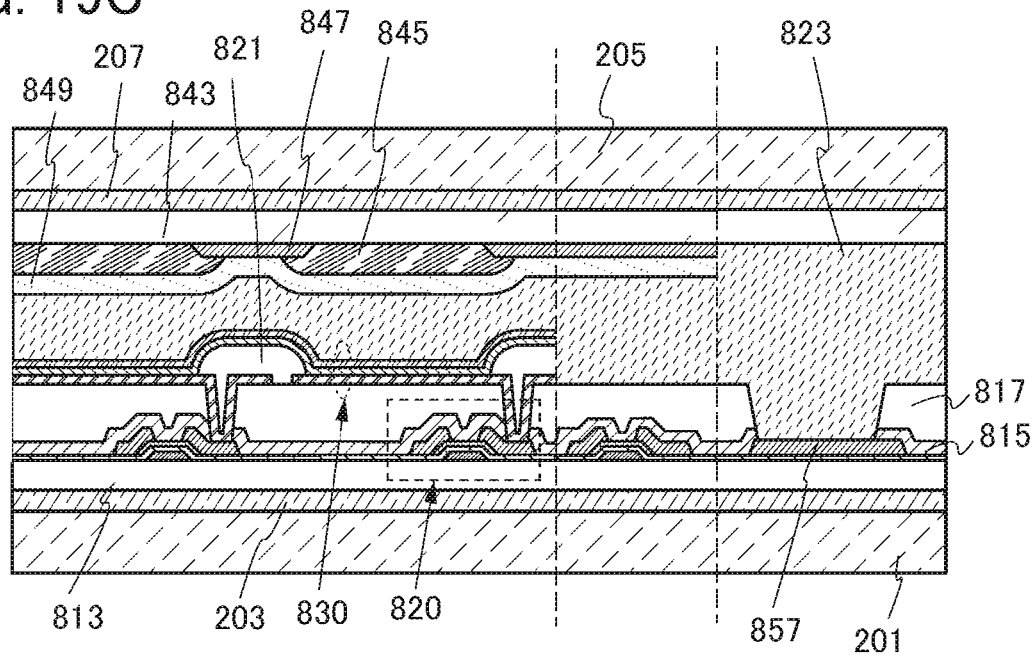
Figure 20A:
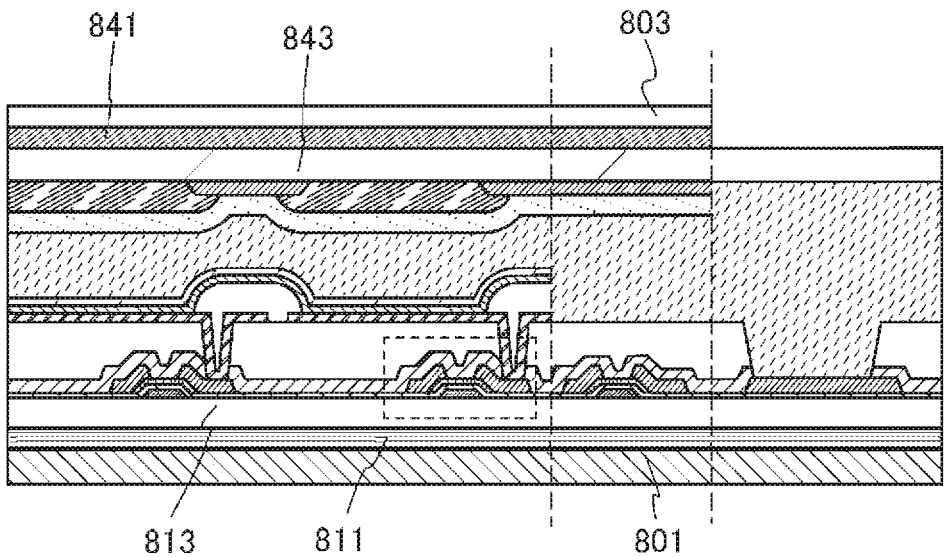
FIGS. 20A-C Diagrams illustrating an example of a method for manufacturing a light-emitting panel according to an embodiment.

Then, a material for the sealing layer 823 is applied to a surface of the formation substrate 205 over which the coloring layer 845 and the like are provided or a surface of the formation substrate 201 over which the light-emitting element 230 and the like are provided, and the formation substrate 201 and the formation substrate 205 are bonded so that these surfaces face each other with the sealing layer 823 therebetween (FIG. 19(C)).

Next, the formation substrate 201 is separated, and the exposed insulating layer 813 and the substrate 801 are bonded to each other with the adhesive layer 811. Furthermore, the formation substrate 205 is separated, and the exposed insulating layer 843 and the substrate 803 are bonded to each other with the adhesive layer 841. Although a structure in which the substrate 803 does not overlap with the conductive layer 857 is in FIG. 20(A), the conductive layer 857 and the substrate 803 may overlap with each other.

Note that a variety of methods can be used as appropriate for the separation process. For example, in the case where a layer including a metal oxide film is formed as the separation layer on the side in contact with the layer to be separated, the metal oxide film is embrittled by crystallization, whereby the layer to be separated can be separated from the formation substrate. Alternatively, in the case where an amorphous silicon film containing hydrogen is formed as the separation layer between a formation substrate having high heat resistance and a layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as $NF_3$, $BrF_3$, or $ClF_3$, the separation can be performed at the embrittled metal oxide film. Further alternatively, a method may be employed in which a film containing nitrogen, oxygen, hydrogen, or the like (e.g., an amorphous silicon film containing hydrogen, an alloy film containing hydrogen, or an alloy film containing oxygen) is used as the separation layer, and the separation layer is irradiated with laser light to release the nitrogen, oxygen, or hydrogen contained in the separation layer as gas, thereby promoting separation between the layer to be separated and the substrate. Still further alternatively, it is possible to use a method or the like in which the formation substrate where the layer to be separated is formed is removed mechanically or removed by etching using a solution or a fluoride gas such as $NF_3$, $BrF_3$, or $ClF_3$, or the like. In this case, the separation layer is not necessarily provided.

In addition, when a plurality of the above-described separation methods are combined, the separation process can be performed more easily. In other words, separation can be performed with physical force (by a machine or the like) after performing laser light irradiation, etching on the separation layer with a gas, a solution, or the like, or mechanical removal with a sharp knife, scalpel or the like so that the separation layer and the layer to be separated are brought into an easily separable state.

Alternatively, the layer to be separated may be separated from the formation substrate by soaking the interface between the separation layer and the layer to be separated with a liquid. Furthermore, the separation may be performed while a liquid such as water is being poured at the time of separation.

As another separation method, in the case where the separation layer is formed using tungsten, it is preferable that the separation be performed while etching the separation layer using a mixed solution of ammonia water and a hydrogen peroxide solution.

Note that the separation layer is not necessarily provided in the case where separation at an interface between the formation substrate and the layer to be separated is possible. For example, glass is used as the formation substrate, an organic resin such as polyimide, polyester, polyolefin, polyamide, polycarbonate, or acrylic is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed by providing the metal layer between the formation substrate and the organic resin and heating the metal layer by making current to flow in the metal layer.

Figure 20B:
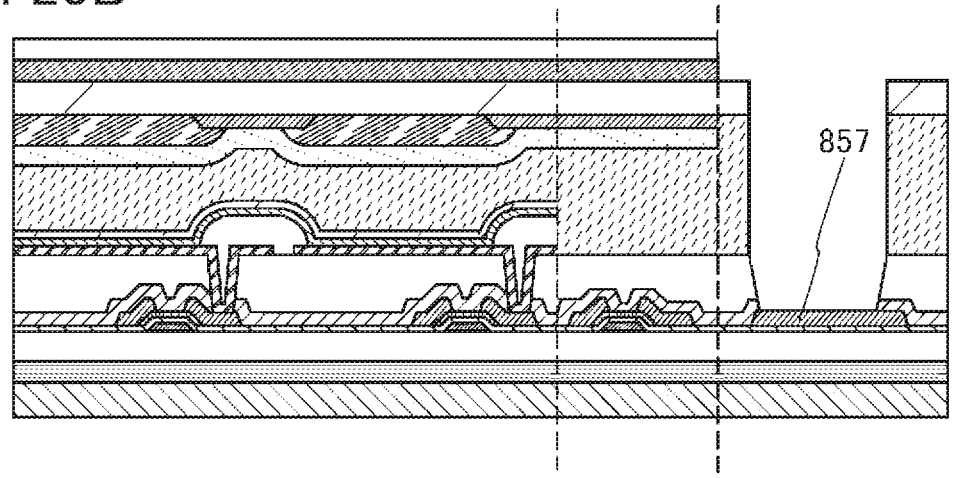
Figure 20C:
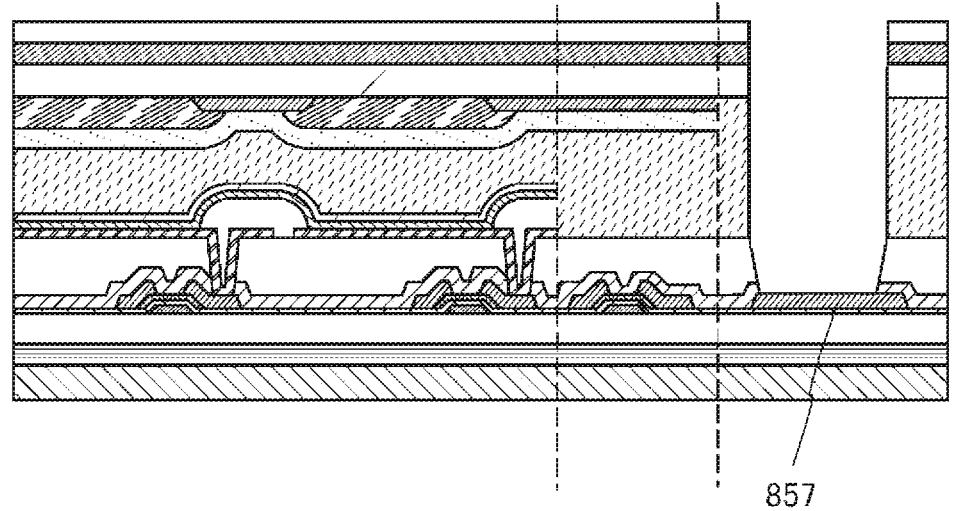

Lastly, an opening is formed in the insulating layer 843 and the sealing layer 823 to expose the conductive layer 857 (FIG. 20(B)). Note that in the case of the structure where the substrate 803 overlaps with the conductive layer 857, the opening is formed also in the substrate 803 and the adhesive layer 841 so that the conductive layer 857 is exposed (FIG. 20(C)). There is no particular limitation on the method for forming the opening. For example, a laser ablation method, an etching method, an ion beam sputtering method, or the like may be used. Alternatively, a cut may be made in a film over the conductive layer 857 with a sharp knife or the like and part of the film may be separated by physical force.

In the above-described manner, the light-emitting panel can be manufactured.

At least part of this embodiment can be implemented in combination with another embodiment described in this specification as appropriate.

Embodiment 5

In this embodiment, structure examples of a foldable touch panel that is applicable to a display panel included in the display device in one embodiment of the present invention will be described with reference to FIG. 21 to FIG. 24. Note that for a material which can be used for each layer, Embodiment 4 can be referred to.

Structure Example 1

Figure 21A:
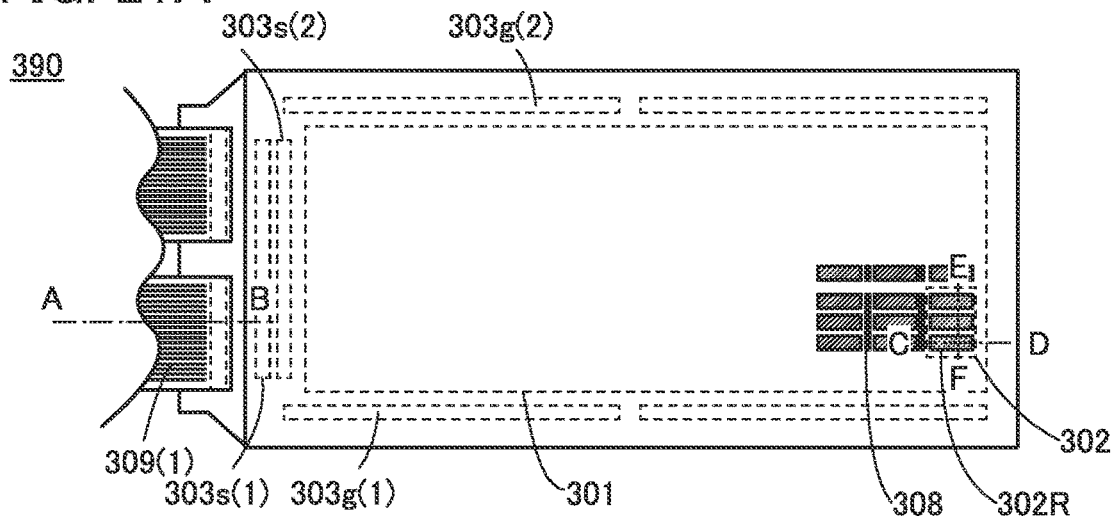
FIGS. 21A-C Diagrams illustrating an example of a touch panel according to an embodiment.
Figure 21B:
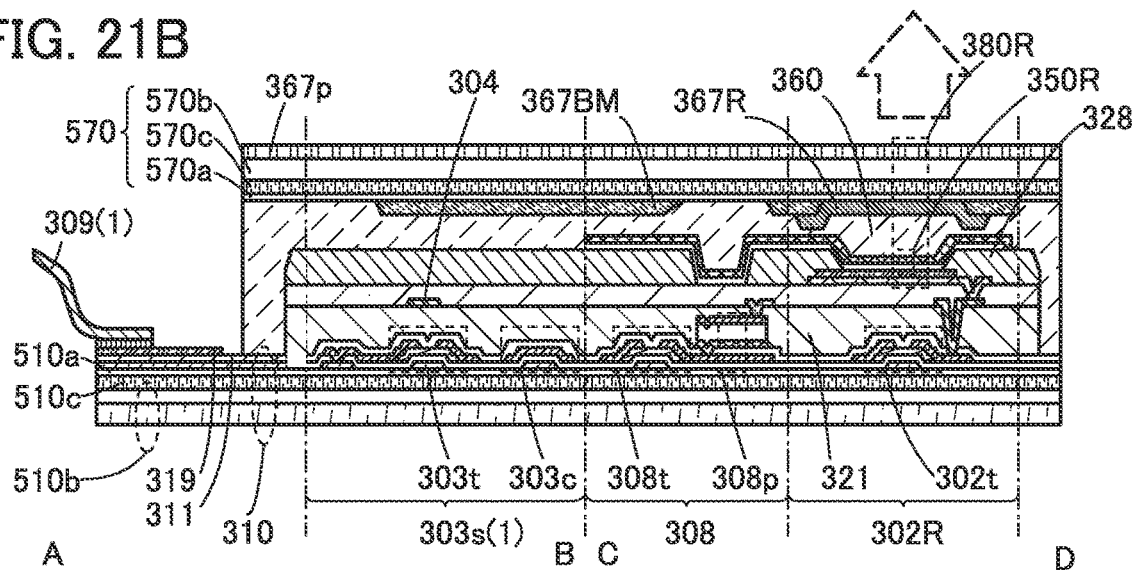
Figure 21C:
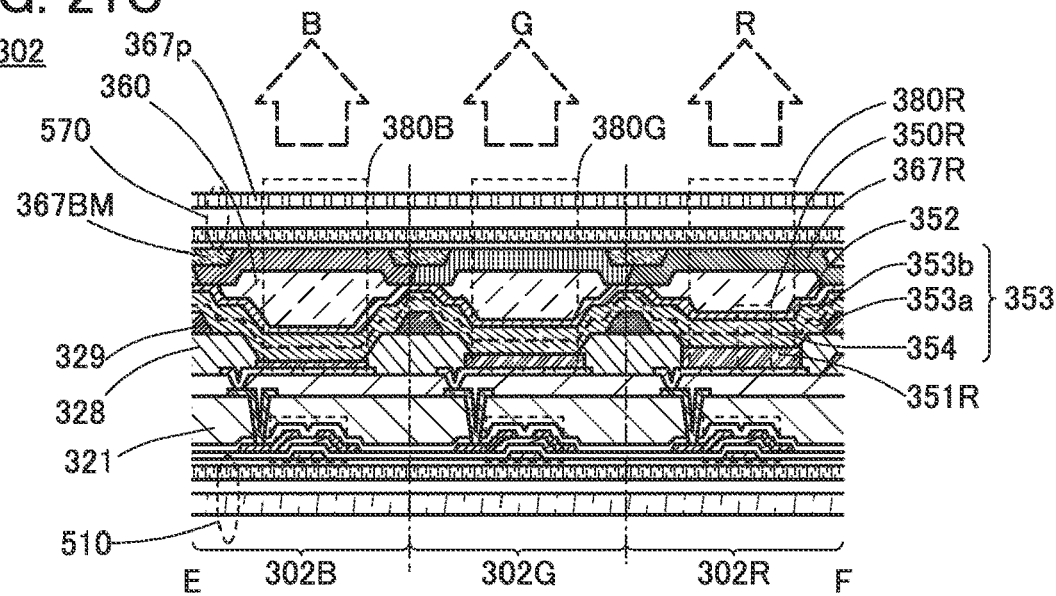

FIG. 21(A) is a top view of the touch panel. FIG. 21(B) is a cross-sectional view along dashed-dotted line A-B and dashed-dotted line C-D in FIG. 21(A). FIG. 21(C) is a cross-sectional view along dashed-dotted line E-F in FIG. 21(A).

As illustrated in FIG. 21(A), a touch panel 390 includes a display portion 301.

The display portion 301 includes a plurality of pixels 302 and a plurality of imaging pixels 308. The imaging pixels 308 can detect a touch of a finger or the like on the display portion 301. Thus, a touch sensor can be formed using the imaging pixels 308.

The pixels 302 are provided with a plurality of sub-pixels (e.g., a sub-pixel 302R). The sub-pixels are provided with light-emitting elements and pixel circuits that can supply electric power for driving the light-emitting elements are provided.

The pixel circuits are electrically connected to wirings through which selection signals can be supplied and wirings through which image signals can be supplied.

Furthermore, the touch panel 390 is provided with a scan line driver circuit 303g(1) that can supply selection signals to the pixels 302 and an image signal line driver circuit 303s(1) that can supply image signals to the pixels 302.

The imaging pixels 308 are provided with photoelectric conversion elements and imaging pixel circuits that drive the photoelectric conversion elements.

The imaging pixel circuits are electrically connected to wirings through which control signals can be supplied and wirings through which power supply potentials can be supplied.

As the control signals, a signal capable of selecting an imaging pixel circuit from which a recorded imaging signal is read, a signal capable of initializing an imaging pixel circuit, a signal capable of determining the time it takes for an imaging pixel circuit to detect light, and the like can be given.

The touch panel 390 is provided with an imaging pixel driver circuit 303g(2) that can supply control signals to the imaging pixels 308 and an imaging signal line driver circuit 303s(2) that reads out imaging signals.

As illustrated in FIG. 21(B), the touch panel 390 includes a substrate 510 and a substrate 570 that faces the substrate 510.

A material having flexibility can be favorably used for the substrate 510 and the substrate 570.

A material with which passage of impurities is suppressed can be favorably used for the substrate 510 and the substrate 570. For example, a material with a water vapor permeability of less than or equal to $10^{-5}$ g/(m²·day), preferably less than or equal to $10^{-6}$ g/(m²·day) can be favorably used.

For the substrate 510 and the substrate 570, materials whose coefficients of linear expansion are substantially equal can be favorably used. For example, materials whose coefficients of linear expansion are less than or equal to $1 \times 10^{-3}$/K, preferably less than or equal to $5 \times 10^{-5}$/K, and further preferably less than or equal to $1 \times 10^{-5}$/K can be favorably used.

The substrate 510 is a stacked body including a flexible substrate 510b, an insulating layer 510a that prevents diffusion of impurities into the light-emitting elements, and an adhesive layer 510c that bonds the flexible substrate 510b and the insulating layer 510a to each other.

The substrate 570 is a stacked body including a flexible substrate 570b, an insulating layer 570a that prevents diffusion of impurities into the light-emitting elements, and an adhesive layer 570c that bonds the flexible substrate 570b and the insulating layer 570a to each other. For example, a material that includes polyester, polyolefin, polyamide (e.g., nylon, aramid), polyimide, polycarbonate, or a resin having an acrylic, urethane, epoxy, or siloxane bond can be used for the adhesive layer.

A sealing layer 560 bonds the substrate 570 and the substrate 510 to each other. The sealing layer 560 has a refractive index higher than that of air. In addition, in the case where light is extracted through the sealing layer 560, the sealing layer 560 also serves as a layer (hereinafter also referred to as an optical bonding layer) that optically bonds two members (here, the substrate 570 and the substrate 510) between which the sealing layer 560 is sandwiched. The pixel circuits and the light-emitting elements (e.g., a light-emitting element 350R) are provided between the substrate 510 and the substrate 570.

The pixel 302 includes the sub-pixel 302R, a sub-pixel 302G, and a sub-pixel 302B (FIG. 21(C)). In addition, the sub-pixel 302R is provided with a light-emitting module 380R, the sub-pixel 302G is provided with a light-emitting module 380G, and the sub-pixel 302B is provided with a light-emitting module 380B.

For example, the sub-pixel 302R is provided with the first light-emitting element 350R and the pixel circuit that can supply electric power to the first light-emitting element 350R and includes a transistor 302t (FIG. 21(B)). Furthermore, the light-emitting module 380R is provided with the first light-emitting element 350R and an optical element (e.g., a coloring layer 367R). The light-emitting element 350R includes a first lower electrode 351R, an upper electrode 352, and an EL layer 353 between the lower electrode 351R and the upper electrode 352 (FIG. 21(C)).

The EL layer 353 is provided with a first EL layer 353a, a second EL layer 353b, and an intermediate layer 354 between the first EL layer 353a and the second EL layer 353b.

The light-emitting module 380R includes the first coloring layer 367R on the substrate 570. The coloring layer transmits light of a particular wavelength, and for example, the one that selectively transmits light of red, green, blue, or the like can be used. Alternatively, a region that transmits light emitted from the light-emitting element as it is may be provided.

The light-emitting module 380R, for example, includes the sealing layer 360 that is in contact with the first light-emitting element 350R and the first coloring layer 367R.

The first coloring layer 367R is located to overlap with the first light-emitting element 350R. Accordingly, part of light emitted from the light-emitting element 350R passes through the sealing layer 360 that serves also as an optical bonding layer and through the first coloring layer 367R and is emitted to the outside of the light-emitting module 380R as indicated by arrows in drawings.

The touch panel 390 includes a light-blocking layer 367BM on the substrate 570. The light-blocking layer 367BM is provided so as to surround the coloring layer (e.g., the first coloring layer 367R).

The touch panel 390 is provided with an anti-reflective layer 367p located to overlap with the display portion 301. As the anti-reflective layer 367p, a circular polarizing plate can be used, for example.

The touch panel 390 is provided with an insulating layer 321. The insulating layer 321 covers the transistor 302t. Note that the insulating layer 321 can be used as a layer for planarizing unevenness caused by the pixel circuits. In addition, an insulating layer on which a layer that can suppress the diffusion of impurities into the transistor 302t and the like is stacked can be used as the insulating layer 321.

The touch panel 390 includes the light-emitting elements (e.g., the first light-emitting element 350R) over the insulating layer 321.

The touch panel 390 includes, over the insulating layer 321, a partition 328 that overlaps with an end portion of the first lower electrode 351R. In addition, a spacer 329 that controls the distance between the substrate 510 and the substrate 570 is provided over the partition 328.

The image signal line driver circuit 303s(1) includes a transistor 303t and a capacitor 303c. Note that the driver circuit and the pixel circuits can be formed in the same process over the same substrate. As illustrated in FIG. 21(B), the transistor 303t may include a second gate 304 over the insulating layer 321. The second gate 304 may be electrically connected to a gate of the transistor 303t. Alternatively, different potentials may be supplied thereto. In addition, the second gate 304 may be provided in a transistor 308t, the transistor 302t, or the like if necessary.

The imaging pixel 308 is provided with a photoelectric conversion element 308p and an imaging pixel circuit for detecting light with which the photoelectric conversion element 308p is irradiated. In addition, the imaging pixel circuit includes the transistor 308t.

For example, a pin photodiode can be used as the photoelectric conversion element 308p.

The touch panel 390 is provided with a wiring 311 through which a signal can be supplied. The wiring 311 is provided with a terminal 319. Note that an FPC 309(1) through which signals such as an image signal and a synchronization signal can be supplied is electrically connected to the terminal 319. Note that a printed wiring board (PWB) may be attached to the FPC 309(1).

Transistors formed in the same process can be used as transistors such as the transistor 302t, the transistor 303t, and the transistor 308t.

As a material that can be used for a gate, a source, and a drain of a transistor, and a variety of wirings and electrodes included in a touch panel, a single-layer structure or a stacked-layer structure using a metal such as aluminum, titanium, chromium, nickel, copper, yttrium, zirconium, molybdenum, silver, tantalum, or tungsten, or an alloy containing the same as its main component is used. Examples include a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film stacked over the titanium film or the titanium nitride film, and a titanium film or a titanium nitride film thereover are formed, a three-layer structure in which a molybdenum film or a molybdenum nitride film, an aluminum film or a copper film stacked over the molybdenum film or the molybdenum nitride film, and a molybdenum film or a molybdenum nitride film thereover are formed, and the like. Note that a transparent conductive material containing indium oxide, tin oxide, or zinc oxide may be used. In addition, copper containing manganese is preferable because controllability of a shape by etching is increased.

Structure Example 2

Figure 22A:
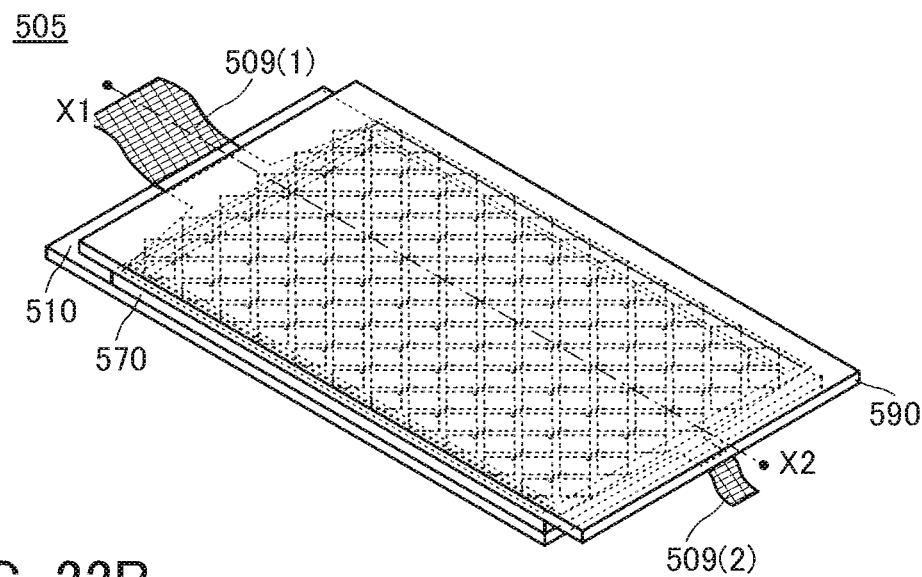
FIGS. 22A-B Diagrams illustrating an example of a touch panel according to an embodiment.

FIGS. 22(A) and (B) are perspective views of a touch panel 505. Note that main components are illustrated for clarity. FIG. 23 is cross-sectional views along dashed-dotted line X1-X2 illustrated in FIG. 22(A).

Figure 22B:
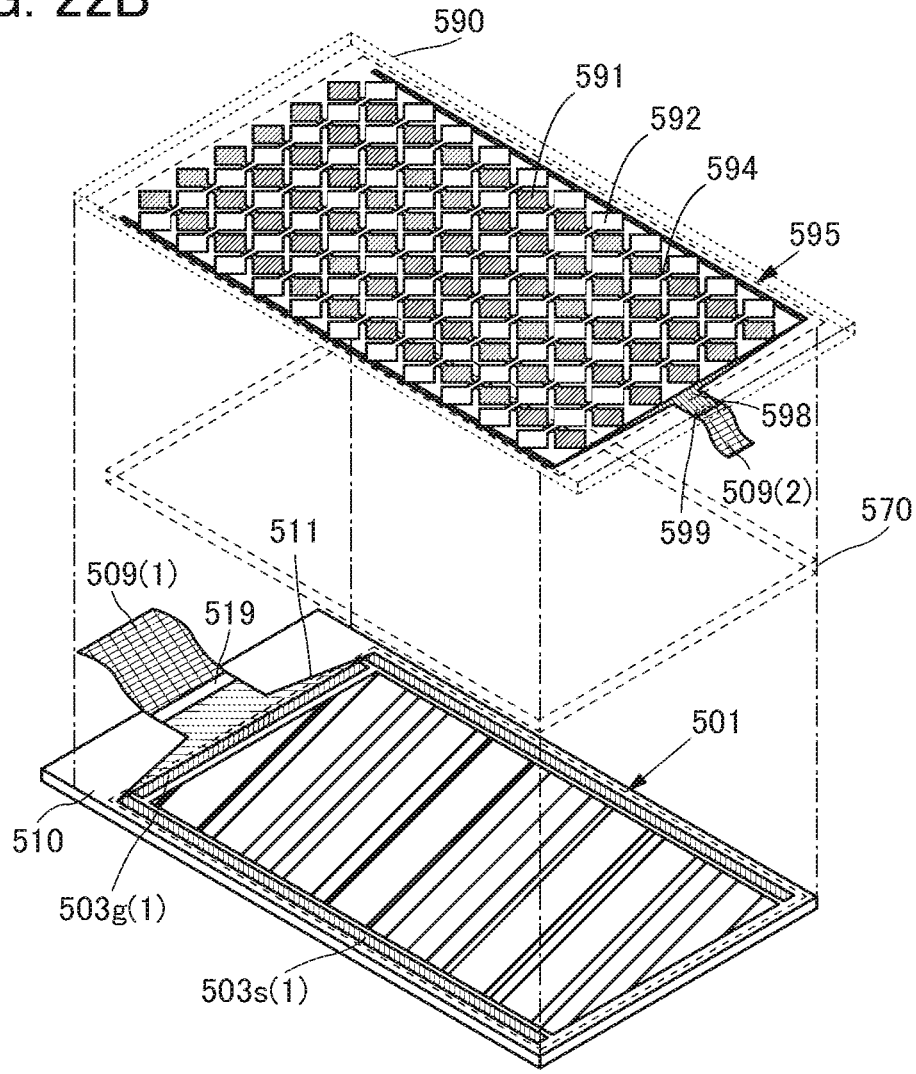

The touch panel 505 includes a display portion 501 and a touch sensor 595 (FIG. 22(B)). Furthermore, the touch panel 505 includes the substrate 510, the substrate 570, and a substrate 590. Note that the substrate 510, the substrate 570), and the substrate 590 each have flexibility.

The display portion 501 includes the substrate 510, a plurality of pixels over the substrate 510, and a plurality of wirings 511 through which signals can be supplied to the pixels. The plurality of wirings 511 are led to a peripheral portion of the substrate 510, and portions thereof form a terminal 519. The terminal 519 is electrically connected to an FPC 509(1).

The substrate 590 is provided with the touch sensor 595 and a plurality of wirings 598 electrically connected to the touch sensor 595. The plurality of wirings 598 are led to a peripheral portion of the substrate 590, and portions thereof form a terminal. The terminal is electrically connected to an FPC 509(2). Note that in FIG. 22(B), electrodes, wirings, and the like of the touch sensor 595 provided on the back surface side of the substrate 590) (on the substrate 510 side) are indicated by solid lines for clarity.

As the touch sensor 595, a capacitive touch sensor can be used, for example. Examples of the capacitive type include a surface capacitive type and a projected capacitive type.

Examples of the projected capacitive type are a self-capacitive type and a mutual capacitive type, which differ mainly in the driving method. The use of the mutual capacitive type is preferable because multiple points can be detected simultaneously.

A case of using a projected capacitive touch sensor will be described below with reference to FIG. 22(B).

Note that a variety of sensors that can detect the approach or contact of a detection target such as a finger can be used.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrilaterals placed in one direction with one corner of a quadrilateral connected to one corner of another quadrilateral as illustrated in FIGS. 22(A) and (B).

The electrodes 591 each have a quadrilateral shape and are placed in a direction intersecting with the direction in which the electrodes 592 extend.

A wiring 594 electrically connects two electrodes 591 between which one electrode 592 is sandwiched. At this time, a shape where the intersecting area of the electrode 592 and the wiring 594 is as small as possible is preferable. This allows a reduction in the area of a region where the electrodes are not provided, reducing unevenness in transmittance. As a result, unevenness in luminance of light transmitted through the touch sensor 595 can be reduced.

Note that the shapes of the electrodes 591 and the electrodes 592 are not limited thereto and can be a variety of shapes. For example, the plurality of electrodes 591 may be placed so that spaces therebetween are reduced as much as possible, and a plurality of electrodes 592 may be provided with an insulating layer therebetween and may be spaced apart from each other to form a region not overlapping with the electrodes 591. At this time, between two adjacent electrodes 592, a dummy electrode that is electrically insulated from these is preferably provided, whereby the area of a region having a different transmittance can be reduced.

The touch sensor 595 is provided with the substrate 590, the electrodes 591 and the electrodes 592 provided in a staggered arrangement over the substrate 590, an insulating layer 593 covering the electrodes 591 and the electrodes 592, and the wiring 594 that electrically connects the adjacent electrodes 591 to each other.

An adhesive layer 597 bonds the substrate 590 to the substrate 570 so that the touch sensor 595 overlaps with the display portion 501.

The electrodes 591 and the electrodes 592 are formed using a light-transmitting conductive material. As the light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film including graphene oxide formed in the form of a film. As a reducing method, a method with application of heat or the like can be given.

The electrodes 591 and the electrodes 592 may each have a mesh shape such that mesh openings and light-emitting elements overlap with each other. At this time, a material such as a metal or an alloy with low conductivity can be used for the electrodes 591 and the electrodes 592.

Note that as a material which can be used for the conductive films such as the electrodes 591 and the electrodes 592, that is, a material which can be used for wirings and electrodes forming the touch panel, a low-resistance one is desirable. For example, silver, copper, aluminum, a carbon nanotube, graphene, a metal halide (such as a silver halide), or the like may be used. Furthermore, a metal nanowire formed using a number of conductors with an extremely small width (for example, a diameter of several nanometers) may be used. Alternatively, a net-like metal mesh with a conductor may be used. For example, an Ag nanowire, a Cu nanowire, an Al nanowire, an Ag mesh, a Cu mesh, an Al mesh, or the like may be used. In the case of an Ag nanowire, a light transmittance of 89% or more and a sheet resistance of 40 Ω/square or more and 100 Ω/square or less can be achieved. Note that because of having high transmittance, a metal nanowire, a metal mesh, a carbon nanotube, graphene, or the like may be used as an electrode used in the display element, such as a pixel electrode or a common electrode.

The electrodes 591 and the electrodes 592 can be formed by depositing a light-transmitting conductive material over the substrate 590 by a sputtering method and then removing an unnecessary portion by any of various patterning techniques such as a photolithography method.

As a material that is used for the insulating layer 593, a resin such as acrylic or epoxy, a resin having a siloxane bond, or an inorganic insulating material such as silicon oxide, silicon oxynitride, or aluminum oxide can also be used.

Furthermore, openings reaching the electrodes 591 are provided in the insulating layer 593, and the wiring 594 electrically connects the adjacent electrodes 591. A light-transmitting conductive material can be favorably used for the wiring 594 because the aperture ratio of the touch panel can be increased. Moreover, a material with higher conductivity than those of the electrodes 591 and the electrodes 592 can be favorably used for the wiring 594 because electric resistance can be reduced.

One of the electrodes 592 extends in one direction, and a plurality of electrodes 592 are provided in the form of stripes.

The wiring 594 is provided so as to intersect with the electrodes 592.

A pair of electrodes 591 are provided with one of the electrodes 592 therebetween. The wiring 594 electrically connects the pair of electrodes 591.

Note that the plurality of electrodes 591 are not necessarily placed in the direction orthogonal to one electrode 592 and may be placed at an angle of less than 90 degrees.

One wiring 598 is electrically connected to the electrodes 591 or the electrodes 592. Part of the wiring 598 serves as a terminal. For the wiring 598, a metal material such as aluminum, gold, platinum, silver, nickel, titanium, tungsten, chromium, molybdenum, iron, cobalt, copper, or palladium or an alloy material containing the metal material can be used.

Note that an insulating layer that covers the insulating layer 593 and the wiring 594 may be provided to protect the touch sensor 595.

Furthermore, a connection layer 599 electrically connects the wiring 598 and the FPC 509(2) to each other.

As the connection layer 599, various anisotropic conductive films (ACF: Anisotropic Conductive Film), anisotropic conductive pastes (ACP: Anisotropic Conductive Paste), and the like can be used.

The adhesive layer 597 has a light-transmitting property. For example, a thermosetting resin or an ultraviolet curable resin can be used: specifically, a resin such as acrylic, urethane, epoxy, a resin having a siloxane bond, or the like can be used.

The display portion 501 is provided with a plurality of pixels placed in a matrix. The pixel is provided with a display element and a pixel circuit for driving the display element.

In this embodiment, a case of using an organic EL element that emits white light as a display element will be described; however, the display element is not limited thereto.

For example, organic EL elements that emit light of different colors may be used in sub-pixels so that the light of different colors can be emitted from the respective sub-pixels.

The substrate 510, the substrate 570, and the sealing layer 560 can have structures similar to those in the structure example 1.

A pixel includes a sub-pixel 502R, and the sub-pixel 502R includes a light-emitting module 580R.

The sub-pixel 502R includes a first light-emitting element 550R and a pixel circuit including a transistor 502t that can supply electric power to the first light-emitting element 550R. Furthermore, the light-emitting module 580R includes the first light-emitting element 550R and an optical element (e.g., a coloring layer 567R).

The light-emitting element 550R includes a lower electrode, an upper electrode, and an EL layer between the lower electrode and the upper electrode.

The light-emitting module 580R includes the first coloring layer 567R in the light extraction direction.

Furthermore, in the case where the sealing layer 560 is provided on the light extraction side, the sealing layer 560 is in contact with the first light-emitting element 550R and the first coloring layer 567R.

The first coloring layer 567R is positioned to overlap with the first light-emitting element 550R. Accordingly, part of light emitted from the light-emitting element 550R passes through the first coloring layer 567R and is emitted to the outside of the light-emitting module 580R in a direction of an arrow illustrated in the drawing.

The display portion 501 includes a light-blocking layer 567BM in the light emitting direction. The light-blocking layer 567BM is provided so as to surround the coloring layer (e.g., the first coloring layer 567R).

The display portion 501 includes an anti-reflective layer 567p located to overlap with pixels. As the anti-reflective layer 567p, a circular polarizing plate can be used, for example.

The display portion 501 includes an insulating film 521. The insulating film 521 covers the transistor 502t. Note that the insulating film 521 can be used as a layer for planarizing unevenness caused by the pixel circuits. A stacked film including a layer that can suppress the diffusion of impurities can be used as the insulating film 521. This can suppress a decrease in the reliability of the transistor 502t or the like by diffusion of impurities.

The display portion 501 includes the light-emitting elements (e.g., the first light-emitting element 550R) over the insulating film 521.

The display portion 501 includes, over the insulating film 521, a partition 528 that overlaps with an end portion of a first lower electrode. In addition, a spacer that controls the distance between the substrate 510 and the substrate 570 is included over the partition 528.

A scan line driver circuit 503g(1) includes a transistor 503t and a capacitor 503c. Note that the driver circuit and the pixel circuits can be formed in the same process over the same substrate.

The display portion 501 is provided with the wirings 511 through which signals can be supplied. The wirings 511 are provided with the terminal 519. Note that the FPC 509(1) through which signals such as an image signal and a synchronization signal can be supplied is electrically connected to the terminal 519.

Note that a printed wiring board (PWB) may be attached to the FPC 509(1).

The display portion 501 includes wirings such as scan lines, signal lines, and power supply lines. The variety of conductive films described above can be used as the wirings.

Note that a variety of transistors can be used in the display portion 501. A structure in the case of using bottom-gate transistors in the display portion 501 is illustrated in FIGS. 23(A) and (B).

Figure 23A:
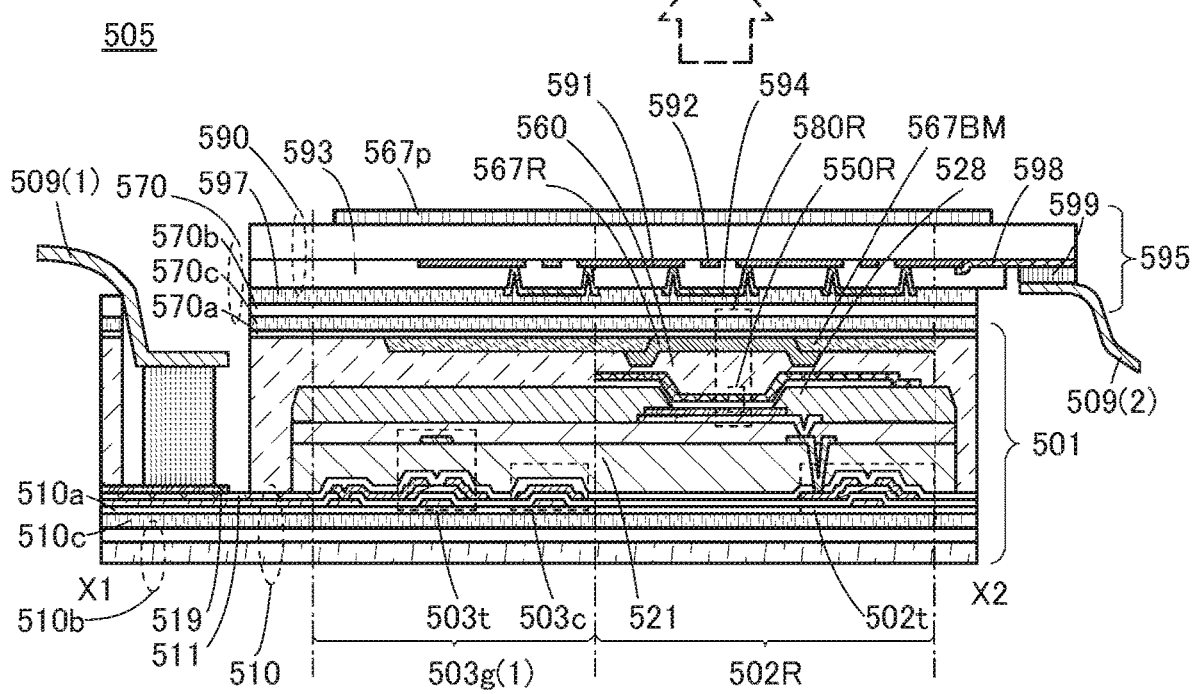
FIGS. 23A-C Diagrams illustrating an example of a touch panel according to an embodiment.
Figure 23B:
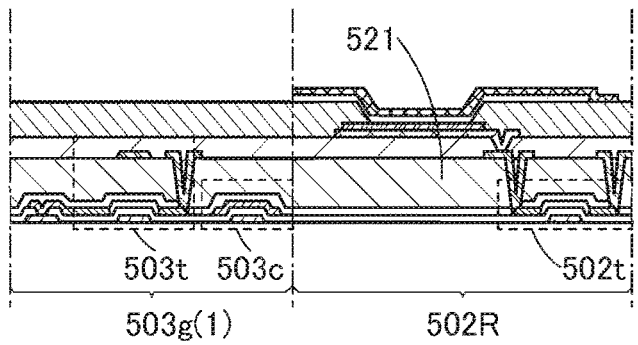

For example, a semiconductor layer containing an oxide semiconductor, amorphous silicon, or the like can be used in the transistor 502t and the transistor 503t illustrated in FIG. 23(A). For example, a semiconductor layer containing polycrystalline silicon that is obtained by crystallization process such as laser annealing can be used in the transistor 502t and the transistor 503t illustrated in FIG. 23(B).

Figure 23C:
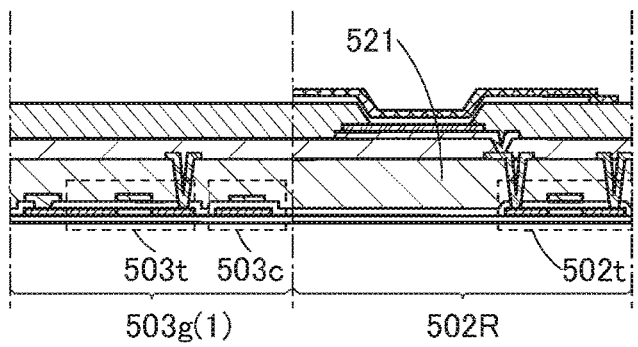

In addition, a structure in the case of using top-gate transistors in the display portion 501 is illustrated in FIG. 23(C).

For example, a semiconductor layer including polycrystalline silicon, a single crystal silicon film that is transferred from a single crystal silicon substrate, or the like can be used in the transistor 502t and the transistor 503t illustrated in FIG. 23(C).

Structure Example 3

FIG. 24 is cross-sectional views of a touch panel 505B. The touch panel 505B described in this embodiment is different from the touch panel 505 in the structure example 2 in being provided with the display portion 501 that displays supplied image data to the side where the transistors are provided and in being provided with the touch sensor on the substrate 510 side of the display portion. Different structures will be described in detail here, and the above description is referred to for portions that can use similar structures.

The first coloring layer 567R is located to overlap with the first light-emitting element 550R. In addition, the light-emitting element 550R illustrated in FIG. 24(A) emits light to the side where the transistor 502t is provided. Accordingly, part of light emitted from the light-emitting element 550R passes through the first coloring layer 567R and is emitted to the outside of the light-emitting module 580R in a direction of an arrow illustrated in the drawing.

The display portion 501 includes the light-blocking layer 567BM in the light emitting direction. The light-blocking layer 567BM is provided so as to surround the coloring layer (e.g., the first coloring layer 567R).

Figure 24A:
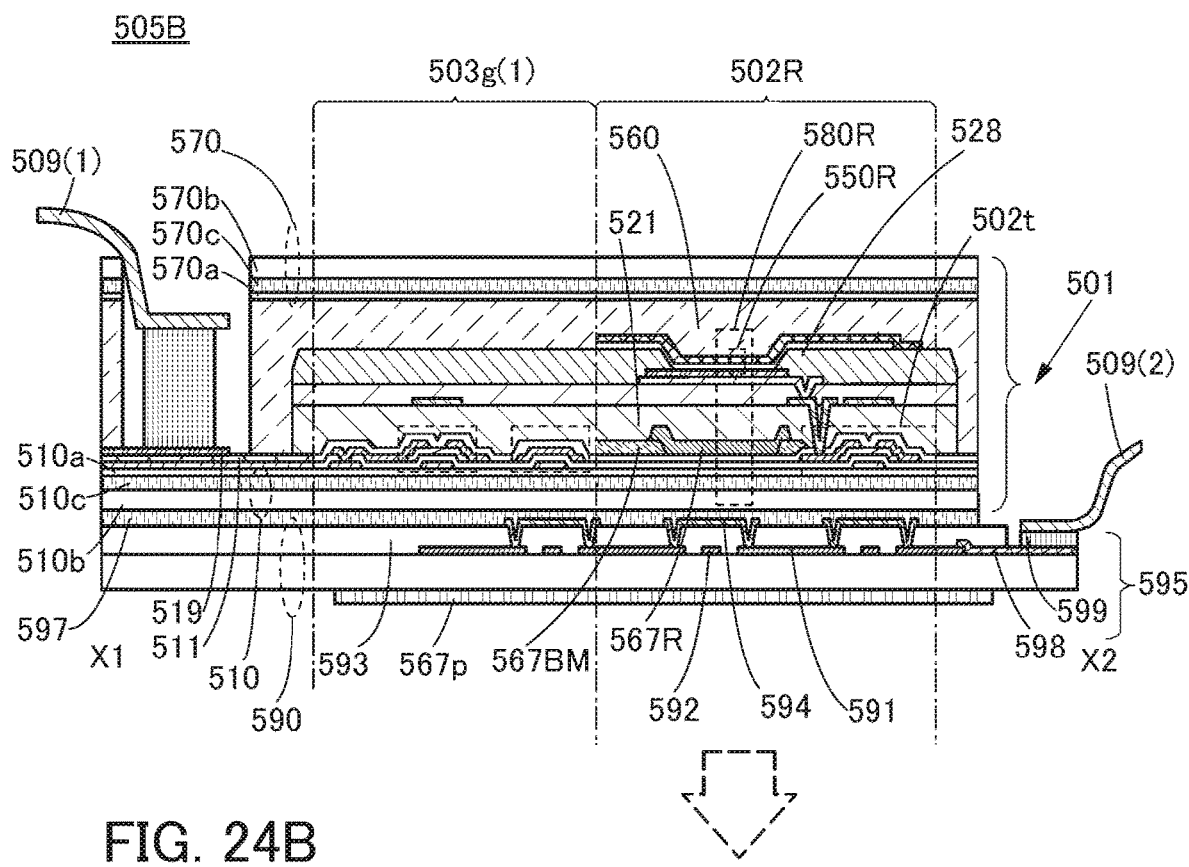
FIGS. 24A-C Diagrams illustrating an example of a touch panel according to an embodiment.

The touch sensor 595 is provided on the substrate 510 side of the display portion 501 (FIG. 24(A)).

The adhesive layer 597 is provided between the substrate 510 and the substrate 590 and bonds the touch sensor 595 and the display portion 501 to each other.

Note that a variety of transistors can be used in the display portion 501. A structure in the case of using bottom-gate transistors in the display portion 501 is illustrated in FIGS. 24(A) and (B).

For example, a semiconductor layer containing an oxide semiconductor, amorphous silicon, or the like can be used in the transistor 502t and the transistor 503t illustrated in FIG. 24(A).

Figure 24B:
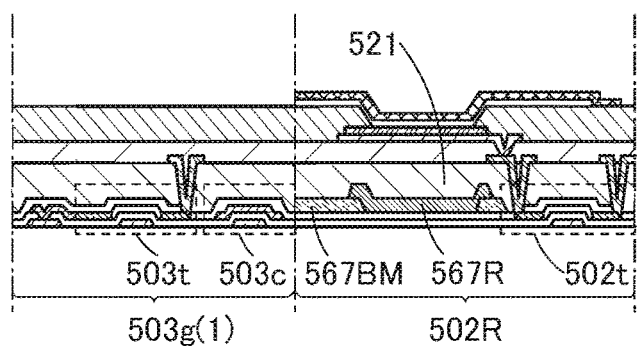

For example, a semiconductor layer containing polycrystalline silicon or the like can be used in the transistor 502t and the transistor 503t illustrated in FIG. 24(B).

Figure 24C:
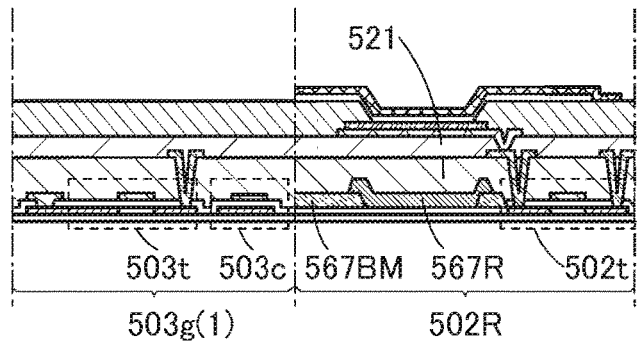

In addition, a structure in the case of using top-gate transistors in the display portion 501 is illustrated in FIG. 24(C).

For example, a semiconductor layer including polycrystalline silicon, a transferred single crystal silicon film, or the like can be used in the transistor 502t and the transistor 503t illustrated in FIG. 24(C).

At least part of this embodiment can be implemented in combination with another embodiment described in this specification as appropriate.

Embodiment 6

In this embodiment, an example of a driving method of a touch panel that is applicable to a display panel included in the display device in one embodiment of the present invention will be described with reference to drawings.

[Example of Detection Method of Sensor]

Figure 25A:
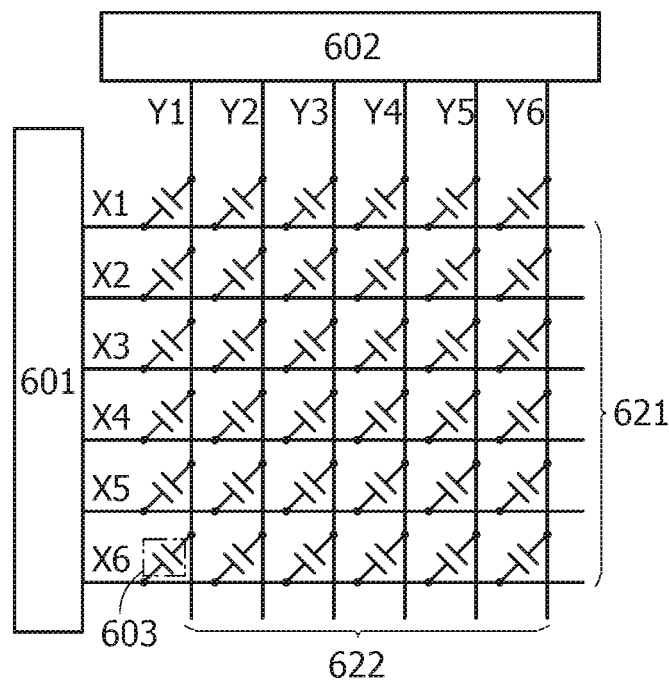
FIGS. 25A-B A block diagram and a timing chart of a touch sensor.

FIG. 25(A) is a block diagram illustrating the structure of a mutual capacitive touch sensor. FIG. 25(A) illustrates a pulse voltage output circuit 601 and a current detection circuit 602. Note that in FIG. 25(A), electrodes 621 to which a pulse voltage is applied and electrodes 622 that detect changes in current are denoted by six wirings X1-X6 and Y1-Y6, respectively. In addition, FIG. 25(A) illustrates a capacitor 603 that is formed by the electrode 621 and the electrode 622 overlapping with each other. Note that the functions of the electrode 621 and the electrode 622 may be interchanged with each other.

The pulse voltage output circuit 601 is a circuit for sequentially applying a pulse voltage to the wirings X1-X6. By application of a pulse voltage to the wirings X1-X6, the electrode 621 and the electrode 622 which form the capacitor 603 generate an electric field. By utilizing a change in the capacitance of the capacitor 603 which is caused when the electric field generated between the electrodes is blocked, for example, the approach or contact of a detection target can be detected.

The current detection circuit 602 is a circuit for detecting changes in current through the wirings Y1-Y6 that are caused by the change in the capacitance in the capacitor 603. No change in current value is detected in the wirings Y1-Y6 when there is no approach or contact of a detection target, whereas a decrease in current value is detected as a change when capacitance is decreased owing to the approach or contact of a detection target to be detected. Note that current detection may be performed using an integrator circuit or the like.

Figure 25B:
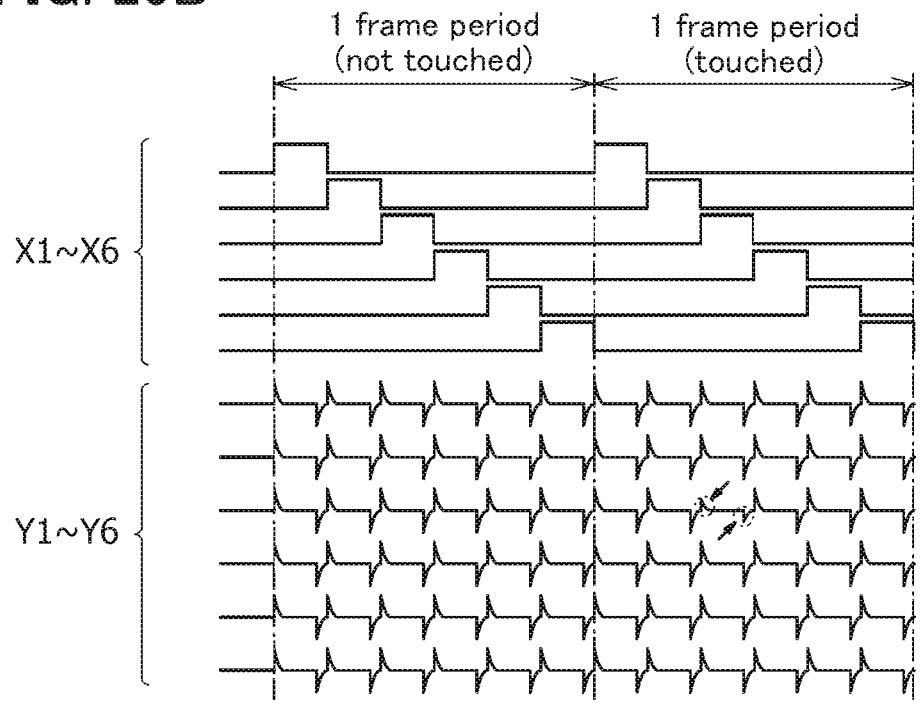

Next, FIG. 25(B) illustrates a timing chart with input and output waveforms in the mutual capacitive touch sensor illustrated in FIG. 25(A). In FIG. 25(B), detection of a detection target is performed in all the rows and columns in one frame period. Furthermore, FIG. 25(B) illustrates two cases: a case where a detection target is not detected (not touched) and a case where a detection target is detected (touched). Note that the waveforms of voltage values corresponding to detected current values are illustrated for the wirings Y1-Y6.

A pulse voltage is sequentially applied to the wirings X1-X6, and the waveforms of the wirings Y1-Y6 change in accordance with the pulse voltage. In the case where there is no approach or contact of a detection target, the waveforms of the Y1-Y6 change uniformly in accordance with changes in the voltages of the wirings X1-X6. Meanwhile, the current value is decreased at the point of approach or contact of a detection target and accordingly the waveform of the corresponding voltage value also changes.

By detecting a change in capacitance in this manner, the approach or contact of a detection target can be detected.

Figure 26:
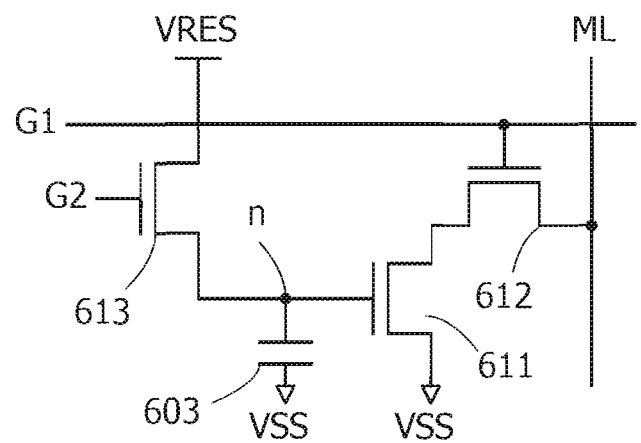
FIG. 26 A circuit diagram of a touch sensor.

Although FIG. 25(A) illustrates a structure of a passive-matrix touch sensor in which only the capacitor 603 is provided as a touch sensor at the intersection of wirings, an active-matrix touch sensor including a transistor and a capacitor may also be used. FIG. 26 illustrates an example of a sensor circuit included in an active-matrix touch sensor.

The sensor circuit includes the capacitor 603, a transistor 611, a transistor 612, and a transistor 613. The transistor 613 has a gate supplied with a signal G2, has one of a source and a drain supplied with a voltage VRES, and has the other electrically connected to one electrode of the capacitor 603 and a gate of the transistor 611. The transistor 611 has one of a source and a drain electrically connected to one of a source and a drain of the transistor 612, and has the other supplied with a voltage VSS. The transistor 612 has a gate supplied with a signal G1, and has the other of the source and the drain electrically connected to a wiring ML. The other electrode of the capacitor 603 is supplied with the voltage VSS.

Next, the operation of the sensor circuit will be described. First, a potential for turning on the transistor 613 is applied as the signal G2, and a potential corresponding to the voltage VRES is thus applied to a node n to which the gate of the transistor 611 is connected. Then, a potential for turning off the transistor 613 is applied as the signal G2, and the potential of the node n is thus retained.

Then, capacitance of the capacitor 603 changes owing to the approach or contact of a detection target such as a finger, and accordingly the potential of the node n is changed from VRES.

In a reading operation, a potential for turning on the transistor 612 is applied as the signal G1. A current flowing through the transistor 611, that is, a current flowing through the wiring ML is changed in accordance with the potential of the node n. By detecting this current, the approach or contact of a detection target can be detected.

It is preferable that transistors in which an oxide semiconductor is used for a semiconductor layer where a channel is formed be used as the transistor 611, the transistor 612, and the transistor 613. In particular, by using such a transistor as the transistor 613, the potential of the node n can be retained for a long time and the frequency of operation of resupplying the voltage VRES to the node n (refresh operation) can be reduced.

At least part of this embodiment can be implemented in combination with another embodiment described in this specification as appropriate.

Embodiment 7

In this embodiment, a structure example of a stack panel which can be applied to the display device in one embodiment of the present invention and is a display panel easily increased in size will be described with reference to drawings.

One embodiment of the present invention is a display panel capable of increasing its size by placing a plurality of display panels to partly overlap one another. Of two of the overlapping display panels, at least the display panel located on the display surface side (upper side) is provided with a portion transmitting visible light that is adjacent to a display portion. A pixel of the display panel placed on the lower side and the portion transmitting visible light of the display panel placed on the upper side are provided to overlap with each other. Thus, when the two display panels are seen from the display surface side (in a plan view), an image displayed by them can be displayed seamlessly and continuously.

For example, one embodiment of the present invention is a stack panel including a first display panel and a second display panel. The first display panel includes a first region, and the first region includes a first pixel and a second pixel. The second display panel includes a second region, a third region, and a fourth region. The second region includes a third pixel. The third region has a function of transmitting visible light. The fourth region has a function of blocking visible light. The second pixel of the first display panel and the third region of the second display panel have regions overlapping with each other. A feature is that an aperture ratio of the second pixel is higher than an aperture ratio of the first pixel.

More specifically, the following structure can be employed, for example.

Figure 27A:
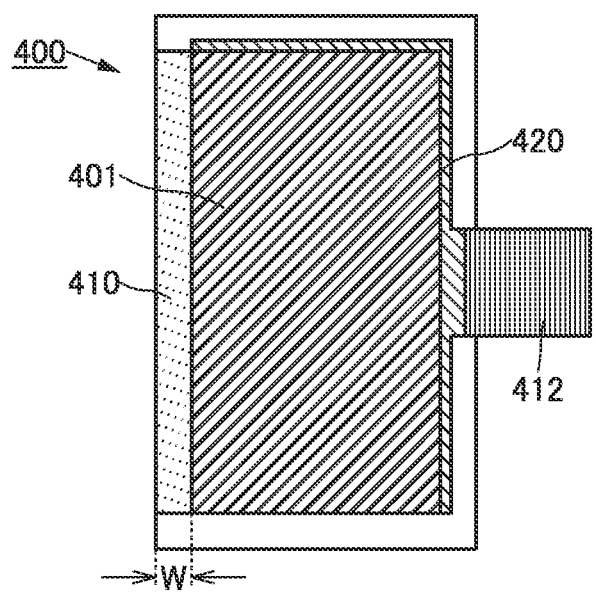
FIGS. 27A-B Diagrams illustrating a stack panel according to an embodiment.

FIG. 27(A) is a schematic top view of a display panel 400 included in the display device in one embodiment of the present invention.

The display panel 400 is provided with a display region 401, and a region 410 transmitting visible light and a region 420 having a portion blocking visible light that are adjacent to the display region 401. FIG. 27(A) illustrates an example in which the display panel 400 is provided with an FPC (Flexible Printed Circuit) 412.

Here, the display panel 400 can display an image in the display region 401 even when used alone.

In the region 410, for example, a pair of substrates included in the display panel 400, a sealant for sealing a display element sandwiched between the pair of substrates, and the like may be provided. At this time, for members provided in the region 410, materials that have a light-transmitting property with respect to visible light are used.

In the region 420, for example, a wiring electrically connected to the pixels included in the display region 401 is provided. In addition to such a wiring, circuits such as driver circuits (such as a scan line driver circuit and a signal line driver circuit) for driving the pixels and a protective circuit may be provided. Furthermore, the region 420 includes a region where a terminal electrically connected to the FPC 412 (also referred to as a connection terminal), a wiring electrically connected to the terminal, and the like are provided.

For detailed description of a cross-sectional structure example or the like of the display panel, Embodiments 4 and 5 can be referred to.

Structure Example 1 of Stack Panel

Figure 27B:
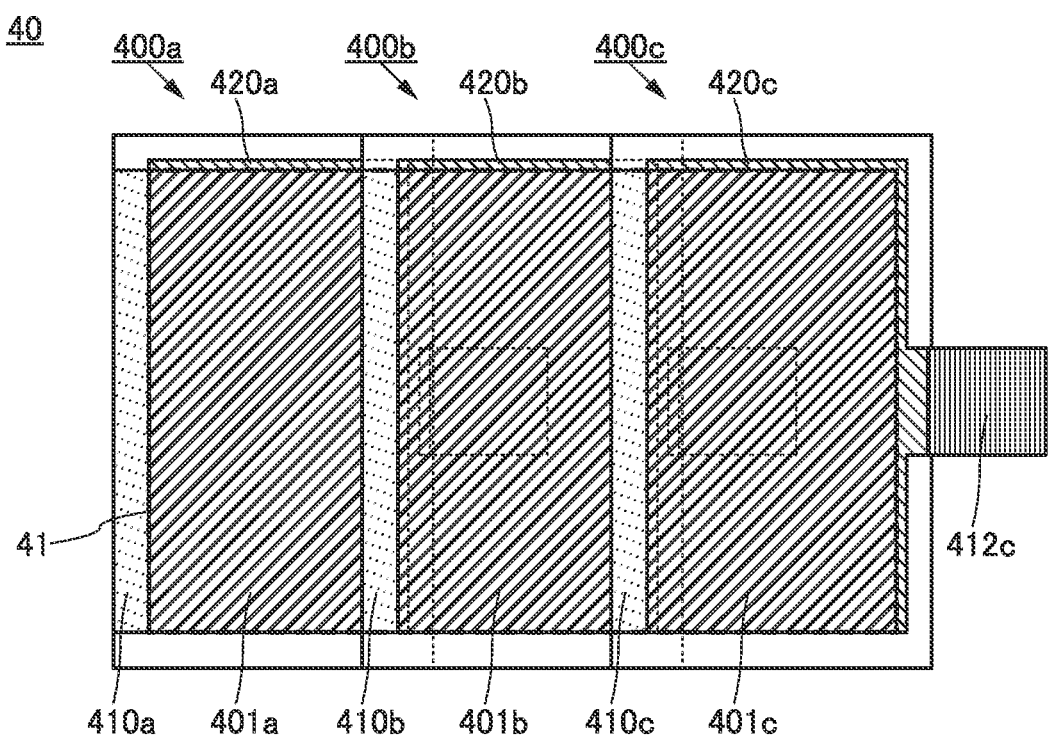

A stack panel 40 in one embodiment of the present invention is provided with a plurality of display panels 400 described above. FIG. 27(B) illustrates a schematic top view of the stack panel 40 including three display panels.

Note that in the case of separately describing the display panels from each other, the components included in the display panels from each other, or the components associated with the display panels from each other, alphabetical letters are hereinafter added after reference numerals of them. Unless otherwise specified, among a plurality of display panels provided so as to partly overlap with each other, "a" is added to reference numerals for a display panel placed on the lowest side (the side opposite to the display surface side), components thereof, and the like, and alphabetical letters in alphabetical order are added after reference numerals for one or more display panels placed thereover sequentially, components thereof, and the like. Furthermore, unless otherwise specified, even in the case of describing a structure in which a plurality of display panels are provided, alphabetical letters are omitted in the description in the case of describing a matter common to the display panels, the components, or the like.

The stack panel 40 illustrated in FIG. 27(B) is provided with a display panel 400a, a display panel 400b, and a display panel 400c.

The display panel 400b is placed so that part thereof overlaps an upper side (a display surface side) of the display panel 400a. Specifically, it is placed so that a region 410b transmitting visible light of the display panel 400b overlaps a display region 401a of the display panel 400a, and the display region 401a of the display panel 400a and a region 420b blocking visible light of the display panel 400b do not overlap each other.

Furthermore, the display panel 400c is placed so that part thereof overlaps an upper side (a display surface side) of the display panel 400b. Specifically, it is placed so that a region 410c transmitting visible light of the display panel 400c overlaps a display region 401b of the display panel 400b, and the display region 401b of the display panel 400b and a region 420c blocking visible light of the display panel 400c do not overlap each other.

The region 410b transmitting visible light overlaps the display region 401a: thus, the whole display region 401a can be viewed from the display surface side. Similarly, the whole display region 401b can also be viewed from the display surface side when the region 410c overlaps it. Therefore, a region where the display region 401a, the display region 401b, and the display region 401c are placed seamlessly can serve as a display region 41 of the stack panel 40.

Structure Example 2 of Stack Panel

FIG. 27(B) illustrates the structure in which the plurality of display panels 400 are placed to overlap each other in one direction: however, a plurality of display panels 400 may be placed to overlap each other in two directions of the vertical and horizontal directions.

Figure 28A:
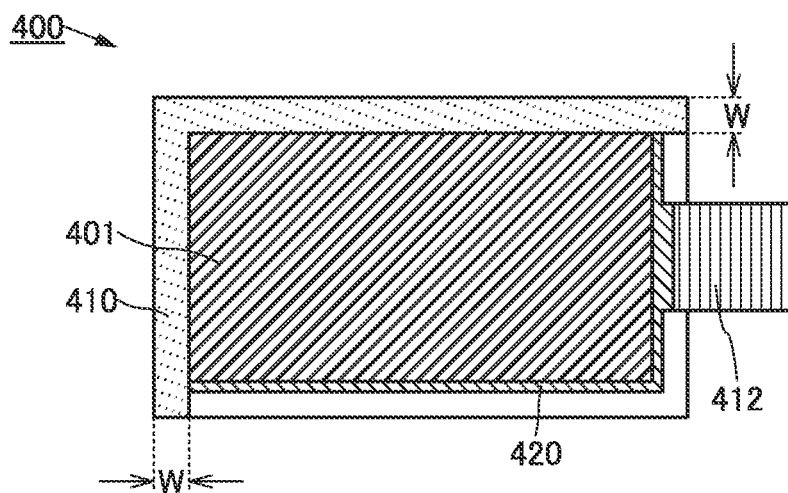
FIGS. 28A-C Diagrams illustrating a stack panel according to an embodiment.

FIG. 28(A) illustrates an example of the display panel 400 in which the shape of the region 410 is different from that in FIG. 27(A). In the display panel 400 illustrated in FIG. 28(A), the region 410 transmitting visible light is placed along two sides of the display region 401.

Figure 28B:
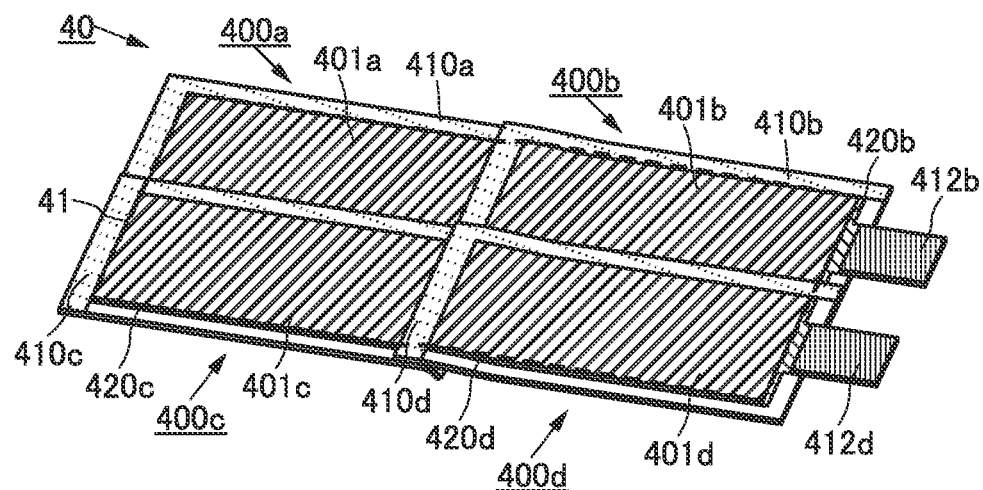
Figure 28C:
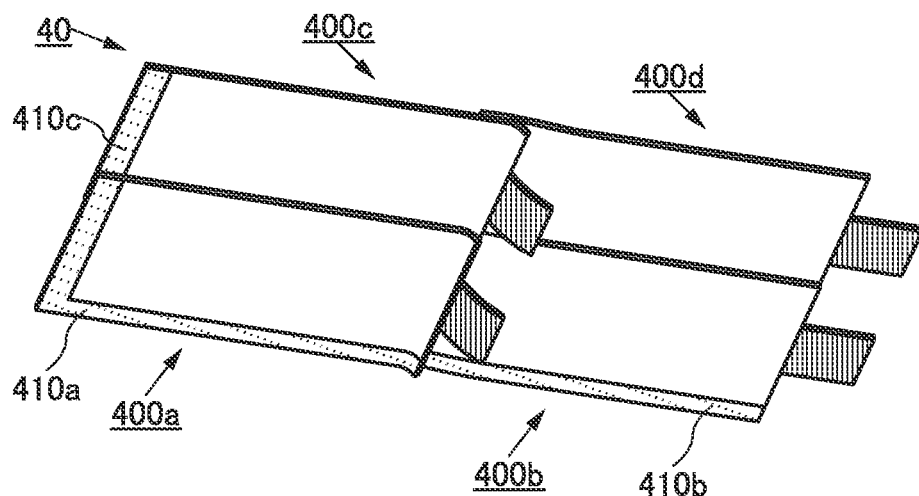

FIG. 28(B) illustrates a schematic perspective view of the stack panel 40 in which the display panels 400 illustrated in FIG. 28(A) are placed two by two in vertical and horizontal directions. FIG. 28(C) is a schematic perspective view of the stack panel 40 when seen from a side opposite to the display surface side.

In FIGS. 28(B) and (C), part of the region 410b of the display panel 400b is provided to overlap a region along a short side of the display region 401a of the display panel 400a. In addition, part of the region 410c of the display panel 400c is provided to overlap a region along a long side of the display region 401a of the display panel 400a. Moreover, the region 410d of the display panel 400d is provided to overlap a region along a long side of the display region 401b of the display panel 400b and a region along a short side of the display region 401c of the display panel 400c.

Therefore, as illustrated in FIG. 28(B), a region where the display region 401a, the display region 401b, the display region 401c, and the display region 401d are placed seamlessly can serve as the display region 41 of the stack panel 40.

Here, it is preferable that a material having flexibility be used for the pair of substrates used in the display panel 400 and the display panel 400 have flexibility. Thus, as illustrated in the display panel 400a in FIGS. 28(B) and (C), part of the display panel 400a on the side where the FPC 412a is provided is curved in the case where the FPC 412a and the like are provided on the display surface side, whereby the FPC 412a can be placed under the display region 401b of the adjacent display panel 400b so as to overlap also with the display region 401b, for example. As a result, the FPC 412a can be placed without physical interference with the rear surface of the display panel 400b. Furthermore, when the display panel 400a and the display panel 400b overlap with and are bonded to each other, it is not necessary to consider the thickness of the FPC 412a; thus, the difference in height between the top surface of the region 410b of the display panel 400b and the top surface of the display region 401a of the display panel 400a can be reduced. As a result, viewing of the end portion of the display panel 400b which is located over the display region 401a can be suppressed.

Moreover, each of the display panels 400 has flexibility, whereby the display panel 400b can be curved gently so that the height of the top surface of the display region 401b of the display panel 400b becomes equal to the height of the top surface of the display region 401a of the display panel 400a. Thus, the heights of the display regions can be equal to each other except in the vicinity of the region where the display panel 400a and the display panel 400b overlap with each other, so that the display quality of an image displayed in the display region 41 of the stack panel can be improved.

Although the relationship between the display panel 400a and the display panel 400b is described above as an example, the same applies to two adjacent display panels.

Furthermore, to reduce the step between two adjacent display panels 400, the thickness of the display panel 400 is preferably small. For example, the thickness of the display panel 400 is preferably less than or equal to 1 mm, preferably less than or equal to 300 μm, further preferably less than or equal to 100 μm.

Note that although the structure in which the four display panels 400 are stacked is described here, the number of display panels 400 can be increased to obtain a very large stack panel. Furthermore, by changing a method for placing the plurality of display panels 400, the shape of the contour of the display region of the stack panel can be a variety of shapes such as a circle, an ellipse, and a polygon. In addition, when the display panels 400 are placed in a three-dimensional manner, a stack panel including a display region with a three-dimensional shape can be realized.

At least part of this embodiment can be implemented in combination with another embodiment described in this specification as appropriate.

EXPLANATION OF REFERENCE 31 picture
31a picture
31b picture
31c picture
31d picture
32 picture
32a picture
32b picture
32c picture
32d picture
32e picture
35 parking space
36 object
37 guide
38a image
38b image
40 stack panel
41 display region
50 display device
51 display panel
52 driving means
53 mechanism
54 housing
60 vehicle
61 windshield
62 shift lever
63 sun visor
64 steering wheel
65 navigation system
66 operation portion
67 image output means
68 ceiling 69 transmission
70 system
71 control portion
72 imaging means
72a imaging means
72b imaging means
72c imaging means
72d imaging means
73 detection means
74 memory device
75 input means
80 driver
81 eye point
82 plane
83 front vision
91 shutter
100 display panel
101 display portion
102 fixing portion
103 supporting member
103a supporting member
103b supporting member
104 cord
105 mechanism
150 display device
151 shaft portion
152 rotation mechanism
153 bearing portion
160 display device
201 formation substrate
203 separation layer
205 formation substrate
207 separation layer
230 light-emitting element
301 display portion
302 pixel
302B sub-pixel
302G sub-pixel
302R sub-pixel
302t transistor
303c capacitor
303g(1) scan line driver circuit
303g(2) imaging pixel driver circuit
303s(1) image signal line driver circuit
303s(2) imaging signal line driver circuit
303t transistor
304 gate
308 imaging pixel
308p photoelectric conversion element
308t transistor
309 FPC
311 wiring
319 terminal
321 insulating layer
328 partition
329 spacer
350R light-emitting element
351R lower electrode
352 upper electrode
353 EL layer
353a EL layer
353b EL layer
354 intermediate layer
360 sealing layer
367BM light-blocking layer
367p anti-reflective layer
367R coloring layer
380B light-emitting module
380G light-emitting module
380R light-emitting module
390 touch panel
400 display panel
400a display panel
400b display panel
400c display panel
400d display panel
401 display region
401a display region
401b display region
401c display region
401d display region
410 region
410b region
410c region
410d region
412 FPC
412a FPC
420 region
420b region
420c region
501 display portion
502R sub-pixel
502t transistor
503c capacitor
503g scan line driver circuit
503t transistor
505 touch panel
505B touch panel
509 FPC
510 substrate
510a insulating layer
510b flexible substrate
510c adhesive layer
511 wiring
519 terminal
521 insulating film
528 partition
550R light-emitting element
560 sealing layer
567BM light-blocking layer
567p anti-reflective layer
567R coloring layer
570 substrate
570a insulating layer
570b flexible substrate
570c adhesive layer
580R light-emitting module
590 substrate
591 electrode
592 electrode
593 insulating layer
594 wiring
595 touch sensor
597 adhesive layer
598 wiring
599 connection layer
601 pulse voltage output circuit
602 current detection circuit
603 capacitor
611 transistor
612 transistor
613 transistor
621 electrode
622 electrode 801 substrate
803 substrate
804 light-emitting portion
806 driver circuit portion
808 FPC
811 adhesive layer
813 insulating layer
814 conductive layer
815 insulating layer
816 conductive layer
817 insulating layer
817a insulating layer
817b insulating layer
820 transistor
821 insulating layer
822 transistor
823 sealing layer
824 sealing layer
825 connector
827 spacer
830 light-emitting element
831 lower electrode
833 EL layer
835 upper electrode
841 adhesive layer
843 insulating layer
845 coloring layer
847 light-blocking layer
849 overcoat
857 conductive layer
857a conductive layer
857b conductive layer

The invention claimed is:

1. A driving support system comprising:
a display device comprising:
   a display panel having flexibility; and
   a winding mechanism; and
an imaging device configured to take a picture of surroundings of a vehicle,
wherein the display panel is configured to be changed between a first form in which the display panel is suspended and displays the picture taken by the imaging device and a second form in which the display panel is stored inside the vehicle by the winding mechanism,
wherein in the first form, a display surface of the display panel is flat, and
wherein in the second form, the display panel is folded so that a first region of the display surface is bent inward and a second region of the display surface is bent outward.

2. The driving support system according to claim 1, wherein in the first form, the display panel is in a visible range of a driver.

3. The driving support system according to claim 1, wherein in the first form, a lower edge of the display panel is at a level equal to or lower than a level of an eye point of a driver.

4. The driving support system according to claim 1, wherein in the second form, the display panel is stored inside a ceiling of the vehicle.

5. The driving support system according to claim 1, wherein the surroundings of the vehicle include an area behind the vehicle.

6. The driving support system according to claim 1, wherein the surroundings of the vehicle include an area at a side of the vehicle.

7. A driving support system comprising:
a display device comprising:
   a display panel having flexibility;
   a fixing portion configured to fix an upper end of the display panel;
   a winding mechanism; and
   a cord attached to the winding mechanism; and
an imaging device configured to take a picture of surroundings of a vehicle,
wherein the display panel is configured to be changed between a first form in which the display panel is suspended and displays the picture taken by the imaging device and a second form in which the display panel is stored inside the vehicle by winding the cord by the winding mechanism,
wherein in the first form, a display surface of the display panel is flat, and
wherein in the second form, the display panel is folded so that a first region of the display surface is bent inward and a second region of the display surface is bent outward.

8. The driving support system according to claim 7, wherein the winding mechanism includes a circuit for supplying a signal or a voltage to the display panel.

9. The driving support system according to claim 7, wherein in the first form, the display panel is in a visible range of a driver.

10. The driving support system according to claim 7, wherein in the first form, a lower edge of the display panel is at a level equal to or lower than a level of an eye point of a driver.

11. The driving support system according to claim 7, wherein in the second form, the display panel is stored inside a ceiling of the vehicle.

12. The driving support system according to claim 7, wherein the surroundings of the vehicle include an area behind the vehicle.

13. The driving support system according to claim 7, wherein the surroundings of the vehicle include an area at a side of the vehicle.

* * * * *